(12) United States Patent
Noda et al.

(10) Patent No.: US 9,768,279 B2
(45) Date of Patent: Sep. 19, 2017

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Kosei Noda, Kanagawa (JP); Yuichi Sato, Kanagawa (JP); Yuta Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/263,479

(22) Filed: Apr. 28, 2014

(65) Prior Publication Data
US 2014/0319517 A1    Oct. 30, 2014

(30) Foreign Application Priority Data

Apr. 29, 2013 (JP) ................... 2013-094861
Apr. 29, 2013 (JP) ................... 2013-094863

(51) Int. Cl.
*H01L 29/06* (2006.01)
*H01L 29/66* (2006.01)
(Continued)

(52) U.S. Cl.
CPC .. *H01L 29/66969* (2013.01); *H01L 21/26586* (2013.01); *H01L 29/7869* (2013.01); *H01L 27/1156* (2013.01)

(58) Field of Classification Search
CPC ............. H01L 27/1214; H01L 27/1251; H01L 27/3244–27/3297; H01L 29/4908;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    001897300 A    1/2007
CN    102652396 A    8/2012
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Cuong B Nguyen
(74) *Attorney, Agent, or Firm* — Fish & Richardson P.C.

(57) ABSTRACT

To provide a transistor formed using an oxide semiconductor film with reduced oxygen vacancies. To provide a semiconductor device that operates at high speed. To provide a highly reliable semiconductor device. To provide a miniaturized semiconductor device. The semiconductor device includes an oxide semiconductor film; a gate electrode overlapping with the oxide semiconductor film; a gate insulating film between the oxide semiconductor film and the gate electrode; and a protective insulating film that is above the oxide semiconductor film, the gate electrode, and the gate insulating film and includes a region containing phosphorus or boron.

14 Claims, 34 Drawing Sheets

(51) Int. Cl.
*H01L 21/265* (2006.01)
*H01L 29/786* (2006.01)
*H01L 27/1156* (2017.01)

(58) Field of Classification Search
CPC .. H01L 51/0508–51/0533; H01L 2924/13069; H01L 29/41733; H01L 29/42384; H01L 29/66265; H01L 29/66742–29/6675; H01L 29/7317; H01L 29/786; H01L 29/66969
See application file for complete search history.

(56) References Cited

U.S. PATENT DOCUMENTS

| | | |
|---|---|---|
| 6,177,302 B1 | 1/2001 | Yamazaki et al. |
| 6,261,877 B1 | 7/2001 | Yamazaki et al. |
| 6,294,274 B1 | 9/2001 | Kawazoe et al. |
| 6,563,174 B2 | 5/2003 | Kawasaki et al. |
| 6,566,175 B2 | 5/2003 | Yamazaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,507,615 B2 | 3/2009 | Yamazaki et al. |
| 7,674,650 B2 | 3/2010 | Akimoto et al. |
| 7,732,819 B2 | 6/2010 | Akimoto et al. |
| 7,888,702 B2 | 2/2011 | Akimoto et al. |
| 8,212,284 B2 | 7/2012 | Akimoto et al. |
| 8,530,289 B2 | 9/2013 | Yamazaki |
| 8,547,771 B2 | 10/2013 | Koyama |
| 8,592,861 B2 | 11/2013 | Akimoto et al. |
| 8,624,650 B2 | 1/2014 | Ishii |
| 8,664,118 B2 | 3/2014 | Ishizuka et al. |
| 8,669,148 B2 | 3/2014 | Yamazaki |
| 8,753,928 B2 | 6/2014 | Yamazaki et al. |
| 8,895,377 B2 | 11/2014 | Yamazaki |
| 9,099,499 B2 | 8/2015 | Yamazaki |
| 9,245,983 B2 | 1/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0170939 A1* | 9/2003 | Yamazaki ............. C23C 14/568 438/166 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0087769 A1* | 4/2005 | Yamazaki et al. ............. 257/202 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231858 A1* | 10/2006 | Akimoto et al. ............. 257/140 |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2011/0121911 A1 | 5/2011 | Kamata |
| 2011/0148497 A1 | 6/2011 | Ishii |
| 2011/0303913 A1* | 12/2011 | Yamazaki et al. ............. 257/43 |
| 2012/0061666 A1* | 3/2012 | Inoue ................. H01L 27/1225 257/43 |
| 2012/0161126 A1* | 6/2012 | Yamazaki ............. 257/43 |
| 2012/0313152 A1* | 12/2012 | Yokoi et al. ............. 257/288 |
| 2013/0011961 A1 | 1/2013 | Ishizuka et al. |
| 2013/0056727 A1 | 3/2013 | Yamade et al. |
| 2014/0111262 A1 | 4/2014 | Ishii |

FOREIGN PATENT DOCUMENTS

| | | |
|---|---|---|
| EP | 0485233 A | 5/1992 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| JP | 11-505377 | | 5/1999 |
|---|---|---|---|
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-130424 | A | 6/2011 |
| JP | 2011-151791 | A | 8/2011 |
| JP | 2011-171702 | A | 9/2011 |
| JP | 2011-243974 | A | 12/2011 |
| JP | 2012-257187 | A | 12/2012 |
| JP | 2013-038404 | A | 2/2013 |
| JP | 2013-070039 | A | 4/2013 |
| KR | 2012-0115318 | A | 10/2012 |
| KR | 2013-0006310 | A | 1/2013 |
| TW | 237562 | | 1/1995 |
| TW | 201138308 | | 11/2011 |
| TW | 201201259 | | 1/2012 |
| TW | 201239997 | | 10/2012 |
| TW | 201308580 | | 2/2013 |
| WO | WO-2004/114391 | | 12/2004 |
| WO | WO-2011/077908 | | 6/2011 |
| WO | WO-2011/132529 | | 10/2011 |

OTHER PUBLICATIONS

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Dembo.H et al., "RFCPUS on Glass and Plastic Substrates Fabricated by TFT Transfer Technology", IEDM 05 : Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modellng of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005. vol. 87, pp. 122102-1-122102-3.

Jeong.J at al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Kikuchi.H et al., "39.1:Invited Paper: Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the IN2O3 and Sc2O3—A2O3—BO Systems [A; Fe. Ga, or Al; B: Mg, Mn, Fe, Ni, Cu, Or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008. vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009. pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor". Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009; vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/061808) Dated Jul. 22, 2014.

Written Opinion (Application No. PCT/JP2014/061808) Dated Jul. 22, 2014.

Taiwanese Office Action (Application No. 103114244) dated Jul. 24, 2017.

\* cited by examiner

FIG. 2A1
FIG. 2A2
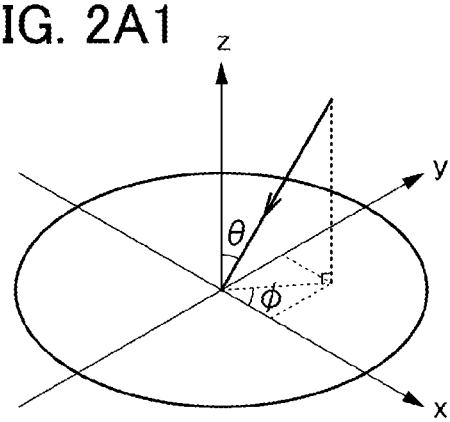
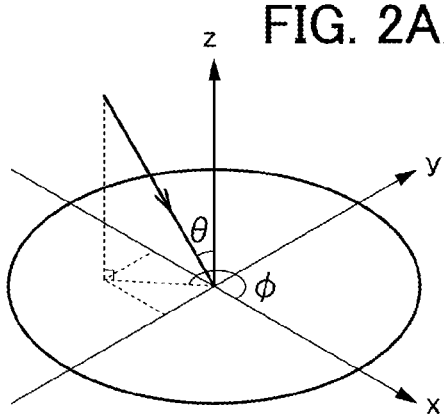
FIG. 2B
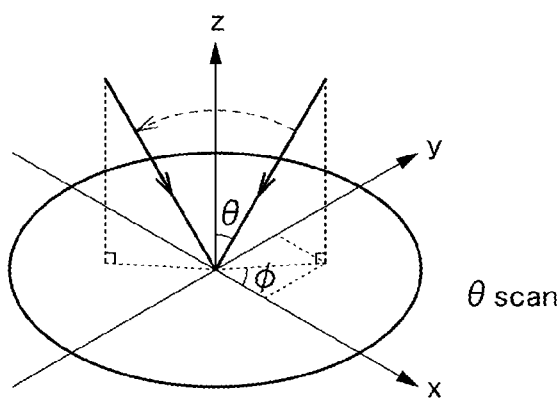
θ scan
FIG. 2C
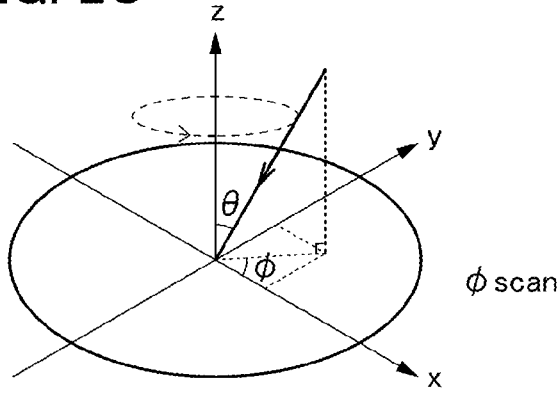
φ scan FIG. 3A
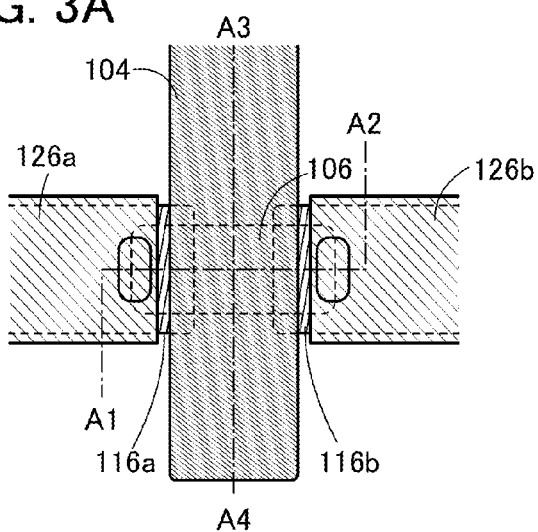
FIG. 3C
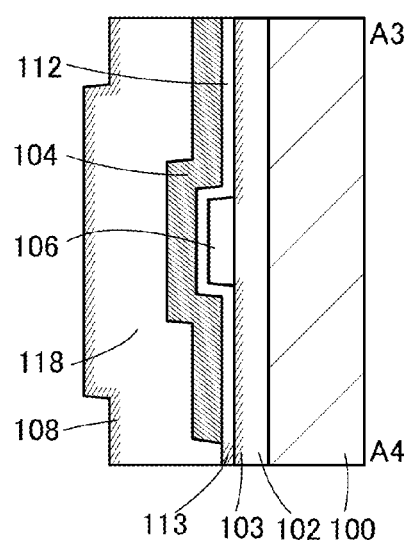
FIG. 3B1
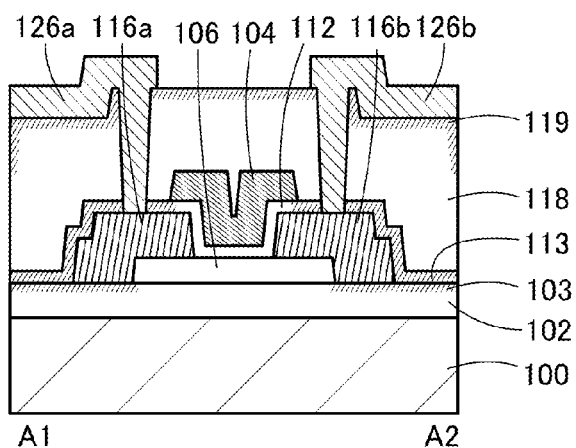
FIG. 3B2
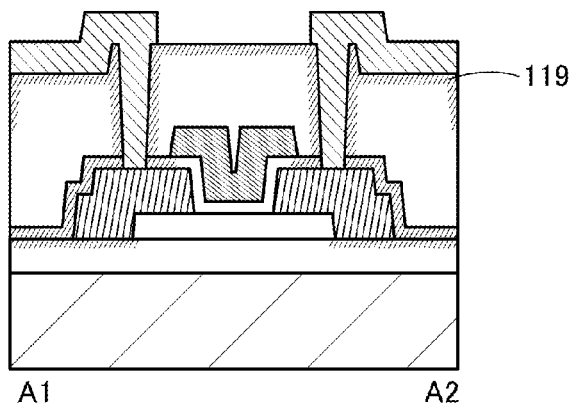

FIG. 4A1
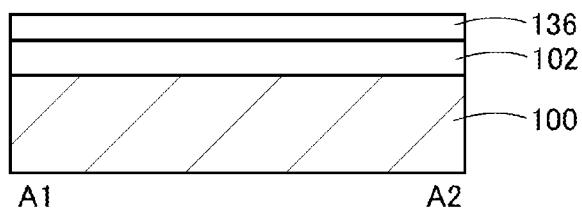
FIG. 4A2
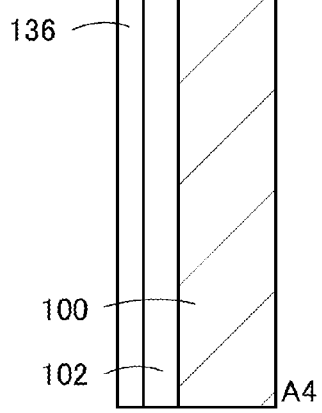
FIG. 4B1
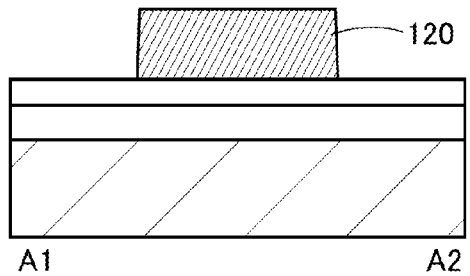
FIG. 4B2
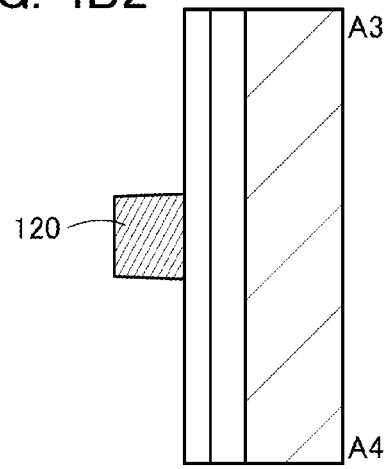
FIG. 4C1
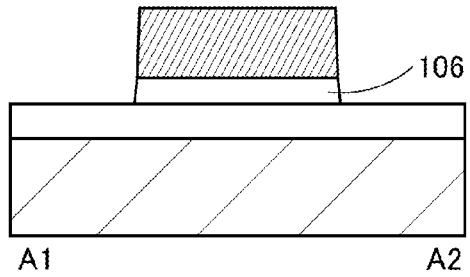
FIG. 4C2
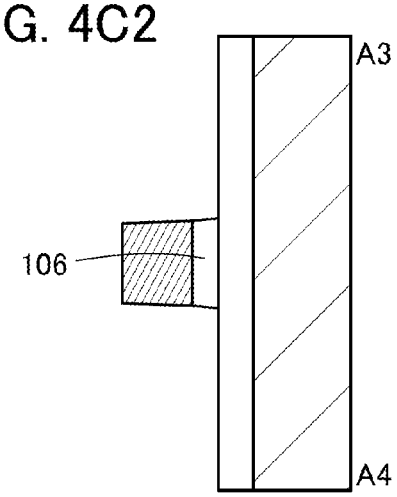

FIG. 5A1
FIG. 5A2
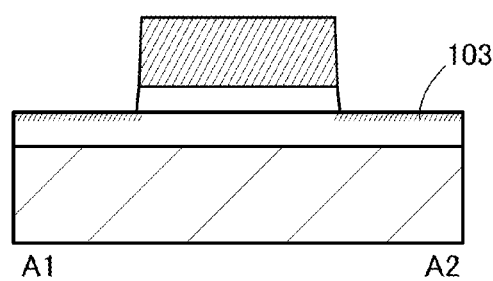
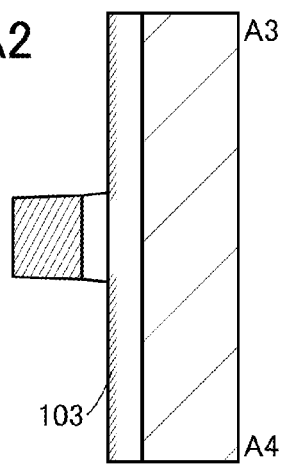
FIG. 5B1
FIG. 5B2
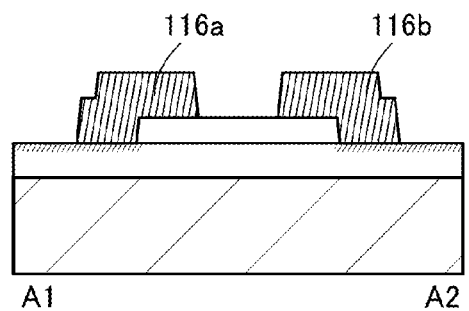
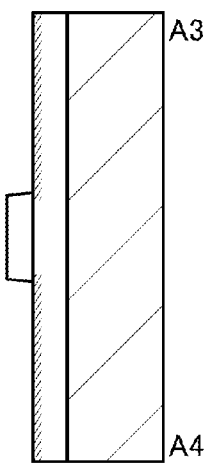
FIG. 5C1
FIG. 5C2
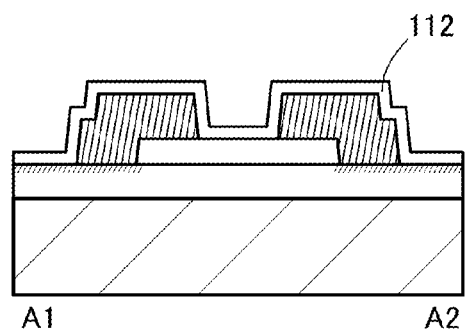
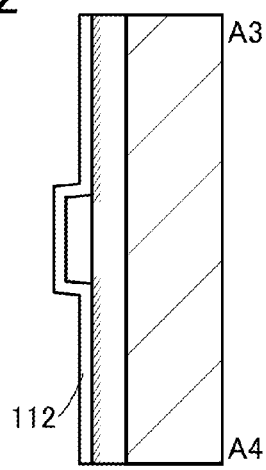

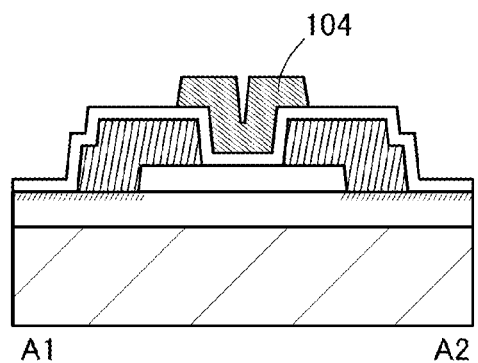
FIG. 6A1
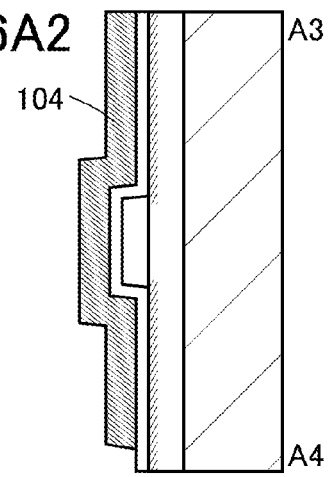
FIG. 6A2
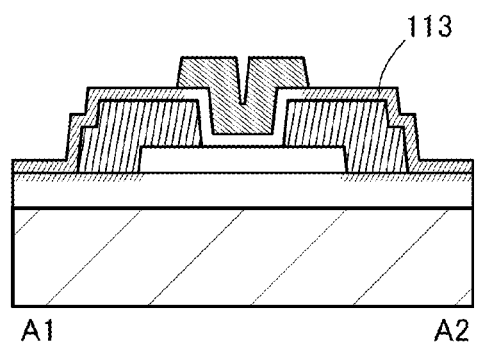
FIG. 6B1
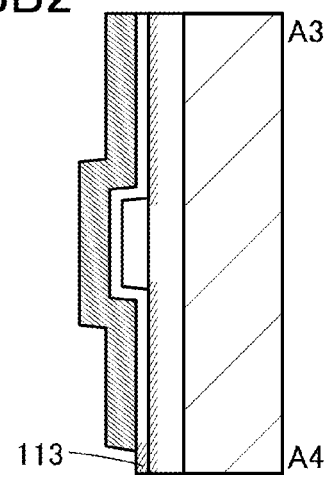
FIG. 6B2
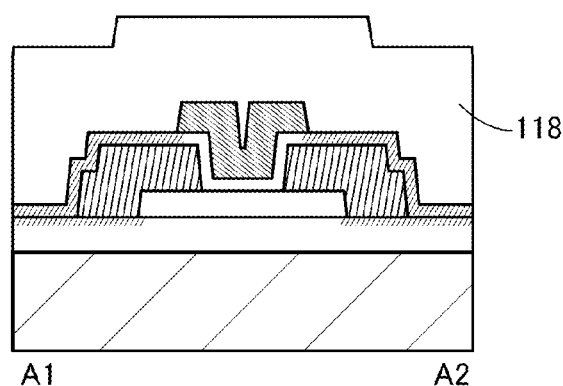
FIG. 6C1
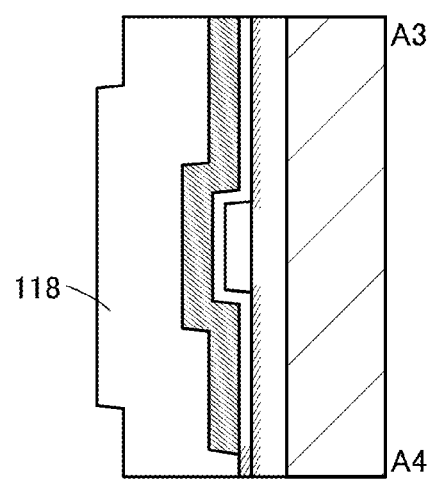
FIG. 6C2

FIG. 7A1
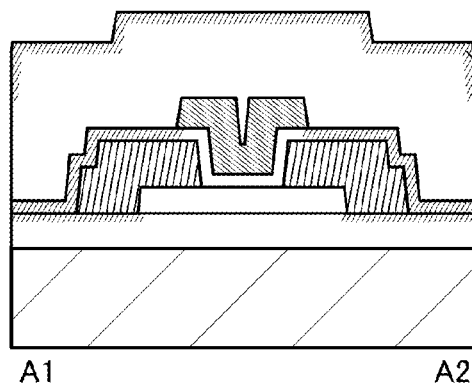
FIG. 7A2
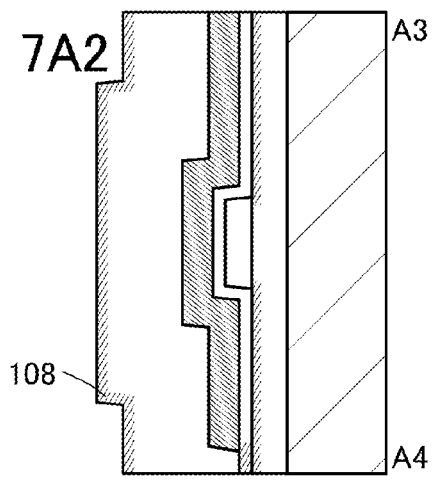
FIG. 7B1
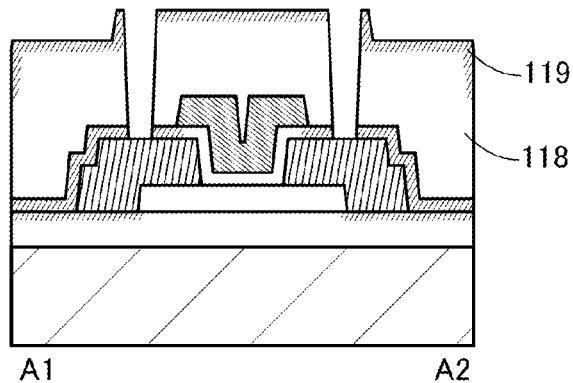
FIG. 7B2
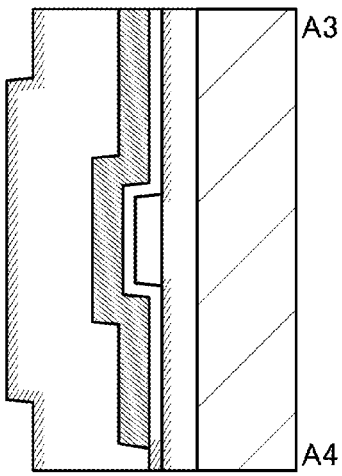
FIG. 7C1
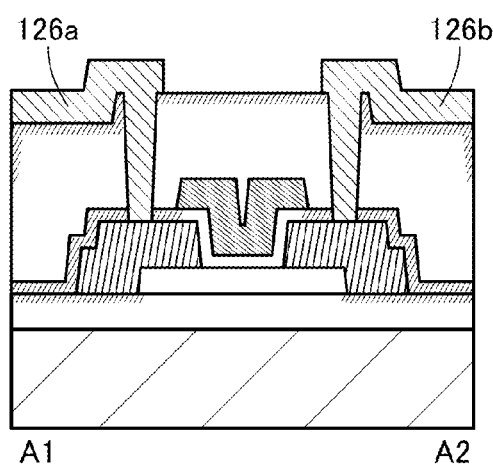
FIG. 7C2
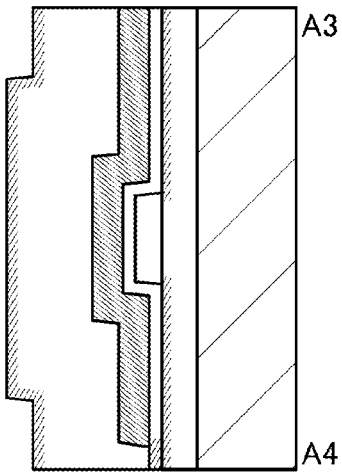

FIG. 8A1
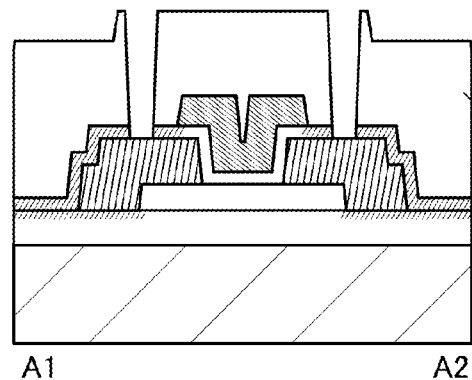
FIG. 8A2
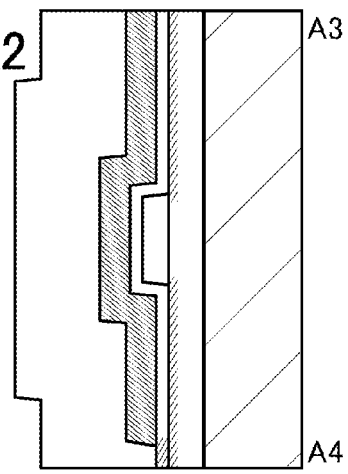
FIG. 8B1
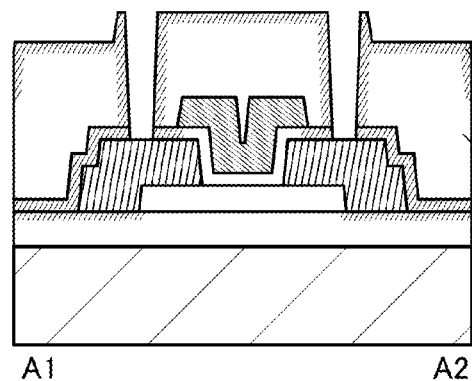
FIG. 8B2
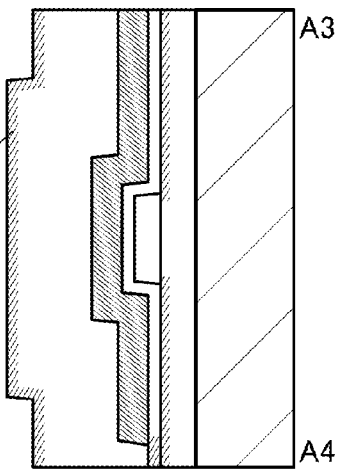
FIG. 8C1
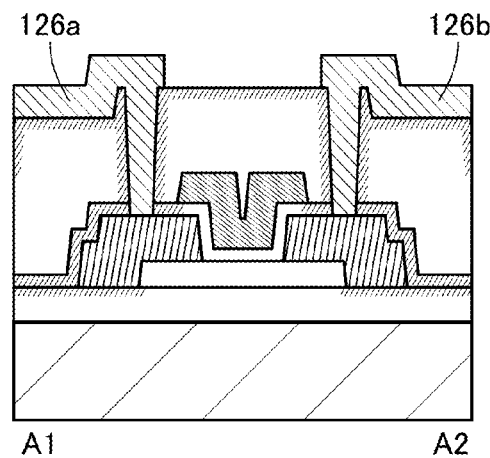
FIG. 8C2
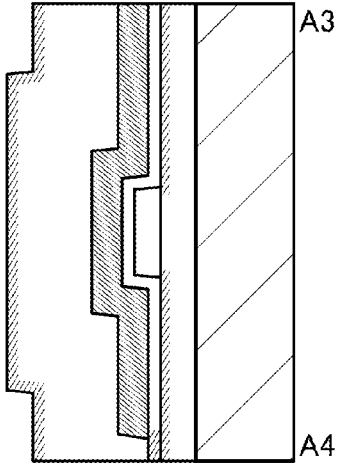

FIG. 9A
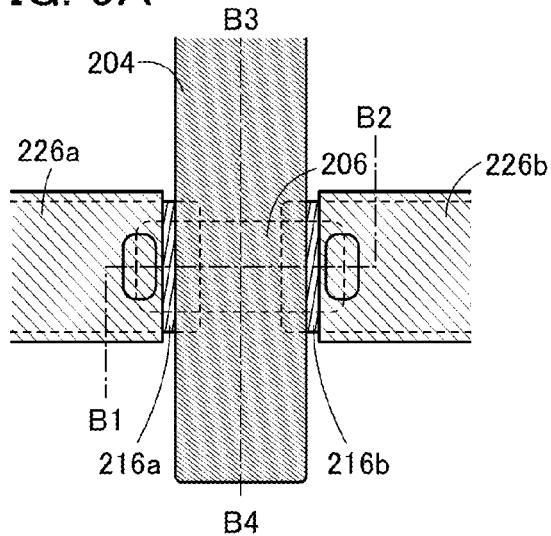
FIG. 9C
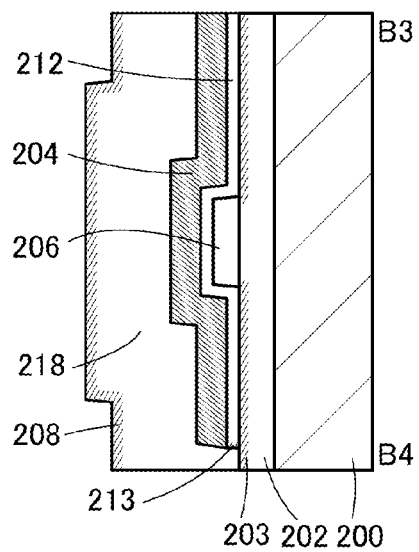
FIG. 9B1
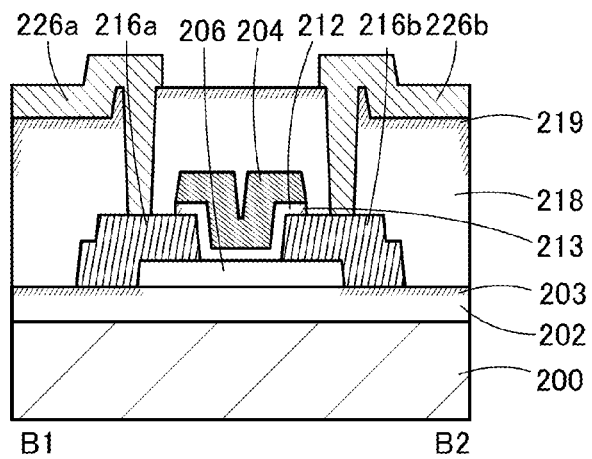
FIG. 9B2
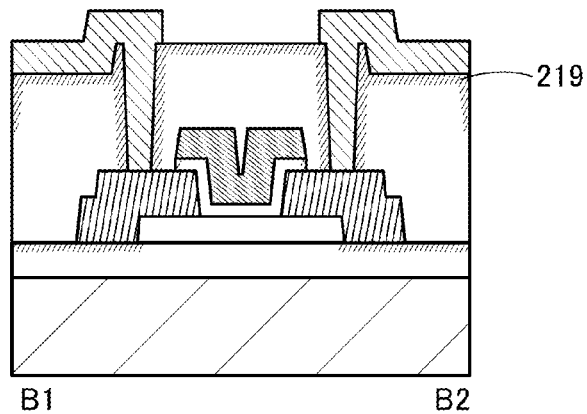

FIG. 10A1
FIG. 10A2
FIG. 10B1
FIG. 10B2
FIG. 10C1
FIG. 10C2
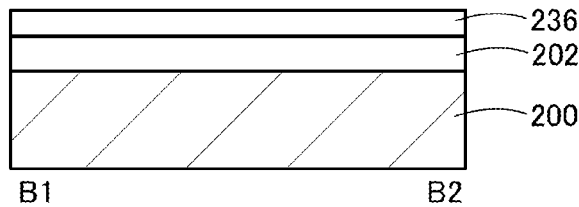
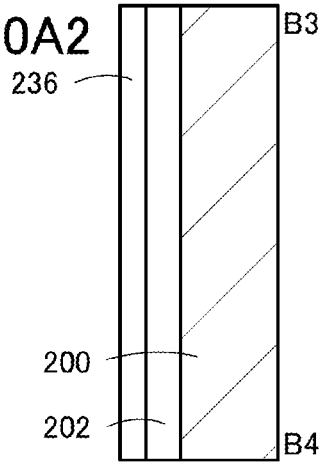
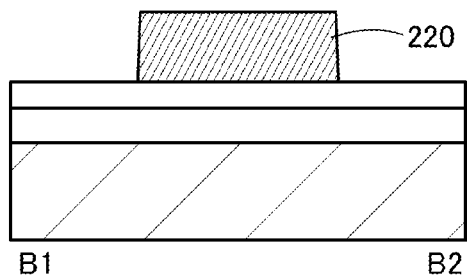
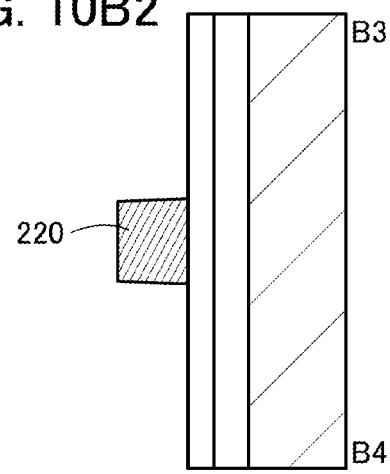
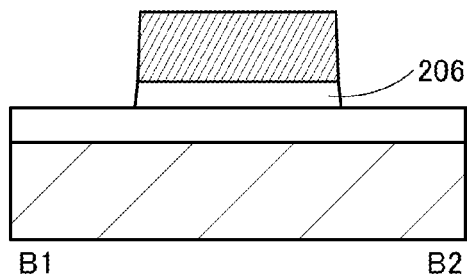
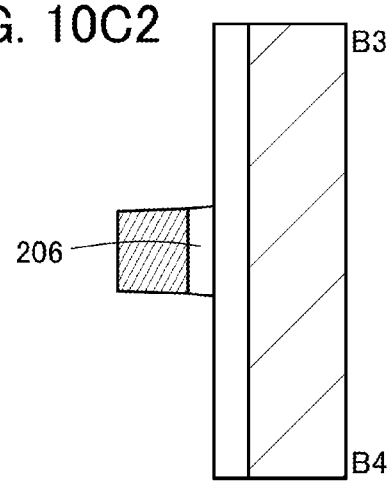

FIG. 11A1
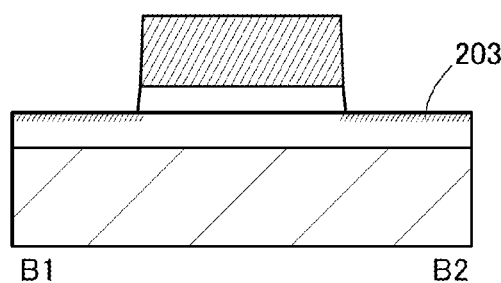
FIG. 11A2
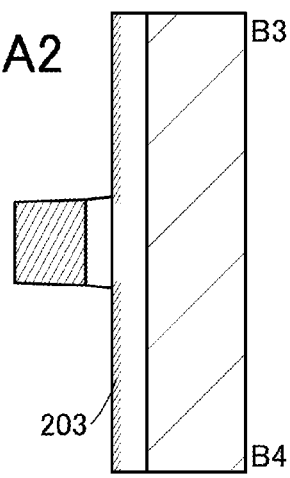
FIG. 11B1
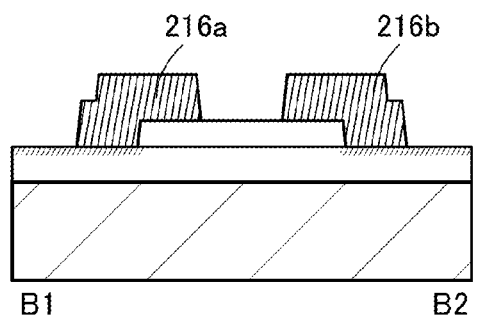
FIG. 11B2
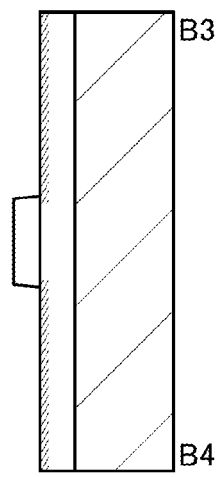
FIG. 11C1
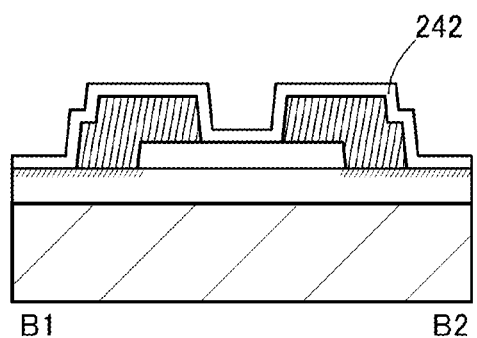
FIG. 11C2
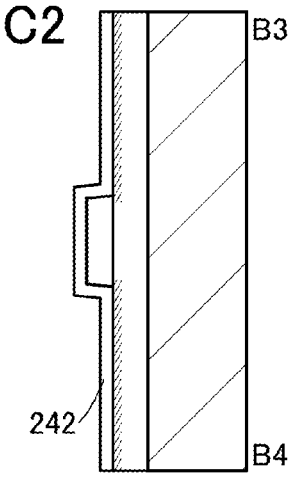

FIG. 12A1
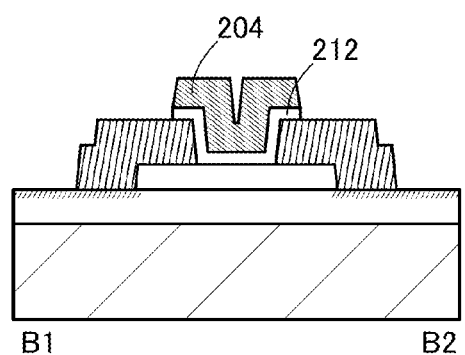
FIG. 12A2
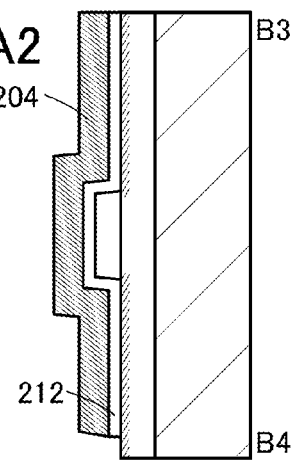
FIG. 12B1
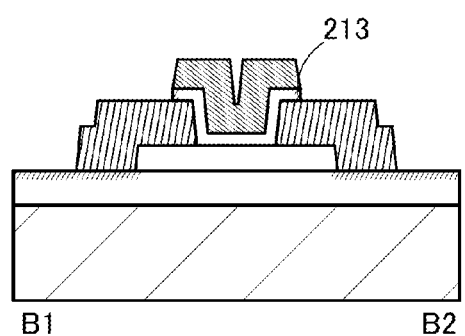
FIG. 12B2
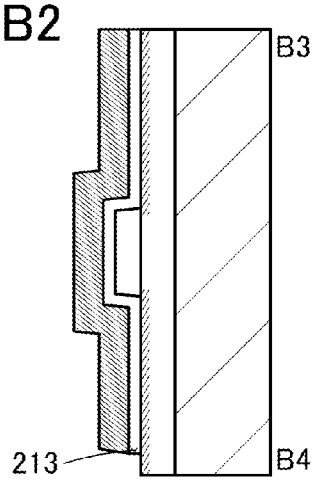
FIG. 12C1
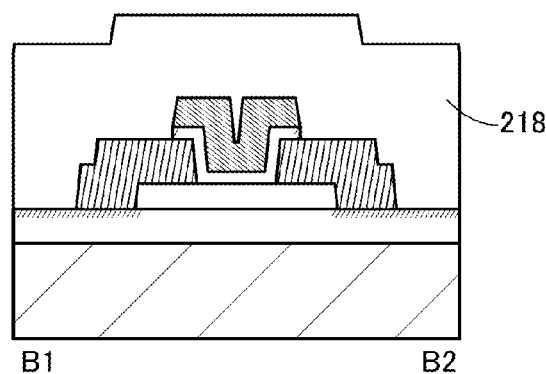
FIG. 12C2
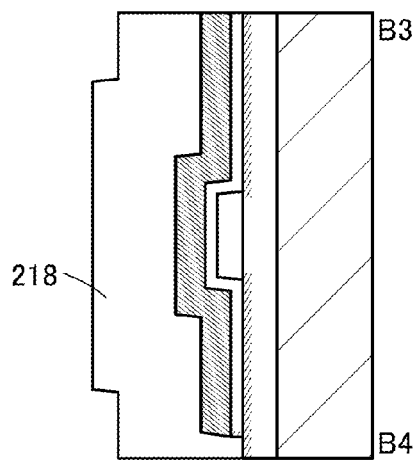

FIG. 13A1 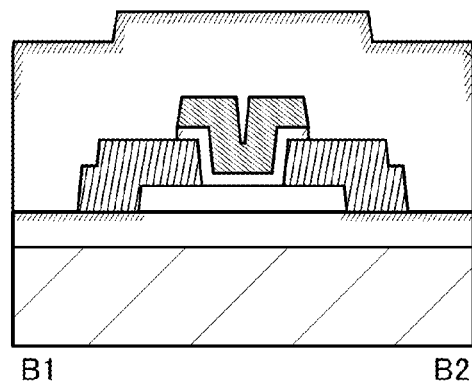 FIG. 13A2 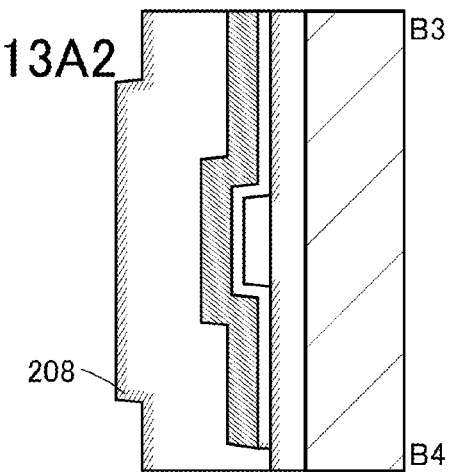
FIG. 13B1 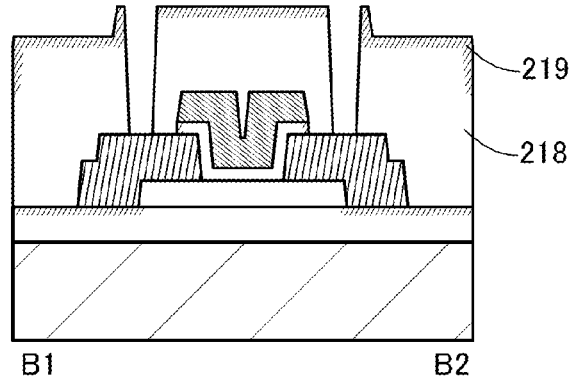 FIG. 13B2 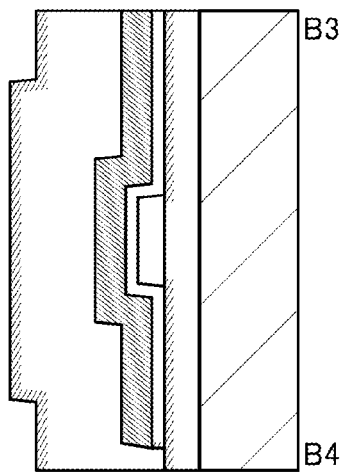
FIG. 13C1 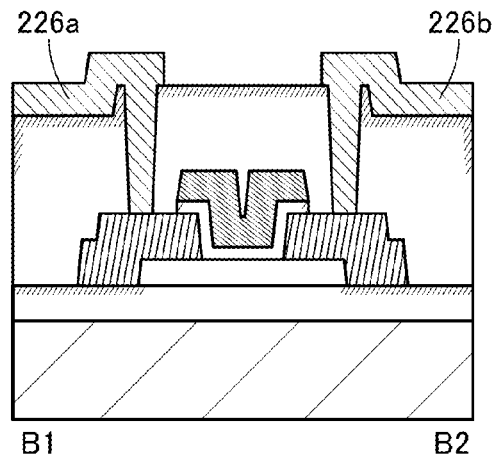 FIG. 13C2 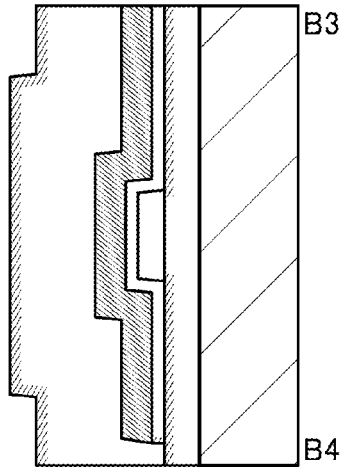

FIG. 14A1
FIG. 14A2
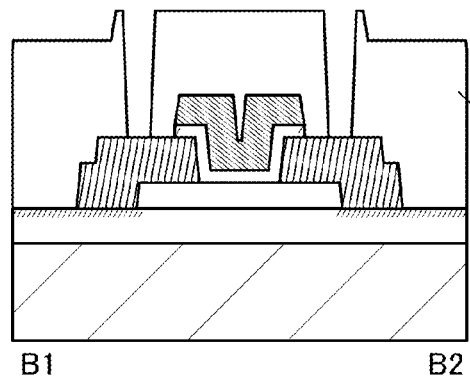
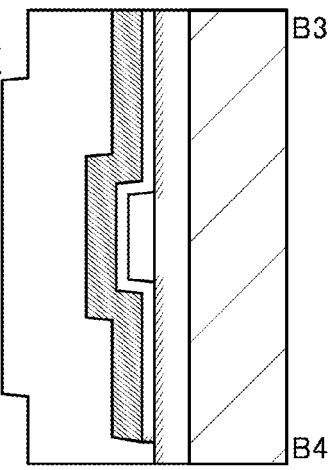
FIG. 14B1
FIG. 14B2
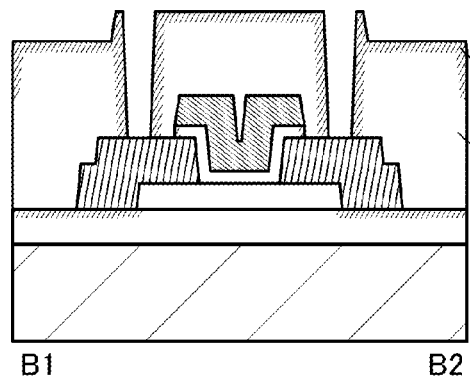
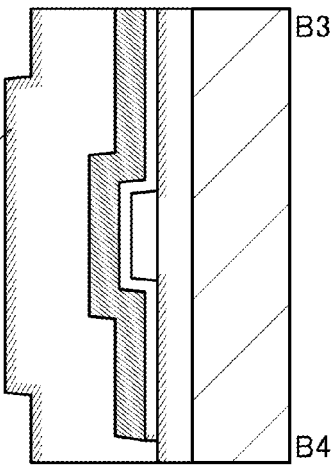
FIG. 14C1
FIG. 14C2
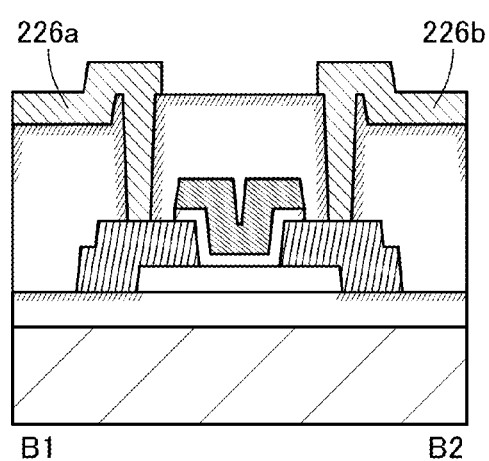
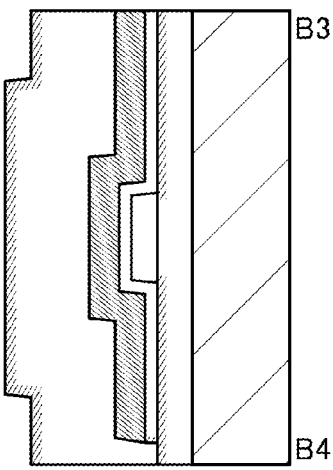

FIG. 15A
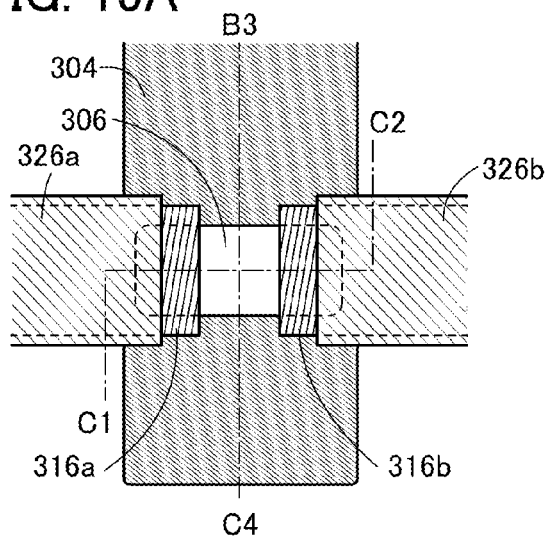
FIG. 15C
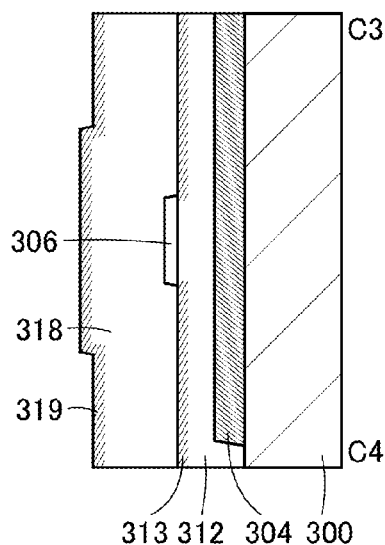
FIG. 15B1
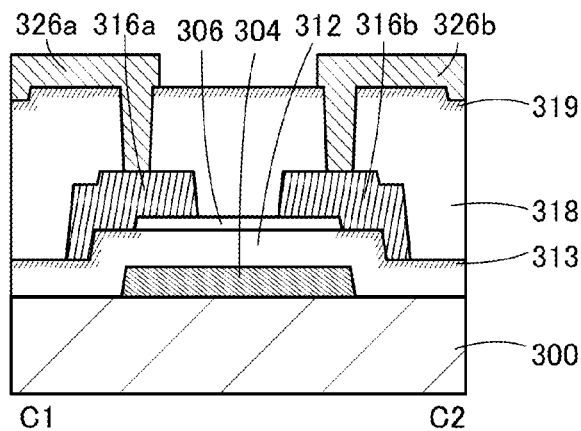
FIG. 15B2
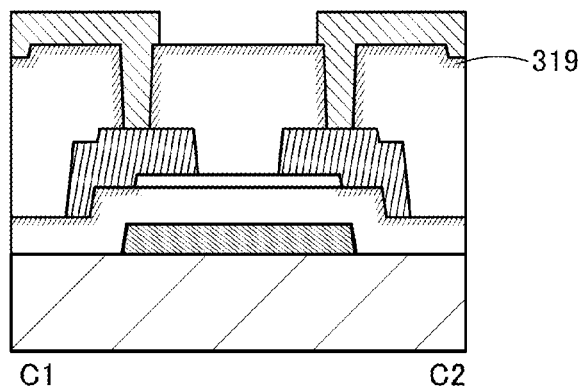

FIG. 16A1
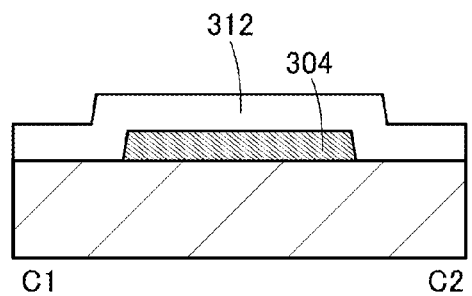
FIG. 16A2
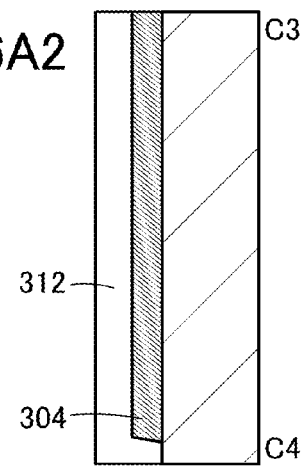
FIG. 16B1
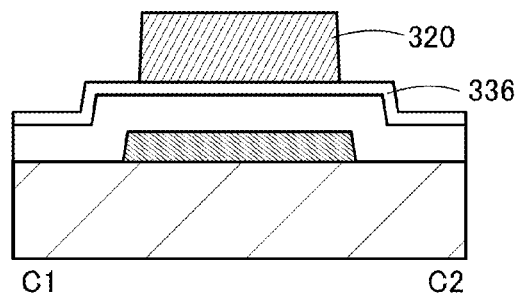
FIG. 16B2
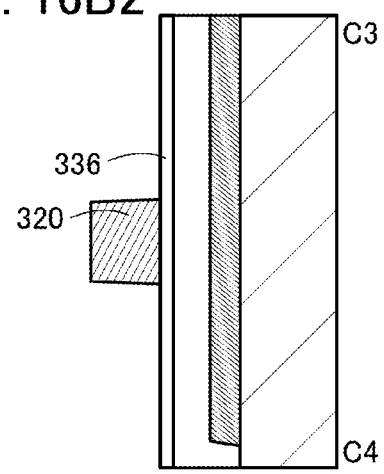
FIG. 16C1
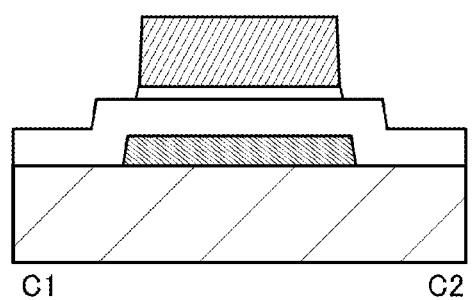
FIG. 16C2
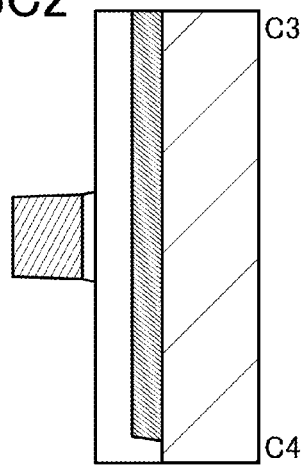

FIG. 17A1
FIG. 17A2
FIG. 17B1
316a
316b
313
FIG. 17B2
FIG. 17C1
318
FIG. 17C2
318
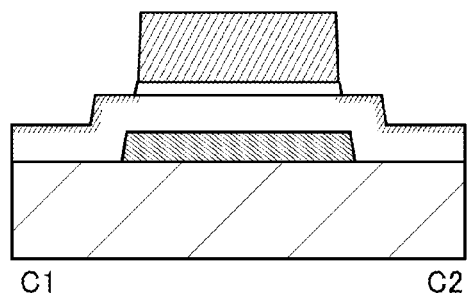
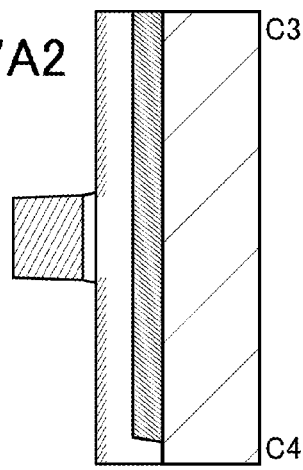
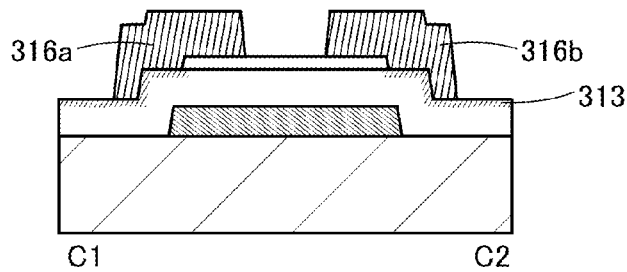
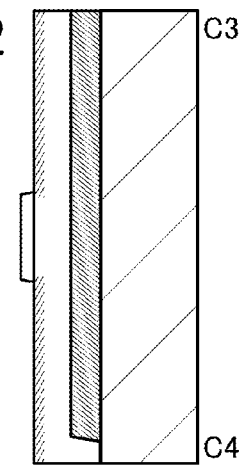
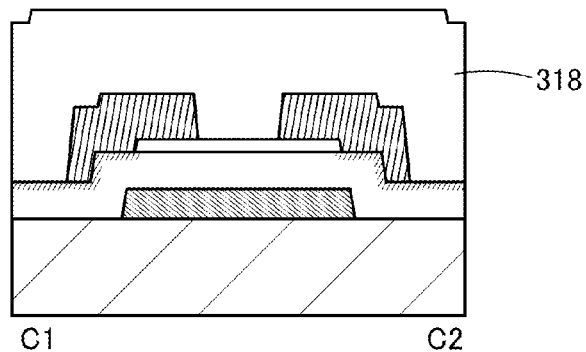
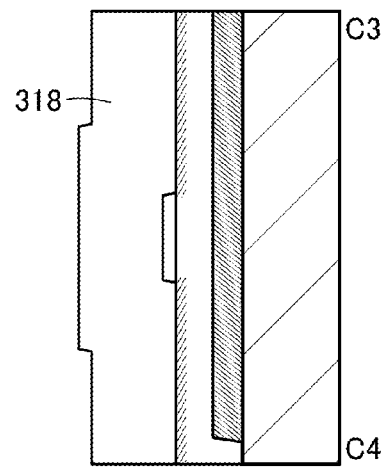

FIG. 18A1
319
FIG. 18A2
C3
319
C4
FIG. 18B1
FIG. 18B2
C3
C4
FIG. 18C1
326a    326b
FIG. 18C2
C3
C4
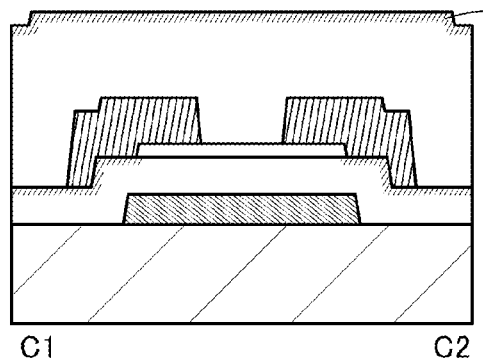
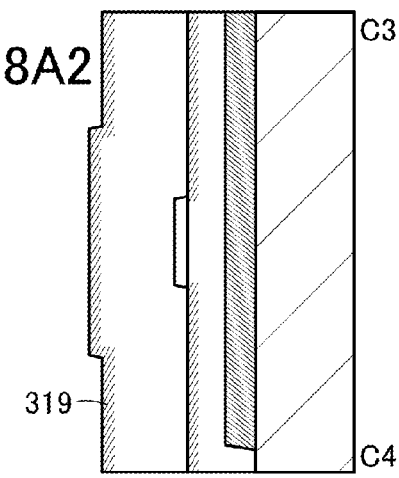
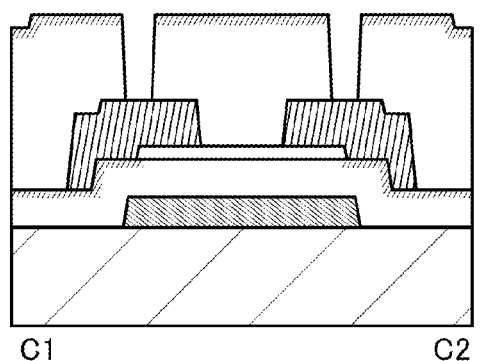
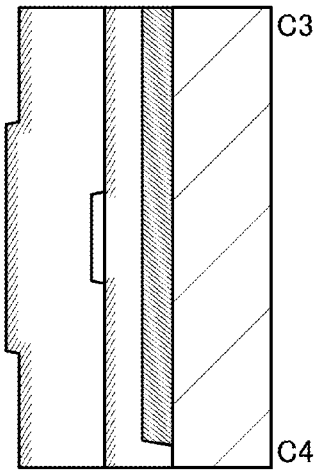
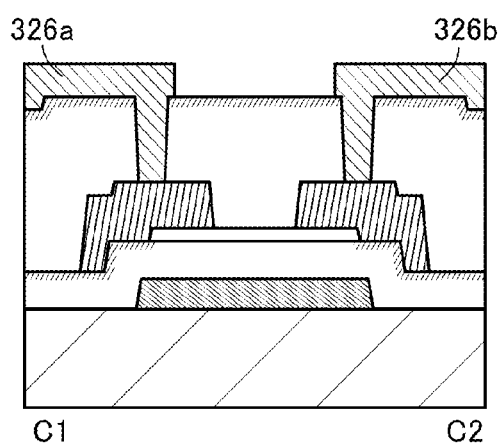
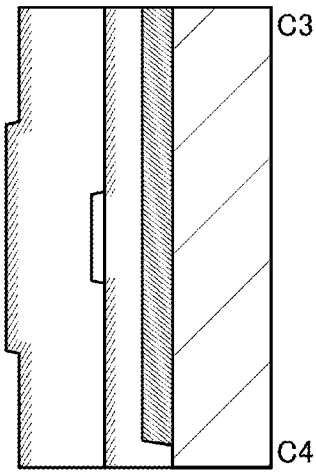

FIG. 19A1
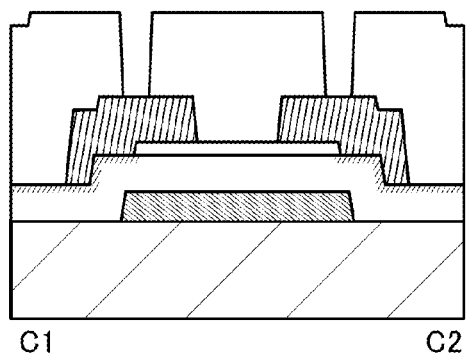
C1　　　　　　　　C2
FIG. 19A2
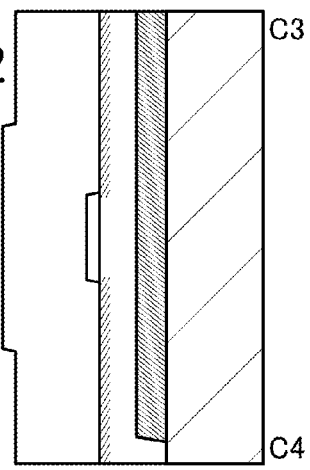
C3
C4
FIG. 19B1
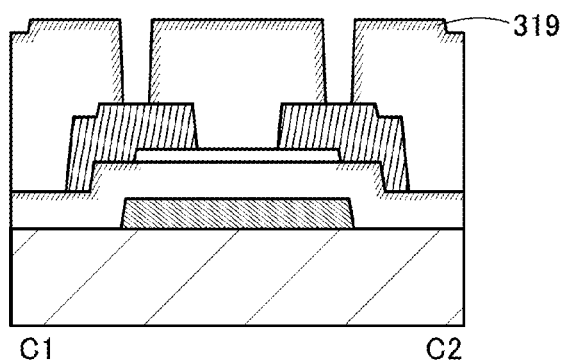
319
C1　　　　　　　　C2
FIG. 19B2
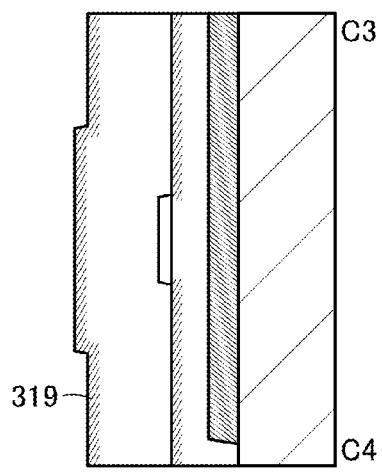
C3
319
C4
FIG. 19C1
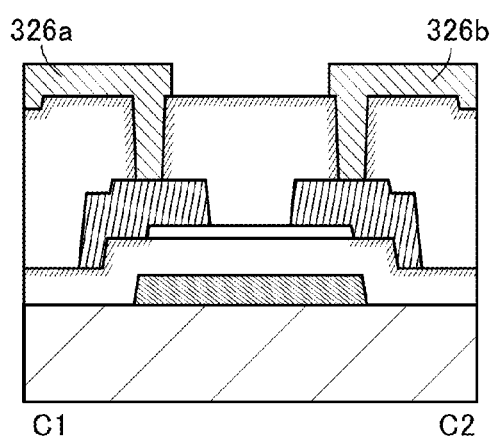
326a　　　　326b
C1　　　　　　　　C2
FIG. 19C2
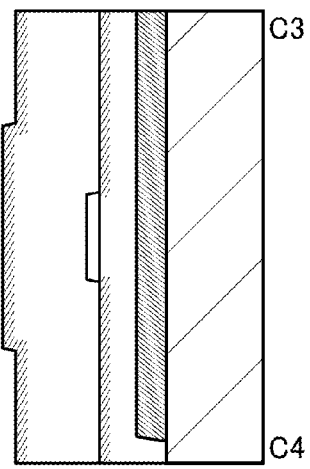
C3
C4

SEMICONDUCTOR DEVICE AND MANUFACTURING METHOD THEREOF

TECHNICAL FIELD

The present invention relates to an object, a method, or a manufacturing method. The present invention relates to a process, a machine, manufacture, or a composition of matter. In particular, the present invention relates to, for example, a semiconductor device, a display device, a liquid crystal display device, or a light-emitting device. Further, the present invention relates to a manufacturing method of a semiconductor film, a semiconductor device, a display device, a liquid crystal display device, or a light-emitting device. The present invention relates to a driving method of a semiconductor device, a display device, a liquid crystal display device, or a light-emitting device. The present invention relates to an electronic device or the like including the semiconductor device, the display device, or the light-emitting device.

Note that a semiconductor device in this specification refers to any device that can function by utilizing semiconductor characteristics, and an electro-optical device, a semiconductor circuit, an electronic device, and the like are all included in the category of the semiconductor device.

BACKGROUND ART

Attention has been focused on a technique for forming a transistor using a semiconductor film that is formed on a substrate having an insulating surface. The transistor is applied to a wide range of semiconductor devices such as an integrated circuit and a display device. A silicon film is known as a semiconductor film applicable to a transistor.

As a silicon film used as a semiconductor film of a transistor, either an amorphous silicon film or a polycrystalline silicon film is used depending on the purpose. For example, in the case of a transistor included in a large display device, it is preferable to use an amorphous silicon film, which can be formed using the established technique for forming a film on a large substrate. On the other hand, in the case of a transistor included in a high-performance display device where driver circuits are formed over the same substrate, it is preferable to use a polycrystalline silicon film, which can be used to form a transistor having a high field-effect mobility. As a method for forming a polycrystalline silicon film, high-temperature heat treatment or laser light treatment that is performed on an amorphous silicon film has been known.

In recent years, a transistor that includes an oxide semiconductor film (typified by an oxide semiconductor film containing indium, gallium, and zinc) has attracted attention.

An oxide semiconductor film can be formed by a sputtering method or the like, and thus can be used for a transistor included in a large display device. Further, a transistor including an oxide semiconductor film has a high field-effect mobility; therefore, the use of the transistor allows fabrication of a high-performance display device where driver circuits are formed over the same substrate. In addition, there is an advantage that capital investment can be reduced because part of production equipment for a transistor including an amorphous silicon film can be retrofitted and utilized.

As a method for providing a transistor including an oxide semiconductor film with stable electrical characteristics, a technique where an insulating film in contact with an oxide semiconductor film is doped with oxygen is disclosed (see Patent Document 1). The technique disclosed in Patent Document 1 enables oxygen vacancies in an oxide semiconductor film to be reduced. As a result, variation in electrical characteristics of a transistor including an oxide semiconductor film can be reduced and reliability can be improved.

A transistor including an oxide semiconductor film is known to have an extremely low leakage current in an off state. For example, a low-power semiconductor device and the like utilizing the low leakage current of a transistor including an oxide semiconductor film and the high on-state current of a silicon transistor are disclosed (see Patent Document 2). In addition, for example, a CPU with low-power consumption utilizing the low leakage current of a transistor including an oxide semiconductor film is disclosed (see Patent Document 3).

REFERENCE

[Patent Document 1] Japanese Published Patent Application No. 2011-243974
[Patent Document 2] Japanese Published Patent Application No. 2011-171702
[Patent Document 3] Japanese Published Patent Application No. 2012-257187

DISCLOSURE OF INVENTION

In a transistor including an oxide semiconductor film, oxygen serves as an element that improves the electrical characteristics of the transistor.

An object is to provide a transistor that is formed using an oxide semiconductor film with reduced oxygen vacancies. Another object is to provide a transistor having excellent electrical characteristics. Another object is to provide a miniaturized transistor. Another object is to provide a transistor having a high on-state current. Another object is to provide a transistor having stable electrical characteristics. Another object is to provide a transistor having a low off-state current. Another object is to provide a semiconductor device or the like including the transistor. Another object is to provide a novel semiconductor device or the like.

Another object is to separately form regions having different oxygen diffusion coefficients in an insulating film.

Note that the semiconductor device has high reliability. On the other hand, oxygen might increase the resistance of a metal film used for a wiring, hindering the high-speed operation of the semiconductor device.

In view of the above, another object is to provide a semiconductor device that operates at high speed. Another object is to provide a highly reliable semiconductor device. Another object is to provide a miniaturized semiconductor device.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

Even in the case of an insulating film having a large oxygen diffusion coefficient, adding an impurity into the insulating film can form a region having a small oxygen diffusion coefficient, that is, a region that blocks oxygen (also referred to as an oxygen blocking region) in some cases. For example, adding phosphorus or boron to an oxide insulating film typified by a silicon oxide film or a silicon oxynitride film can form an oxygen blocking region in the insulating film.

An oxygen blocking region has an oxygen (including an oxygen atom and a molecule having an oxygen atom) diffusion coefficient smaller than that of the other region. Therefore, the oxygen blocking region permits less oxygen permeation than the other region when oxygen is thermally diffused in an insulating film. For example, the amount of oxygen that permeates an insulating film including an oxygen blocking region can be less than 20%, less than 15%, less than 10%, less than 5%, less than 2%, or less than 1% of the amount of oxygen that permeates an insulating film not including an oxygen blocking region.

An oxygen blocking region included in part of a semiconductor device can reduce oxygen vacancies in an oxide semiconductor film in some cases.

In a semiconductor device including a transistor formed using an oxide semiconductor film, it may be possible that oxygen reach the transistor formed using an oxide semiconductor film and not reach a wiring. Oxygen in a silicon transistor serves as an element that degrades the electrical characteristics. Thus, in a semiconductor device including both a transistor formed using an oxide semiconductor film and a silicon transistor, it may be possible that oxygen reach the transistor formed using an oxide semiconductor film and not reach the silicon transistor.

In the case where an oxygen blocking region is provided, for example, oxygen can be inhibited from being released from an oxide semiconductor film to be diffused to the outside of a semiconductor device (such a phenomenon is also referred to as out diffusion), to reach a wiring included in the semiconductor device, or to reach a silicon transistor, in some cases. Alternatively, in the case where an oxygen blocking region is provided and, for example, a film in contact with an oxide semiconductor film contains excess oxygen, it may be possible to reduce loss of excess oxygen due to out diffusion or oxygen reaching a wiring included in a semiconductor device or a silicon transistor, resulting in efficient supply of excess oxygen to the oxide semiconductor film.

Excess oxygen refers to oxygen that can be released (is released) by heating. Heat refers to heat applied in a manufacturing process of a semiconductor device. That is, excess oxygen in this specification refers to oxygen released by heat at a temperature lower than a temperature in a manufacturing process of a semiconductor device. Excess oxygen can move inside a film or a layer. Excess oxygen moves between atoms in a film or a layer, or replaces oxygen that is a constituent of a film or a layer and moves like a billiard ball.

The amount of oxygen released from a film containing excess oxygen may be greater than or equal to $1 \times 10^{18}$ atoms/cm$^3$, greater than or equal to $1 \times 10^{19}$ atoms/cm$^3$, or greater than or equal to $1 \times 10^{20}$ atoms/cm$^3$ (converted into the number of oxygen atoms) in thermal desorption spectroscopy (TDS) performed such that the surface temperature is higher than or equal to 100° C. and lower than or equal to 700° C., preferably higher than or equal to 100° C. and lower than or equal to 500° C.

Alternatively, a film containing excess oxygen is a film containing a peroxide radical. Specifically, the spin density attributed to the peroxide radical of the film is higher than or equal to $5 \times 10^{17}$ spins/cm$^3$. Note that a film containing a peroxide radical may have a signal having asymmetry at a g value of around 2.01 in electron spin resonance (ESR).

One embodiment of the present invention is a semiconductor device including, for example, a base insulating film that is over a substrate and includes a region containing phosphorus or boron and a region containing neither phosphorus nor boron; an oxide semiconductor film that is over the region containing neither phosphorus nor boron in the base insulating film; a gate insulating film that is over the oxide semiconductor film; and a gate electrode that is over the gate insulating film and overlaps with the oxide semiconductor film.

Note that the base insulating film preferably contains oxygen that can be released by heating. Further, it is preferable that a protective insulating film be provided above the oxide semiconductor film, the gate insulating film, and the gate electrode and include a region containing phosphorus or boron. The gate insulating film preferably includes a region containing phosphorus or boron and a region containing neither phosphorus nor boron. The gate electrode is preferably provided over the region containing neither phosphorus nor boron in the gate insulating film.

Another embodiment of the present invention is a semiconductor device including, for example, an oxide semiconductor film; a gate electrode that overlaps with the oxide semiconductor film; a gate insulating film that is between the oxide semiconductor film and the gate electrode; and a protective insulating film that is above the oxide semiconductor film, the gate electrode, and the gate insulating film and includes a region containing phosphorus or boron.

Note that the protective insulating film preferably contains oxygen that can be released by heating. The gate insulating film preferably includes a region containing phosphorus or boron and a region containing neither phosphorus nor boron. The gate electrode is preferably provided over the region containing neither phosphorus nor boron in the gate insulating film.

Another embodiment of the present invention is a semiconductor device including, for example, an oxide semiconductor film; a gate electrode that overlaps with the oxide semiconductor film; a gate insulating film that is between the oxide semiconductor film and the gate electrode; a source electrode and a drain electrode that are in contact with the oxide semiconductor film; a protective insulating film that are above the oxide semiconductor film, the gate electrode, the gate insulating film, the source electrode, and the drain electrode, has openings reaching the source electrode and the drain electrodes, and includes a region containing phosphorus or boron; and a first wiring and a second wiring that are over the protective insulating film and in contact with the source electrode and the drain electrode through the openings, respectively.

The protective insulating film preferably includes a region containing phosphorus or boron in the vicinity of side surfaces of the openings. Further, the protective insulating film preferably contains oxygen that can be released by heating.

Another embodiment of the present invention is a method for manufacturing a semiconductor device including, for example, a base insulating film that is over a substrate; an island-shaped oxide semiconductor film that is over the base insulating film; a gate insulating film that is over the island-shaped oxide semiconductor film; and a gate electrode that is over the gate insulating film and overlaps with the island-shaped oxide semiconductor film. The method for manufacturing a semiconductor device includes the steps of forming the base insulating film over the substrate; forming the oxide semiconductor film over the base insulating film; forming a resist mask over the oxide semiconductor film; forming the island-shaped oxide semiconductor film by etching the oxide semiconductor film with the use of the resist mask; adding phosphorus or boron to the base insulating film with the use of the resist mask after the formation of the island-shaped oxide semiconductor film; and removing the resist mask.

Note that an ion doping method or an ion implantation method is preferably employed to add phosphorus or boron. In that case, phosphorus or boron may be added more than once at varying incident angles, for example. Alternatively, phosphorus or boron may be added with the substrate rotated, for example.

Another embodiment of the present invention is a semiconductor device including, for example, a first transistor that includes silicon; an insulating film that is over the first transistor and includes a region containing phosphorus or boron; and a second transistor that includes an oxide semiconductor film and is over the insulating film.

Note that the insulating film preferably contains oxygen that can be released by heating.

Another embodiment of the present invention is a semiconductor device including, for example, a first transistor that includes silicon; a first insulating film that is over the first transistor and has an opening reaching the first transistor; a conductive film that is over the first insulating film and is connected to the first transistor through the opening in the first insulating film; a second insulating film that is over the first insulating film and the conductive film and has an opening reaching a wiring; and a second transistor that includes an oxide semiconductor film, is over the second insulating film, and is connected to the conductive film through the opening in the second insulating film. The second insulating film includes a region containing phosphorus or boron.

Note that the second insulating film preferably contains oxygen that can be released by heating.

The first insulating film preferably contains phosphorus or boron in the vicinity of a side surface of the opening.

The second insulating film preferably contains phosphorus or boron in the vicinity of a side surface of the opening.

A transistor that is formed using an oxide semiconductor film with reduced oxygen vacancies can be provided.

A transistor having excellent electrical characteristics can be provided. A miniaturized transistor can be provided. A transistor having a high on-state current can be provided. A transistor having stable electrical characteristics can be provided.

A transistor having a low off-state current can be provided. A transistor having high field-effect mobility can be provided. A transistor with a high yield can be provided. A semiconductor device or the like including the transistor can be provided. A semiconductor device that operates at high speed can be provided. A highly reliable semiconductor device can be provided. A miniaturized semiconductor device can be provided. A novel semiconductor device or the like can be provided.

BRIEF DESCRIPTION OF DRAWINGS

In the accompanying drawings:

FIGS. 2A1 to 2C each illustrate ion incident;

FIGS. 3A to 3C are a top view and cross-sectional views illustrating examples of semiconductor devices of embodiments of the present invention;

FIGS. 4A1 to 4C2 are cross-sectional views illustrating an examples of a method for manufacturing a semiconductor device of one embodiment of the present invention;

FIGS. 5A1 to 5C2 are cross-sectional views illustrating an example of a method for manufacturing a semiconductor device of one embodiment of the present invention;

FIGS. 6A1 to 6C2 are cross-sectional views illustrating an example of a method for manufacturing a semiconductor device of one embodiment of the present invention;

FIGS. 7A1 to 7C2 are cross-sectional views illustrating an example of a method for manufacturing a semiconductor device of one embodiment of the present invention;

FIGS. 8A1 to 8C2 are cross-sectional views illustrating an example of a method for manufacturing a semiconductor device of one embodiment of the present invention;

FIGS. 9A to 9C are a top view and cross-sectional views illustrating examples of semiconductor devices of embodiments of the present invention;

FIGS. 10A1 to 10C2 are cross-sectional views illustrating an example of a method for manufacturing a semiconductor device of one embodiment of the present invention;

FIGS. 11A1 to 11C2 are cross-sectional views illustrating an example of a method for manufacturing a semiconductor device of one embodiment of the present invention;

FIGS. 12A1 to 12C2 are cross-sectional views illustrating an example of a method for manufacturing a semiconductor device of one embodiment of the present invention;

FIGS. 13A1 to 13C2 are cross-sectional views illustrating an example of a method for manufacturing a semiconductor device of one embodiment of the present invention;

FIGS. 14A1 to 14C2 are cross-sectional views illustrating an example of a method for manufacturing a semiconductor device of one embodiment of the present invention;

FIGS. 15A to 15C are a top view and cross-sectional views illustrating examples of semiconductor devices of embodiments of the present invention;

FIGS. 16A1 to 16C2 are cross-sectional views illustrating an example of a method for manufacturing a semiconductor device of one embodiment of the present invention;

FIGS. 17A1 to 17C2 are cross-sectional views illustrating an example of a method for manufacturing a semiconductor device of one embodiment of the present invention;

FIGS. 18A1 to 18C2 are cross-sectional views illustrating an example of a method for manufacturing a semiconductor device of one embodiment of the present invention;

FIGS. 19A1 to 19C2 are cross-sectional views illustrating an example of a method for manufacturing a semiconductor device of one embodiment of the present invention;

BEST MODE FOR CARRYING OUT THE INVENTION

Figure 1A:
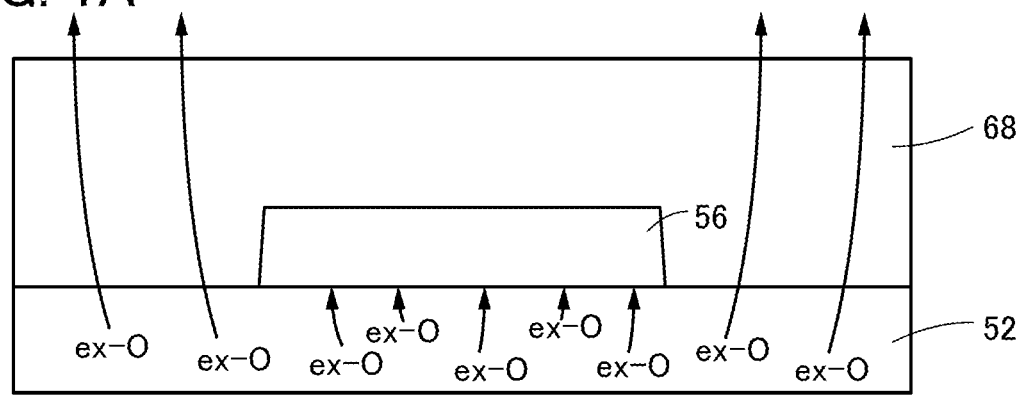
FIGS. 1A to 1C are cross-sectional views each illustrating diffusion of excess oxygen in the inside of a semiconductor device.

Hereinafter, an embodiment and examples of the present invention will be described in detail with the reference to the drawings. However, the present invention is not limited to the descriptions below, and it is easily understood by those skilled in the art that modes and details disclosed herein can be modified in various ways. Further, the present invention is not construed as being limited to the descriptions of the embodiment and the examples. In describing the structures of the present invention with reference to the drawings, the same reference numerals are used in common for the same portions in different drawings. The same hatch pattern is applied to similar parts, and the similar parts may not be especially denoted by reference numerals.

In the drawings, the size, the thicknesses of layers, or regions may be exaggerated for clarity. Therefore, the present invention is not necessarily limited to such scales in the drawings.

A voltage usually refers to a potential difference between a given potential and a reference potential (e.g., a source potential or a ground potential (GND)). Thus, a voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. Therefore, for example, a description can be made even when "first" is replaced with "second" or "third", as appropriate. In addition, the ordinal numbers in this specification do not correspond to the ordinal numbers that specify one embodiment of the present invention in some cases.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" has characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

In this specification, a term "parallel" indicates that the angle formed between two straight lines is greater than or equal to $-10°$ and less than or equal to $10°$, and accordingly includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

<Oxygen Behavior 1>

The behavior of excess oxygen in a semiconductor device will be described below with reference to FIGS. 1A to 1C.

FIG. 1A is a cross-sectional view of a sample including an insulating film 52, an island-shaped oxide semiconductor film 56 over the insulating film 52, and an insulating film 68 over the insulating film 52 and the oxide semiconductor film 56. In the sample illustrated in FIG. 1A, the insulating film 52 contains excess oxygen (indicated as ex-O in the drawing).

Examples of a film that can be used as the insulating film 52 include an oxide film and an oxynitride film. For example, a silicon oxide film, a silicon oxynitride film, or the like is used as the insulating film 52. Note that an oxynitride film in this specification refers to an oxide film containing nitrogen at a concentration higher than or equal to 0.1 at % and less than 25 at %. A nitride oxide film in this specification refers to a nitride film containing oxygen at a concentration higher than or equal to 0.1 at % and less than 25 at %.

To avoid redundancy, descriptions of an oxide semiconductor film 106 and a protective insulating film 118 are referred to for the oxide semiconductor film 56 and the insulating film 68 and the descriptions thereof are omitted here.

Heat application diffuses excess oxygen in the insulating film 52. For example, excess oxygen diffused in the insulating film 52 can fill oxygen vacancies in the oxide semiconductor film 56 when reaching the interface between the insulating film 52 and the oxide semiconductor film 56. Reducing oxygen vacancies in the oxide semiconductor film 56 can lower the density of defect states due to oxygen vacancies in the oxide semiconductor film 56.

However, all excess oxygen diffused in the insulating film 52 does not reach the interface between the insulating film 52 and the oxide semiconductor film 56. For example, excess oxygen diffused in the insulating film 52 might be diffused outward through the insulating film 68, or might react with a wiring included in the semiconductor device to increase the wiring resistance.

Thus, excess oxygen might not be efficiently utilized in the sample structure illustrated in FIG. 1A.

Figure 1B:
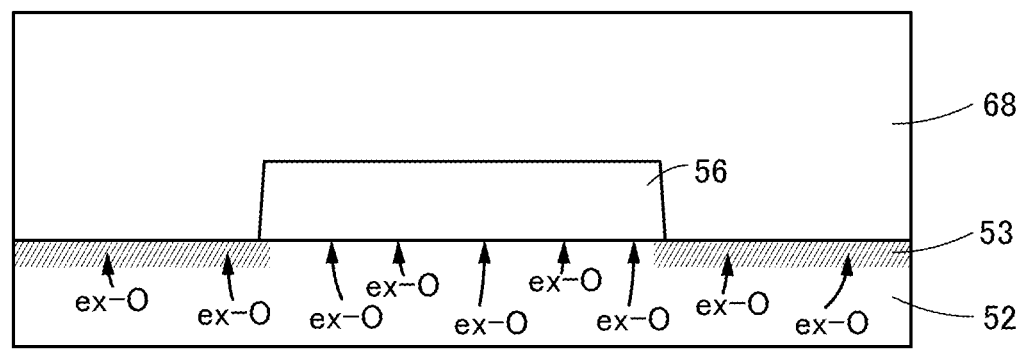
Figure 1C:
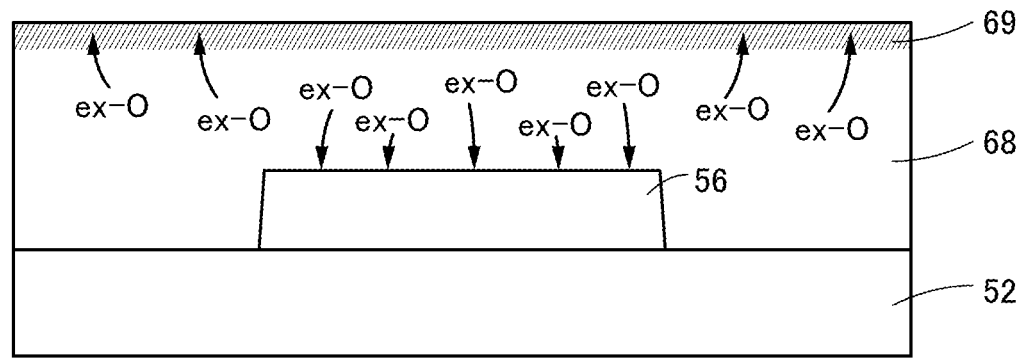

FIGS. 1B and 1C illustrate examples of sample structures in each of which excess oxygen can be efficiently utilized.

FIG. 1B illustrates the sample having a structure similar to that of the sample illustrated in FIG. 1A. The sample illustrated in FIG. 1B is different from the sample in FIG. 1A in that the insulating film 52 includes a region 53 in the vicinity of the insulating film 68. The insulating film 52 in the sample in FIG. 1B contains excess oxygen. The region 53 is provided to a depth of 1 nm to 200 nm inclusive, preferably 5 nm to 150 nm inclusive, more preferably 10 nm to 100 nm inclusive from the top surface of the insulating film 52. Note that the region 53 may be provided so as to extend from the top surface of the insulating film 52 to the bottom surface thereof.

The region 53 is an oxygen blocking region. The region 53 serving as an oxygen blocking region can be formed by, for example, adding one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten to the insulating film 52. The above impurities are less likely to increase the resistance of metal. Note that adding phosphorus or boron among the above impurities to the insulating film 52 enables formation of the particularly high-quality region 53 having an excellent oxygen blocking property (having a small oxygen diffusion coefficient). The region 53 contains, in the insulating film 52, for example, any of the above impurities at a concentration of higher than or equal to $5\times10^{19}$ atoms/cm$^3$, preferably higher than or equal to $1\times10^{20}$ atoms/cm$^3$, more preferably higher than or equal to $2\times10^{20}$ atoms/cm$^3$, still more preferably higher than or equal to $5\times10^{20}$ atoms/cm$^3$.

The behavior of excess oxygen in the sample illustrated in FIG. 1B will be described below.

Heat application diffuses excess oxygen in the insulating film 52. Excess oxygen diffused in the insulating film 52 can fill oxygen vacancies in the oxide semiconductor film 56 when reaching the interface between the insulating film 52 and the oxide semiconductor film 56.

Excess oxygen diffused in the insulating film 52 hardly passes through the region 53, which increases the proportion of excess oxygen reaching the interface between the insulating film 52 and the oxide semiconductor film 56. Accordingly, oxygen vacancies in the oxide semiconductor film 56 can be efficiently filled with excess oxygen. Further, for example, excess oxygen diffused in the insulating film 52 can be inhibited from being diffused outward through the insulating film 68, or can be inhibited from reacting with a wiring included in the semiconductor device to increase the wiring resistance.

Thus, excess oxygen can be efficiently utilized in the sample structure illustrated in FIG. 1B.

Similarly, FIG. 1C illustrates the sample having a structure similar to that of the sample illustrated in FIG. 1A. The sample illustrated in FIG. 1C is different from the sample in FIG. 1C in that the insulating film 68 includes a region 69. The insulating film 68 in the sample in FIG. 1C contains excess oxygen. The region 69 is provided to a depth of 1 nm to 200 nm inclusive, preferably 5 nm to 150 nm inclusive, more preferably 10 nm to 100 nm inclusive from the top surface of the insulating film 68.

The region 69 is an oxygen blocking region. The region 69 serving as an oxygen blocking region can be formed by, for example, adding one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten to the insulating film 68. Note that adding phosphorus or boron among the above impurities to the insulating film 68 enables formation of the particularly high-quality region 69 having an excellent oxygen blocking property. The region 69 contains, in the insulating film 68, for example, any of the above impurities at a concentration of higher than or equal to $5\times10^{19}$ atoms/cm$^3$, preferably higher than or equal to $1\times10^{20}$ atoms/cm$^3$, more preferably higher than or equal to $2\times10^{20}$ atoms/cm$^3$, still more preferably higher than or equal to $5\times10^{20}$ atoms/cm$^3$.

The behavior of excess oxygen in the sample illustrated in FIG. 1C will be described below.

Heat application diffuses excess oxygen in the insulating film 68. Excess oxygen diffused in the insulating film 68 can fill oxygen vacancies in the oxide semiconductor film 56 when reaching the interface between the insulating film 68 and the oxide semiconductor film 56.

Excess oxygen diffused in the insulating film 68 hardly passes through the region 69, which increases the proportion of excess oxygen reaching the interface between the insulating film 68 and the oxide semiconductor film 56. Accordingly, oxygen vacancies in the oxide semiconductor film 56 can be efficiently filled with excess oxygen. Further, for example, excess oxygen diffused in the insulating film 68 can be inhibited from being diffused outward, or can be inhibited from reacting with a wiring included in the semiconductor device to increase the wiring resistance.

Thus, excess oxygen can be efficiently utilized in the sample structure illustrated in FIG. 1C.

Although not illustrated, a combination of the sample structure illustrated in FIG. 1B and the sample structure illustrated in FIG. 1C may be employed. For example, both the insulating film 52 and the insulating film 68 may contain excess oxygen. Alternatively, for example, a structure may be employed in which the insulating film 52 includes the region 53 in the vicinity of the insulating film 68 and the insulating film 68 includes the region 69.

<Oxygen Behavior 2>

Next, the behaviors of excess oxygen and oxygen in part of the inside of a semiconductor device will be described with reference to FIGS. 27A to 27D.

Figure 27A:
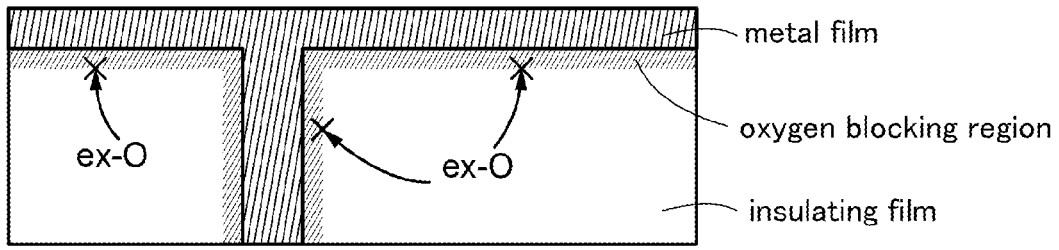
FIGS. 27A to 27D are schematic cross-sectional views each illustrating diffusion of excess oxygen in the inside of a semiconductor device.

FIG. 27A is a schematic cross-sectional view of a sample including an insulating film and a metal film over the insulating film. The insulating film contains excess oxygen.

In the sample illustrated in FIG. 27A, the insulating film includes oxygen blocking regions in the vicinity of the metal film. Thus, excess oxygen diffused in the insulating film can be inhibited from reaching the metal film. Note that in the case where the sample does not include an oxygen blocking region, excess oxygen reaching the metal film might oxidize the metal film, increasing the resistance.

Figure 27B:
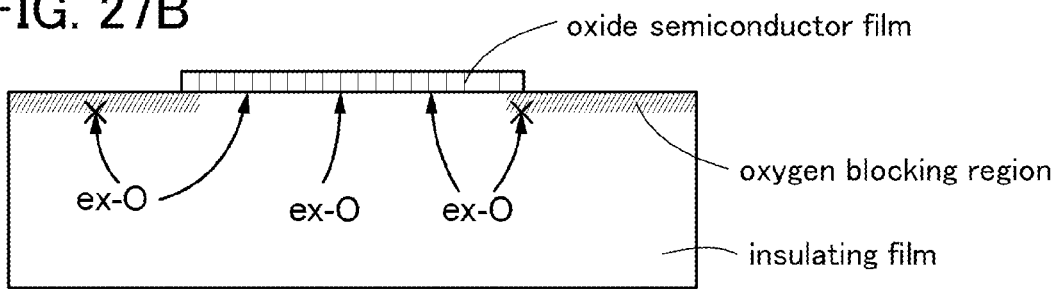

FIG. 27B is a schematic cross-sectional view of a sample including an insulating film and an island-shaped oxide semiconductor film over the insulating film. The insulating film contains excess oxygen.

In the sample illustrated in FIG. 27B, a region of the insulating film over which the oxide semiconductor film is not provided includes oxygen blocking regions. Thus, excess oxygen diffused in the insulating film can be inhibited from being diffused outward, or can fill oxygen vacancies in the oxide semiconductor film. Note that in the case where the sample does not include an oxygen blocking region, outward diffusion of excess oxygen might cause lack of excess oxygen for filling oxygen vacancies in the oxide semiconductor film.

Figure 27C:
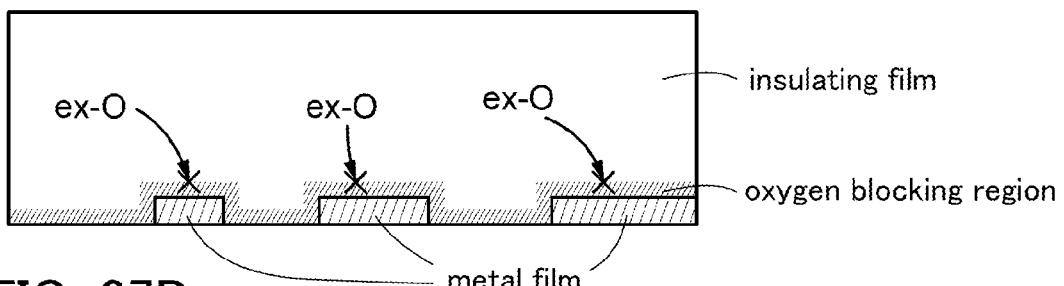

FIG. 27C is a schematic cross-sectional view of a sample including metal films and an insulating film over the metal films. The insulating film contains excess oxygen.

In the sample illustrated in FIG. 27C, the insulating film includes an oxygen blocking region in the vicinity of the metal films. Thus, excess oxygen diffused in the insulating film can be inhibited from reaching the metal films. Note that in the case where the sample does not include an oxygen blocking region, excess oxygen reaching the metal films might oxidize the metal film, increasing the resistance.

Figure 27D:
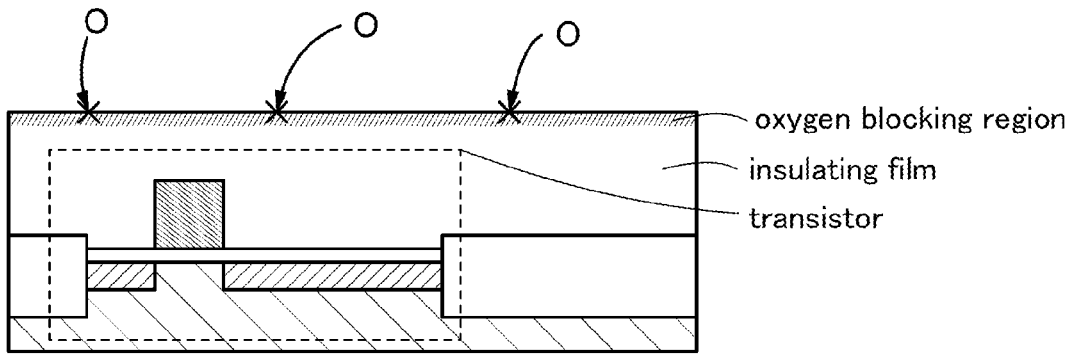

FIG. 27D is a schematic cross-sectional view of a sample including a transistor and an insulating film over the transistor. The electrical characteristics of the transistor are degraded by entry of oxygen.

In the sample illustrated in FIG. 27D, the insulating film includes an oxygen blocking region in an upper portion of the insulating film. This can inhibit oxygen (denoted as O in the drawing) from the outside from reaching the transistor. Note that in the case where the sample does not include an oxygen blocking region, excess oxygen reaching the transistor might degrade the electrical characteristics.

As described above, it is effective to provide such an oxygen blocking region in each sample as a part of the inside of the semiconductor device in order to prevent degradation of the electrical characteristics of the semiconductor device.

<Formation Method of Oxygen Blocking Region>

A method for forming an oxygen blocking region such as the region 53 in FIG. 1B, the region 69 in FIG. 1C, or the oxygen blocking region in FIGS. 27A to 27D will be described below with reference to FIGS. 2A1 to 2C.

The case where the region 53 is formed in the insulating film 52 will be described below as a typical example with reference to FIG. 1B.

First, an insulating film 52 is formed.

Then, an oxide semiconductor film to be the oxide semiconductor film 56 is formed.

After that, a resist is formed over the oxide semiconductor film. The resist is exposed to light through a photomask and then developed, whereby a resist mask is formed.

Next, the oxide semiconductor film is etched using the resist mask to form the oxide semiconductor film 56.

Then, an impurity is added to the insulating film 52 with the resist mask left, whereby the region 53 is formed. The left resist mask can inhibit the impurity from being added to the top surface of the oxide semiconductor film 56. In the case where the top surface of the oxide semiconductor film 56 is removed in a later step, for example, however, the impurity may be added to the insulating film 52 and the oxide semiconductor film 56 after the resist mask is removed.

For example, one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are added as an impurity to the insulating film 52. Note that adding phosphorus or boron among the above impurities to the insulating film 52 enables formation of the particularly high-quality region 53 having an excellent oxygen blocking property.

An ion doping method (a method without mass separation), an ion implantation method (a method with mass separation), or the like is employed to add the impurity to the insulating film 52. Alternatively, an ion doping method or an ion implantation method in which atomic or molecular clusters are generated and ionized may be employed. Note that the impurity may be added to the insulating film 52 by plasma treatment in an atmosphere containing the impurity element.

In the case where the region 53 is formed in the insulating film 52 by an ion doping method or an ion implantation method, for example, the acceleration voltage for the ion doping method or the ion implantation method is higher than or equal to 0.5 kV and lower than or equal to 100 kV, preferably higher than or equal to 1 kV and lower than or equal to 50 kV, more preferably higher than or equal to 1 kV and lower than or equal to 30 kV, still more preferably higher than or equal to 1 kV and lower than or equal to 10 kV. Further, the ion implantation concentration is higher than or equal to $1\times10^{15}$ atoms/cm$^2$, preferably higher than or equal to $2\times10^{15}$ atoms/cm$^2$, more preferably higher than or equal to $5\times10^{15}$ atoms/cm$^2$, still more preferably higher than or equal to $1\times10^{16}$ atoms/cm$^2$, still further preferably higher than or equal to $2\times10^{16}$ atoms/cm$^2$.

Although ion addition by an ion doping method or an ion implantation method may be performed at a specific angle (e.g., a right angle) with respect to a surface of a sample, any of the methods illustrated in FIGS. 2A1 to 2C is preferably employed. FIGS. 2A1 to 2C each schematically illustrate the state where one ion is incident on a surface of a sample at an angle θ and an angle φ.

The x-axis, the y-axis, and the z-axis are straight lines intersecting at a certain incident point of the ion. The x-axis is a given straight line on the sample surface. The y-axis is a straight line that is on the sample surface and intersects with the x-axis at right angles. The z-axis is the normal to the sample surface that passes through the incident point. The angle θ is an angle formed by the ion incident direction and the z-axis when seen in cross section. The angle φ is an angle formed by the ion incident direction and the x-axis when seen from above.

When the ion is incident on the sample surface only at a specific angle (θ, φ), a region to which the ion is not added might be generated. For example, the oxide semiconductor film 56 and the resist mask are provided over the insulating film 52 and thus might generate a region of the insulating film 52 to which the ion is not added. For this reason, the ion is preferably incident at a plurality of angles, in which case an influence of the region generated in the insulating film 52 can be reduced.

As illustrated in FIGS. 2A1 and 2A2, the ion is preferably incident on the sample surface at a first angle (θ, φ) and then incident thereon at a second angle (θ, φ). Note that at least one of the angles θ and φ of the first angle (θ, φ) is different from that of the second angle (θ, φ).

The angle θ of the first angle (θ, φ) is, for example, greater than or equal to 0° and less than 90°, preferably greater than or equal to 30° and less than or equal to 88°, more preferably greater than or equal to 60° and less than or equal to 85°. The angle θ of the second angle (θ, φ) is, for example, greater than or equal to 0° and less than 90°, preferably greater than or equal to 30° and less than or equal to 88°, more preferably greater than or equal to 60° and less than or equal to 85°. The angle φ of the second angle (θ, φ) is, for example, larger than the angle φ of the first angle (θ, φ) by greater than or equal to 90° and less than or equal to 270°, preferably greater than or equal to 135° and less than or equal to 225°. Note that the ranges of the first angle (θ, φ) and the second angle (θ, φ) described here are just examples, and are not limited to the above ranges.

The ion incident angle is not limited to the two kinds of angles: the first angle (θ, φ) and the second angle (θ, φ). For example, the ion incident angle may be the first angle (θ, φ) to an n-th angle (θ, φ) (n is a natural number of 2 or more). The angles θ and/or the angles φ of the first angle (θ, φ) to the n-th angle (θ, φ) are different angles.

Alternatively, the ion may incident on the sample surface at the first angle (θ, φ) and then scanning in the θ direction (also referred to as θ scanning) may be performed so that the angle θ passes through 90° to change the ion incident angle from the first angle (θ, φ) to the second angle (θ, φ), as illustrated in FIG. 2B. Note that the ion incident angle φ is not limited to one kind of angle and may be a first angle φ to an n-th angle φ (n is a natural number of 2 or more). The θ scanning of the ion incident angle enables reliable ion addition to a great depth even in an opening with a high aspect ratio (e.g., 1 or more, 2 or more, 5 or more, or 10 or more). Thus, the oxygen blocking region can be formed without any space.

The angle θ of the first angle (θ, φ) is, for example, greater than or equal to 0° and less than 90°, preferably greater than or equal to 30° and less than or equal to 88°, more preferably greater than or equal to 60° and less than or equal to 85°. The angle θ of the second angle (θ, φ) is, for example, greater than or equal to 0° and less than 90°, preferably greater than or equal to 30° and less than or equal to 88°, more preferably greater than or equal to 60° and less than or equal to 85°. The angle θ of the first angle (θ, φ) may be equal to the angle θ of the second angle (θ, φ).

Note that the θ scanning may be performed continuously or stepwise, that is, in steps of, for example, 0.5°, 1°, 2°, 3°, 4°, 5°, 6°, 10°, 12°, 18°, 20°, 24°, or 30°.

Alternatively, the ion may incident on the sample surface at the first angle (θ, φ) and then scanning in the φ direction (also referred to as φ scanning) may be performed so that the ion incident angle is changed from the first angle (θ, φ) to the second angle (θ, φ) as illustrated in FIG. 2C. Note that the ion incident angle θ is not limited to one kind of angle and may be any of a first angle θ to an n-th angle θ (n is a natural number of 2 or more).

The angle θ of the first angle (θ, φ) and the second angle (θ, φ) is, for example, greater than or equal to 0° and less than 90°, preferably greater than or equal to 30° and less than or equal to 88°, more preferably greater than or equal to 60° and less than or equal to 85°. The angle φ of the first angle (θ, φ) may be equal to the angle φ of the second angle (θ, φ).

Note that the φ scanning may be performed continuously or stepwise, that is, in steps of, for example, 0.5°, 1°, 2°, 3°, 4°, 5°, 6°, 10°, 12°, 18°, 20°, 24°, or 30°.

Although not illustrated, the θ scanning and the φ scanning may be performed in combination.

The method illustrated in FIGS. 2A1 to 2C allows formation of the region 53 in a region overlapping with part of the oxide semiconductor film 56 as well as in a region not overlapping with the oxide semiconductor film 56. In other words, the region 53 can be formed so that a region (that does not block oxygen) other than the region 53 does not exist on the outer side than a region over which the oxide semiconductor film 56 is provided. Thus, excess oxygen contained in the insulating film 52 can be efficiently utilized to reduce oxygen vacancies in the oxide semiconductor film 56.

The region 53 is formed in the insulating film 52 in the above-described manner and then the insulating film 68 is formed over the oxide semiconductor film 56 and the region 53 in the insulating film 52, whereby the sample structure illustrated in FIG. 1B can be formed.

<Description of Structure of Transistor and Manufacturing Method Thereof>

The structure of a transistor of one embodiment of the present invention and a manufacturing method thereof will be described below.

<Transistor Structure 1>

First, an example of a top-gate top-contact transistor will be described.

FIGS. 3A to 3C are a top view and cross-sectional views of the transistor. FIG. 3A is the top view of the transistor. FIGS. 3B1 and 3B2 are the cross-sectional views taken along dashed-dotted line A1-A2 in FIG. 3A. FIG. 3C is the cross-sectional view taken along dashed-dotted line A3-A4 in FIG. 3A.

The transistor in FIGS. 3B1 and 3B2 includes an insulating film 102 over a substrate 100; the oxide semiconductor film 106 over the insulating film 102; a source electrode 116a and a drain electrode 116b over the oxide semiconductor film 106; a gate insulating film 112 over the oxide semiconductor film 106, the source electrode 116a, and the drain electrode 116b; and a gate electrode 104 over the gate insulating film 112. The transistor preferably further includes the protective insulating film 118 over the source electrode 116a, the drain electrode 116b, the gate insulating film 112, and the gate electrode 104; and a wiring 126a and a wiring 126b over the protective insulating film 118. Further, the gate insulating film 112 and the protective insulating film 118 have openings reaching the source electrode 116a and the drain electrode 116b, respectively. The wiring 126a and the wiring 126b are in contact with the source electrode 116a and the drain electrode 116b through the openings, respectively. Note that the transistor does not necessarily include the insulating film 102.

The transistor in FIGS. 3B1 and 3B2 includes one or more of the following: a region 103 serving as an oxygen blocking region, a region 113, and a region 119. The descriptions of the regions 53 and 69 can be referred to for the oxygen blocking region.

The region 103 is a region of the insulating film 102 that is in contact with the source electrode 116a, the drain electrode 116b, and the gate insulating film 112. The region 103 is provided to a depth of 1 nm to 200 nm inclusive, preferably 5 nm to 150 nm inclusive, more preferably 10 nm to 100 nm inclusive from the top surface of the insulating film 102. Note that the region 103 may be provided so as to extend from the top surface of the insulating film 102 to the bottom surface thereof. The region 103 may also be provided in the substrate 100.

The region 113 is a region of the gate insulating film 112 that is in contact with the protective insulating film 118. The region 113 is provided to a depth of 1 nm to 200 nm inclusive, preferably 5 nm to 150 nm inclusive, more preferably 10 nm to 100 nm inclusive from the top surface of the gate insulating film 112. Note that the region 113 may be provided so as to extend from the top surface of the gate insulating film 112 to the bottom surface thereof. The region 113 may also be provided in a region of the insulating film 102 that does not overlap with the gate electrode 104, the source electrode 116a, or the drain electrode 116b.

The region 119 is a region provided in an upper portion of the protective insulating film 118 as illustrated in FIG. 3B1. Alternatively, the region 119 is a region provided in an upper portion of the protective insulating film 118 and side portions of the openings as illustrated in FIG. 3B2. The region 119 is provided to a depth of 1 nm to 200 nm inclusive, preferably 5 nm to 150 nm inclusive, more preferably 10 nm to 100 nm inclusive from the top surface of the protective insulating film 118 or the side surface of the opening. Note that the region 119 may be provided so as to extend from the top surface of the protective insulating film 118 to the bottom surface thereof. The region 119 may also be provided in a region of the gate insulating film 112 that does not overlap with the gate electrode 104.

In the case where the transistor includes the region 103, excess oxygen contained in the insulating film 102 can be efficiently utilized to reduce oxygen vacancies in the oxide semiconductor film 106. In the case where the transistor does not include the region 103, excess oxygen contained in the insulating film 102 might be used to oxidize the source electrode 116a, the drain electrode 116b, the wiring 126a, and the wiring 126b, for example. Alternatively, excess oxygen contained in the insulating film 102 might be diffused outward to be lost.

Also in the case where the transistor includes the region 113, excess oxygen contained in the insulating film 102 or the gate insulating film 112 can be efficiently utilized to reduce the oxygen vacancies in the oxide semiconductor film 106. In the case where the transistor does not include the region 113, excess oxygen contained in the insulating film 102 or the gate insulating film 112 might be used to oxidize the source electrode 116a, the drain electrode 116b, the wiring 126a, and the wiring 126b. Alternatively, in the case where the transistor does not include the region 113, excess oxygen contained in the insulating film 102 or the gate insulating film 112 might be diffused outward to be lost. The region 113 may be the entire region of the gate insulating film 112. Note that it may be preferable that the region 113 not overlap with a channel formation region, in which case degradation due to the region 113 in the gate insulating film 112 is not likely to occur.

Also in the case where the transistor includes the region 119, excess oxygen contained in the insulating film 102, the gate insulating film 112, or the protective insulating film 118 can be efficiently utilized to reduce oxygen vacancies in the oxide semiconductor film 106. In the case where the transistor does not include the region 119, excess oxygen contained in the insulating film 102, the gate insulating film 112, or the protective insulating film 118 might be used to oxidize the source electrode 116a, the drain electrode 116b, the wiring 126a, and the wiring 126b. Alternatively, in the case where the transistor does not include the region 119, excess oxygen contained in the insulating film 102, the gate insulating film 112, or the protective insulating film 118 might be diffused outward to be lost. In particular, the region 119 is preferably provided as illustrated in FIG. 3B2, in which case the wirings 126a and 126b are not easily oxidized and thus the wiring resistance is less likely to be increased.

In the top view of FIG. 3A, the distance between the source electrode 116a and the drain electrode 116b in a region of the oxide semiconductor film 106 that overlaps with the gate electrode 104 is called a channel length. The length of the oxide semiconductor film 106 in the direction perpendicular to a channel length direction is called a channel width. Note that a channel formation region refers to a region of the oxide semiconductor film 106 that overlaps with the gate electrode 104 and is located between the source electrode 116a and the drain electrode 116b. Further, a channel refers to a region of the oxide semiconductor film 106 through which a current mainly flows.

Note that as illustrated in FIG. 3A, the gate electrode 104 is provided so that the edge of the oxide semiconductor film 106 is located on the inner side than the edge of the gate electrode 104 in the top view. This can suppress generation of carriers in the oxide semiconductor film 106 due to incident light from the gate electrode 104 side. In other words, the gate electrode 104 functions as a light-blocking film. Note that the oxide semiconductor film 106 may be provided so as to extend to the outside of the gate electrode 104.

The oxide semiconductor film 106 will be described below.

The oxide semiconductor film 106 is an oxide containing indium. An oxide can have a high carrier mobility (electron mobility) by containing indium, for example. The oxide semiconductor film 106 preferably contains an element M. The element M is aluminum, gallium, yttrium, or tin, for example. The element M is an element having a high bonding energy with oxygen, for example. The element M is an element that can increase the energy gap of the oxide, for example. Further, the oxide semiconductor film 106 preferably contains zinc. An oxide containing zinc is easily crystallized, for example. The energy at the top of the valence band of an oxide can be controlled with the atomic ratio of zinc.

Note that the oxide semiconductor film 106 is not limited to the oxide containing indium. The oxide semiconductor film 106 may be, for example, a Zn—Sn oxide or a Ga—Sn oxide.

A first oxide semiconductor film and a second oxide semiconductor film may be provided over and under the channel formation region in the oxide semiconductor film 106. Note that the second oxide semiconductor film is provided between the oxide semiconductor film 106 and the gate insulating film 112.

The first oxide semiconductor film contains one or more elements that are not oxygen and are contained in the oxide semiconductor film 106. Since the first oxide semiconductor film contains one or more elements that are not oxygen and are contained in the oxide semiconductor film 106, an interface state is unlikely to be formed at the interface between the oxide semiconductor film 106 and the first oxide semiconductor film.

The second oxide semiconductor film contains one or more elements that are not oxygen and are contained in the oxide semiconductor film 106. Since the second oxide semiconductor film contains one or more elements that are not oxygen and are contained in the oxide semiconductor film 106, an interface state is unlikely to be formed at the interface between the oxide semiconductor film 106 and the second oxide semiconductor film.

In the case of using an In-M-Zn oxide as the first oxide semiconductor film, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. In the case of using an In-M-Zn oxide as the oxide semiconductor film 106, when summation of In and M is assumed to be 100 atomic %, the proportions of In and M are preferably set to greater than or equal to 25 atomic % and less than 75 atomic %, respectively, and more preferably greater than or equal to 34 atomic % and less than 66 atomic %, respectively. In the case of using an In-M-Zn oxide as the second oxide semiconductor film, when summation of In and M is assumed to be 100 atomic %, the proportions of In and M are preferably set to less than 50 atomic % and greater than or equal to 50 atomic %, respectively, and more preferably less than 25 atomic % and greater than or equal to 75 atomic %, respectively. Note that the second oxide semiconductor film may be formed using the same kind of oxide as that of the first oxide semiconductor film.

Here, in some cases, there is a mixed region of the first oxide semiconductor film and the oxide semiconductor film 106 between the first oxide semiconductor film and the oxide semiconductor film 106. Further, in some cases, there is a mixed region of the oxide semiconductor film 106 and the second oxide semiconductor film between the oxide semiconductor film 106 and the second oxide semiconductor film. The mixed region has a low density of interface states. For that reason, the stack including the first oxide semiconductor film, the oxide semiconductor film 106, and the second oxide semiconductor film has a band structure where energy at each interface is changed continuously (continuous junction).

As the oxide semiconductor film 106, an oxide with a wide energy gap is used. For example, the energy gap of the oxide semiconductor film 106 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

As the first oxide semiconductor film, an oxide with a wide energy gap is used. For example, the energy gap of the first oxide semiconductor film is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

As the second oxide semiconductor film, an oxide with a wide energy gap is used. The energy gap of the second oxide semiconductor film is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that the first oxide semiconductor film and the second oxide semiconductor film have wider energy gaps than the oxide semiconductor film 106.

As the oxide semiconductor film 106, an oxide having an electron affinity higher than that of the first oxide semiconductor film is used. For example, as the oxide semiconductor film 106, an oxide having an electron affinity higher than that of the first oxide semiconductor film by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity refers to an energy gap between the vacuum level and the bottom of the conduction band.

Further, as the oxide semiconductor film 106, an oxide having an electron affinity higher than that of the second oxide semiconductor film is used. For example, as the oxide semiconductor film 106, an oxide having an electron affinity higher than that of the second oxide semiconductor film by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.5 eV is used.

In that case, when an electric field is applied to the gate electrode 104, a channel is formed in the oxide semiconductor film 106 having an electron affinity higher than those of the first oxide semiconductor film and the second oxide semiconductor film.

To increase the on-state current of the transistor, the thickness of the second oxide semiconductor film is preferably as small as possible. The thickness of the second oxide semiconductor film is set to less than 10 nm, preferably less than or equal to 5 nm, more preferably less than or equal to 3 nm, for example. Meanwhile, the second oxide semiconductor film has a function of blocking elements other than oxygen (such as silicon) contained in the gate insulating film 112 from entering the oxide semiconductor film 106 where a channel is formed. For this reason, the second oxide semiconductor film preferably has a certain degree of thickness. The thickness of the second oxide semiconductor film is set to greater than 0.3 nm, preferably greater than or equal to 1 nm, more preferably greater than or equal to 2 nm, for example.

To increase reliability, the first oxide semiconductor film is preferably formed thick and the second oxide semiconductor film is preferably formed thin. Specifically, the thickness of the first oxide semiconductor film is greater than or equal to 20 nm, preferably greater than or equal to 30 nm, more preferably greater than or equal to 40 nm, still more preferably greater than or equal to 60 nm. In that case, the distance from the interface between the insulating film 102 and the first oxide semiconductor film to the oxide semiconductor film 106 where the channel is formed can be greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the first oxide semiconductor film is less than or equal to 200 nm, preferably less than or equal to 120 nm, more preferably less than or equal to 80 nm. The thickness of the oxide semiconductor film 106 is greater than or equal to 3 nm and less than or equal to 100 nm, preferably greater than or equal to 3 nm and less than or equal to 80 nm, more preferably greater than or equal to 3 nm and less than or equal to 50 nm.

For example, the first oxide semiconductor film may be thicker than the oxide semiconductor film 106, and the oxide semiconductor film 106 may be thicker than the second oxide semiconductor film.

The influence of impurities in the oxide semiconductor film 106 will be described below. In order that the transistor have stable electrical characteristics, it is effective to reduce the concentration of impurities in the oxide semiconductor film 106 so that the oxide semiconductor film 106 has a lower carrier density and is highly purified. The carrier density of the oxide semiconductor film 106 is set to lower than $1\times10^{17}/cm^3$, lower than $1\times10^{15}/cm^3$, or lower than $1\times10^{13}/cm^3$. In order to reduce the concentration of impurities in the oxide semiconductor film 106, the concentration of impurities in a film that is adjacent to the oxide semiconductor film 106 is also preferably reduced.

Silicon contained in the oxide semiconductor film 106 might serve as a carrier trap or a carrier generation source. The concentration of silicon in a region between the oxide semiconductor film 106 and the first oxide semiconductor film, which is measured by secondary ion mass spectrometry (SIMS), is preferably lower than $1\times10^{19}$ atoms/cm$^3$, more preferably lower than $5\times10^{18}$ atoms/cm$^3$, still more preferably lower than $2\times10^{18}$ atoms/cm$^3$. The concentration of silicon in a region between the oxide semiconductor film 106 and the second oxide semiconductor film, which is measured by SIMS, is lower than $1\times10^{19}$ atoms/cm$^3$, preferably lower than $5\times10^{18}$ atoms/cm$^3$, more preferably lower than $2\times10^{18}$ atoms/cm$^3$.

When hydrogen is contained in an oxide semiconductor film 106, carrier density might be increased. The concentration of hydrogen in the oxide semiconductor film 106 measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. When nitrogen is contained in an oxide semiconductor film 106, carrier density might be increased. The concentration of nitrogen in the oxide semiconductor film 106 measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentration of hydrogen in the first oxide semiconductor film in order to reduce the concentration of hydrogen in the oxide semiconductor film 106. The concentration of hydrogen in the first oxide semiconductor film measured by SIMS can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Further, it is preferable to reduce the concentration of nitrogen in the first oxide semiconductor film in order to reduce the concentration of nitrogen in the oxide semiconductor film 106. The concentration of nitrogen in the first oxide semiconductor film measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is also preferable to reduce the concentration of hydrogen in the second oxide semiconductor film in order to reduce the concentration of hydrogen in the oxide semiconductor film 106. The concentration of hydrogen in the second oxide semiconductor film measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is also preferable to reduce the concentration of nitrogen in the second oxide semiconductor film in order to reduce the concentration of nitrogen in the oxide semiconductor film 106. The concentration of nitrogen in the second oxide semiconductor film measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Here, a structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in the direction substantially perpendicular to the sample surface (plane TEM image), metal atoms are arranged in a triangular or hexagonal configuration in the crystal parts. However, there is no regularity of arrangement of metal atoms between different crystal parts.

From the results of the cross-sectional TEM image and the plane TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plane TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

In this specification, the trigonal and rhombohedral crystal systems are included in the hexagonal crystal system.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of the formation surface or a normal vector of the top surface of the CAAC-OS film. Thus, for example, in the case where a shape of the CAAC-OS film is changed by etching or the like, the c-axis of the crystal might not be necessarily parallel to a normal vector of the formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electrical charge trapped by the carrier traps in the oxide semiconductor film takes a long time to be released, and might behave like fixed electrical charge. Thus, a transistor including an oxide semiconductor film having a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film will be described.

In an image obtained with TEM, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo-like pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than the amorphous oxide semiconductor film; thus, the nc-OS film has a lower density of defect levels than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stack including two or more films of an amorphous oxide semiconductor film, a microcrystalline oxide semiconductor film, and a CAAC-OS film.

The insulating film 102 illustrated in FIGS. 3A to 3C is formed of, for example, a single layer or a stack of an insulating film containing silicon oxide or silicon oxynitride. Further, as the insulating film 102, an insulating film containing excess oxygen is preferably used. The thickness of the insulating film 102 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

The insulating film 102 may be a stack including a silicon nitride film as a first layer and a silicon oxide film as a second layer. A silicon oxynitride film may be used instead of the silicon oxide film. A silicon nitride oxide film may be used instead of the silicon nitride film. As the silicon oxide film, a silicon oxide film having a small defect density is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride film, a silicon nitride film that is less likely to release hydrogen and ammonia gases is used. The amount of released hydrogen and ammonia gases can be measured by TDS. Further, as the silicon nitride film, a silicon nitride film through which hydrogen, water, and oxygen do not permeate or hardly permeate is used.

Alternatively, the insulating film 102 may be a stack including a silicon nitride film as a first layer, a first silicon oxide film as a second layer, and a second silicon oxide film as a third layer. In that case, the first silicon oxide film and/or the second silicon oxide film may be a silicon oxynitride film. A silicon nitride oxide film may be used instead of the silicon nitride film. As the first silicon oxide film, a silicon oxide film having a small defect density is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide film, a silicon oxide film containing excess oxygen is used. As the silicon nitride film, a silicon nitride film that is less likely to release hydrogen and ammonia gases is used. Further, as the silicon nitride film, a silicon nitride film through which hydrogen, water, and oxygen do not permeate or hardly permeate is used.

The source electrode 116a and the drain electrode 116b may be formed using a single layer or a stack of a conductive film containing aluminum, titanium, chromium, cobalt, nickel, copper, yttrium, zirconium, molybdenum, ruthenium, silver, tantalum, or tungsten.

The gate insulating film 112 may be formed of a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. As the gate insulating film 112, an insulating film containing excess oxygen is preferably used. The thickness (equivalent oxide thickness) of the gate insulating film 112 is, for example, greater than or equal to 1 nm and less than or equal to 500 nm, preferably greater than or equal to 3 nm and less than or equal to 300 nm, more preferably greater than or equal to 5 nm and less than or equal to 100 nm, still more preferably greater than or equal to 5 nm and less than or equal to 50 nm.

The insulating film 112 may be a stack including a silicon nitride film as a first layer and a silicon oxide film as a second layer. A silicon oxynitride film may be used instead of the silicon oxide film. A silicon nitride oxide film may be used instead of the silicon nitride film. As the silicon oxide film, a silicon oxide film having a small defect density is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide film, a silicon oxide film containing excess oxygen is preferably used. As the silicon nitride film, a silicon nitride film that is less likely to release hydrogen and ammonia gases is used. The amount of released hydrogen and ammonia gases can be measured by TDS.

The gate electrode 104 may be formed of a single layer or a stack of a conductive film containing aluminum, titanium, chromium, cobalt, nickel, copper, yttrium, zirconium, molybdenum, ruthenium, silver, tantalum, or tungsten.

The protective insulating film 118 is formed of a single layer or a stack of an insulating film containing silicon oxide, silicon oxynitride, germanium oxide, yttrium oxide, zirconium oxide, lanthanum oxide, neodymium oxide, hafnium oxide, or tantalum oxide. Further, as the protective insulating film 118, an insulating film containing excess oxygen is preferably used. The use of an insulating film that blocks oxygen as the protective insulating film 118 may preclude the necessity of the region 119. The thickness of the protective insulating film 118 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

The wirings 126a and 126b may be formed using, for example, a single layer or a stack of a conductive film containing aluminum, titanium, chromium, cobalt, nickel, copper, yttrium, zirconium, molybdenum, ruthenium, silver, tantalum, or tungsten.

There is no significant limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate of silicon, silicon carbide, or the like, a compound semiconductor substrate of silicon germanium or the like, a silicon-on-insulator (SOI) substrate, or the like may be used as the substrate 100. Still alternatively, any of these substrates provided with a semiconductor element may be used as the substrate 100.

A flexible substrate may be used as the substrate 100. As a method for providing a transistor over a flexible substrate, there is a method in which a transistor is formed over a non-flexible substrate, and then the transistor is separated and transferred to the substrate 100 that is a flexible substrate. In that case, a separation layer is preferably provided between the non-flexible substrate and the transistor.

<Fabricating Method of Transistor Structure 1>

An example of a method for fabricating a transistor structure 1 will be described below.

FIGS. 4A1 to 4C2, FIGS. 5A1 to 5C2, FIGS. 6A1 to 6C2, FIGS. 7A1 to 7C2, and FIGS. 8A1 to 8C2 are cross-sectional views corresponding to those in FIGS. 3B1, 3B2, and 3C.

First, the substrate 100 is prepared.

Next, the insulating film 102 is formed. The insulating film 102 can be formed using an insulating film selected from the insulating films given as examples of the insulating film 102, by a sputtering method, a chemical vapor deposition (CVD) method, a molecular beam epitaxy (MBE) method, an atomic layer deposition (ALD) method, or a pulsed laser deposition (PLD) method.

In the case where a silicon wafer is used as the substrate 100, the insulating film 102 may be formed by a thermal oxidation method.

Then, in order to planarize the surface of the insulating film 102, chemical mechanical polishing (CMP) treatment may be performed. By CMP treatment, the insulating film 102 has an average surface roughness ($R_a$) of less than 1 nm, preferably less than or equal to 0.3 nm, more preferably less than or equal to 0.1 nm. In some cases, $R_a$ that is less than or equal to 1 nm can increase the crystallinity of the oxide semiconductor film 106. $R_a$ can be measured using an atomic force microscope (AFM).

Then, oxygen ions may be added into the insulating film 102 so that an insulating film containing excess oxygen can be formed. The addition of oxygen ions may be performed by an ion implantation method at an acceleration voltage of higher than or equal to 2 kV and lower than or equal to 100 kV and at a dose of greater than or equal to $5 \times 10^{14}$ ions/cm$^2$ and less than or equal to $5 \times 10^{16}$ ions/cm$^2$, for example.

Then, an oxide semiconductor film 136 is formed (see FIGS. 4A1 and 4A2). The oxide semiconductor film 136 can be formed using an oxide semiconductor film selected from the oxide semiconductor films given as examples of the oxide semiconductor film 106, by a sputtering method, a CVD method, a MBE method, an ALD method, or a PLD method.

Next, a layer to be a resist mask 120 is formed over the oxide semiconductor film 136. Note that when the oxide semiconductor film 136 is finely processed so that the length of one side thereof is 100 nm or less, a hard mask may be provided between the oxide semiconductor film 136 and the layer to be a resist mask 120.

Note that the hard mask is a mask layer to etch the oxide semiconductor film 136 selectively. The hard mask may be formed of a single layer or a stack of a simple substance selected from tungsten, molybdenum, titanium, and tantalum; a nitride containing any of the above substances; or an alloy containing any of the above substances. Alternatively, the hard mask may be formed of a single layer or a stack of an insulating layer containing silicon oxide, silicon oxinitride, or silicon nitride.

Note that one embodiment of the present invention is not limited to the case where a layer to be the resist mask 120 is formed over and in contact with the hard mask. For example, a coat layer or the like may be formed using an organic substance over the hard mask in order to increase the adhesion between the hard mask and the layer to be the resist mask 120.

The layer to be the resist mask 120 can be formed using a photosensitive organic or inorganic layer by a spin coating method or the like.

Next, the layer to be the resist mask 120 is irradiated with light through a photomask. Examples of the light include KrF excimer laser light, ArF excimer laser light, and extreme ultraviolet (EUV) light. Immersion lithography, in which a space between a substrate and a projection lens is filled with liquid (e.g., water) and light exposure is performed, may be employed. The layer to be the resist mask 120 may be irradiated with an electron beam or an ion beam instead of the above light. Note that when an electron beam or an ion beam is used, a photomask is unnecessary. In the case where fine processing is not particularly required, the layer to be the resist mask 120 may be irradiated with a g-line, an i-line, or the like of a high pressure mercury lamp.

Then, the substrate 100 is immersed in a developer to remove/leave a region of the layer to be the resist mask 120 that has been exposed to light, so that the resist mask 120 is formed (see FIGS. 4B1 and 4B2).

After that, the oxide semiconductor film 136 is partly etched using the resist mask 120 to form the island-shaped oxide semiconductor film 106 (see FIGS. 4C1 and 4C2).

Dry etching treatment is preferably employed as a method for etching part of the oxide semiconductor film 136. The dry etching treatment can be performed in an atmosphere containing methane and a rare gas, for example.

Next, an impurity is added to the insulating film 102, whereby the region 103 is formed (see FIGS. 5A1 and 5A2). The description of the method of forming the region 53 by adding an impurity to the insulating film 52 can be referred to for a method of forming the region 103 by adding an impurity to the insulating film 102. Note that in the case where the region 113 or the region 119 is formed in a later step, the region 103 is not necessarily formed.

Then, the resist mask 120 is removed by plasma treatment, chemical treatment, or the like. Plasma ashing is preferably employed to remove the resist mask 120. Note that in the case of using a method described later, an impurity may be added to the insulating film 102 and the oxide semiconductor film 106 after the resist mask 120 is removed.

Next, first heat treatment is preferably performed. The first heat treatment may be performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables excess oxygen to transfer from the insulating film 102 to the oxide semiconductor film 106. This can reduce oxygen vacancies in the oxide semiconductor film 106. Further, the crystallinity of the oxide semiconductor film 106 can be improved, and impurities such as hydrogen and water can be removed.

Then, a conductive film to be the source electrode 116a and the drain electrode 116b is formed. The conductive film can be selected from the conductive films given as examples of a conductive film that can be used for the source electrode 116a and the drain electrode 116b. The conductive film can be formed by a sputtering method, a CVD method, an MBE method, an ALD method, or a PLD method.

Then, the conductive film is processed by a photolithography method or the like to form the source electrode 116a and the drain electrode 116b (see FIGS. 5B1 and 5B2). At this time, the vicinity of the top surface of the oxide semiconductor film 106 may be etched. For example, in the case where an impurity is added to the insulating film 102 to form the region 103 after the resist mask 120 is removed, the impurity is also added to the channel formation region. In that case, in forming the source electrode 116a and the drain electrode 116b, the region of the channel formation region to which the impurity has been added is preferably removed.

Next, the gate insulating film 112 is formed (see FIGS. 5C1 and 5C2). The gate insulating film 112 can be formed using an insulating film selected from the insulating films given as examples of the gate insulating film 112, by a sputtering method, a CVD method, an MBE method, an ALD method, or a PLD method.

Then, a conductive film to be the gate electrode 104 is formed. The conductive film can be selected from the conductive films given as examples of a conductive film that can be used for the gate electrode 104. The conductive film can be formed by a sputtering method, a CVD method, an MBE method, an ALD method, or a PLD method.

Then, the conductive film is processed by a photolithography method or the like to form the gate electrode 104 (see FIGS. 6A1 and 6A2).

Next, an impurity is added to the gate insulating film 112 and the insulating film 102, whereby the region 113 is formed (see FIGS. 6B1 and 6B2). The description of the method of forming the region 53 by adding an impurity to the insulating film 52 can be referred to for a method of forming the region 113 by adding an impurity to the gate insulating film 112 and the insulating film 102. Note that in the case where the region 103 is formed or the region 119 is formed in a later step, the region 113 is not necessarily formed.

Next, the protective insulating film 118 is formed (see FIGS. 6C1 and 6C2). The protective insulating film 118 can be formed using an insulating film selected from the insulating films given as examples of the protective insulating film 118, by a sputtering method, a CVD method, an MBE method, an ALD method, or a PLD method.

Then, an impurity is added to the protective insulating film 118, whereby the region 119 is formed (see FIGS. 7A1 and 7A2). The description of the method of forming the region 53 by adding an impurity to the insulating film 52 can be referred to for a method of forming the region 119 by adding an impurity to the protective insulating film 118. Note that in the case where the region 103 or the region 113 is formed, the region 119 is not necessarily formed.

Then, second heat treatment is preferably performed. The second heat treatment may be performed under any of the conditions listed for the first heat treatment or may be performed at a temperature lower than the temperature for the first heat treatment. The second heat treatment can also serve as the first heat treatment.

Next, openings are formed in the protective insulating film 118 and the gate insulating film 112 to partly expose the source electrode 116a and the drain electrode 116b (see FIGS. 7B1 and 7B2).

Next, a conductive film to be the wirings 126a and 126b is formed. The conductive film can be selected from the conductive films given as examples of a conductive film that can be used for the wirings 126a and 126b. The conductive film can be formed by a sputtering method, a CVD method, an MBE method, an ALD method, or a PLD method.

Then, the conductive film is processed by a photolithography method or the like to form the wirings 126a and 126b (see FIGS. 7C1 and 7C2).

Through the above steps, the transistor illustrated in FIG. 3B1 can be fabricated.

When the transistor illustrated in FIG. 3B2 is fabricated, steps illustrated in FIGS. 8A1 to 8C2 are performed instead of the steps illustrated in FIGS. 7A1 to 7C2. The steps up to the step illustrated in FIGS. 6C1 and 6C2 are the same between the transistors in FIGS. 3B1 and 3B2.

First, openings are formed in the protective insulating film 118 and the gate insulating film 112 to partly expose the source electrode 116a and the drain electrode 116b (see FIGS. 8A1 and 8A2).

Then, an impurity is added to the protective insulating film 118, whereby the region 119 is formed. At this time, the impurity is also added to the vicinity of side surfaces of the openings and thus the region 119 is also formed in the vicinity of the side surfaces of the openings (see FIGS. 8B1 and 8B2). The description of the method of forming the region 53 by adding an impurity to the insulating film 52 can be referred to for a method of forming the region 119 by adding an impurity to the protective insulating film 118.

Then, third heat treatment is preferably performed.

Next, a conductive film to be the wirings 126a and 126b is formed. The conductive film can be selected from the conductive films given as examples of a conductive film that can be used for the wirings 126a and 126b. The conductive film can be formed by a sputtering method, a CVD method, an MBE method, an ALD method, or a PLD method.

Then, the conductive film is processed by a photolithography method or the like to form the wirings 126a and 126b (see FIGS. 8C1 and 8C2).

Through the above steps, the transistor illustrated in FIG. 3B2 can be fabricated.

<Transistor Structure 2>

Next, the structure of a top-gate top-contact transistor different from the transistor structure 1 in the shape of a gate insulating film will be described as an example.

FIGS. 9A to 9C are a top view and cross-sectional views of the transistor. FIG. 9A is the top view of the transistor. FIGS. 9B1 and 9B2 are the cross-sectional views taken along dashed-dotted line B1-B2 in FIG. 9A. FIG. 9C is the cross-sectional view taken along dashed-dotted line B3-B4 in FIG. 9A.

The transistor in FIGS. 9B1 and 9B2 includes a base insulating film 202 over a substrate 200; the oxide semiconductor film 206 over the base insulating film 202; a source electrode 216a and a drain electrode 216b over the oxide semiconductor film 206; a gate insulating film 212 over the oxide semiconductor film 206, the source electrode 216a, and the drain electrode 216b; and a gate electrode 204 over the gate insulating film 212. The gate insulating film 212 is positioned in a region overlapping with the gate electrode 204. The transistor preferably further includes the protective insulating film 218 over the source electrode 216a, the drain electrode 216b, the gate insulating film 212, and the gate electrode 204; and a wiring 226a and a wiring 226b over the protective insulating film 218. Further, the protective insulating film 218 has openings reaching the source electrode 216a and the drain electrode 216b, respectively. The wiring 226a and the wiring 226b are in contact with the source electrode 216a and the drain electrode 216b through the openings, respectively. Note that the transistor does not necessarily include the base insulating film 202.

The transistor illustrated in FIGS. 9A to 9C is different from the transistor illustrated in FIGS. 3A to 3C only in the shape of the gate insulating film; thus, the description about FIGS. 3A to 3C is referred to unless otherwise noted.

For example, the description of the substrate 100 can be referred to for the substrate 200. The description of the insulating film 102 can be referred to for the base insulating film 202. The description of the oxide semiconductor film 106 can be referred to for the oxide semiconductor film 206. The description of the source electrode 116a and the drain electrode 116b can be referred to for the source electrode 216a and the drain electrode 216b. The description of the gate insulating film 112 can be referred to for the gate insulating film 212. The description of the gate electrode 104 can be referred to for the gate electrode 204. The description of the protective insulating film 118 can be referred to for the protective insulating film 218. The description of the wirings 126a and 126b can be referred to for the wirings 226a and 226b.

The transistor in FIGS. 9B1 and 9B2 includes one or more of the following: a region 203, a region 213, and a region 219 serving as oxygen blocking regions. The descriptions of the regions 103, 113, and 119 can be referred to for the regions 203, 213, and 219.

The region 203 is a region of the base insulating film 202 that is in contact with the source electrode 216a, the drain electrode 216b, and the protective insulating film 218. The region 203 is provided to a depth of 1 nm to 200 nm inclusive, preferably 5 nm to 150 nm inclusive, more preferably 10 nm to 100 nm inclusive from the top surface of the base insulating film 202. Note that the region 203 may be provided so as to extend from the top surface of the base insulating film 202 to the bottom surface thereof. The region 203 may also be provided in the substrate 200.

The region 213 is a region of the gate insulating film 212 that is in contact with the protective insulating film 218. The region 213 is provided to a depth of 1 nm to 200 nm inclusive, preferably 5 nm to 150 nm inclusive, more preferably 10 nm to 100 nm inclusive from a side surface of the gate insulating film 212. The region 213 may also be provided in a region of the base insulating film 202 that does not overlap with the gate electrode 204, the source electrode 216a, or the drain electrode 216b.

The region 219 is a region provided in an upper portion of the protective insulating film 218 as illustrated in FIG. 9B1. Alternatively, the region 219 is a region provided in an upper portion of the protective insulating film 218 and side portions of the openings as illustrated in FIG. 9B2. The region 219 is provided to a depth of 1 nm to 200 nm inclusive, preferably 5 nm to 150 nm inclusive, more preferably 10 nm to 100 nm inclusive from the top surface of the protective insulating film 218 or the side surface of the opening. Note that the region 219 may be provided so as to extend from the top surface of the protective insulating film 218 to the bottom surface thereof. The region 219 may also be provided in a region of the gate insulating film 212 that does not overlap with the gate electrode 204 or a region of the base insulating film 202 that does not overlap with the gate electrode 204, the source electrode 216a, or the drain electrode 216b.

In the case where the transistor includes the region 203, excess oxygen contained in the base insulating film 202 can be efficiently utilized to reduce oxygen vacancies in the oxide semiconductor film 206. In the case where the transistor does not include the region 203, excess oxygen contained in the base insulating film 202 might be used to oxidize the source electrode 216a, the drain electrode 216b, the wiring 226a, and the wiring 226b, for example. Alternatively, excess oxygen contained in the base insulating film 202 might be diffused outward to be lost.

Also in the case where the transistor includes the region 213, excess oxygen contained in the gate insulating film 212 can be efficiently utilized to reduce the oxygen vacancies in the oxide semiconductor film 206. In the case where the transistor does not include the region 213, excess oxygen contained in the gate insulating film 212 might be used to oxidize the source electrode 216a, the drain electrode 216b, the wiring 226a, and the wiring 226b, for example. Alternatively, in the case where the transistor does not include the region 213, excess oxygen contained in the gate insulating film 212 might be diffused outward to be lost. Note that the region 213 may be the entire region of the gate insulating film 212. Note that it may be preferable that the region 213 not overlap with a channel formation region, in which case degradation due to the region 213 in the gate insulating film 212 is not likely to occur.

Also in the case where the transistor includes the region 219, excess oxygen contained in the base insulating film 202, the gate insulating film 212, and the protective insulating film 218 can be efficiently utilized to reduce the oxygen vacancies in the oxide semiconductor film 206. In the case where the transistor does not include the region 219, excess oxygen contained in the base insulating film 202, the gate insulating film 212, and the protective insulating film 218 might be used to oxidize the source electrode 216a, the drain electrode 216b, the wiring 226a, and the wiring 226b, for example. Alternatively, in the case where the transistor does not include the region 219, excess oxygen contained in the base insulating film 202, the gate insulating film 212, and the protective insulating film 218 might be diffused outward to be lost. In particular, the region 219 is preferably provided as illustrated in FIG. 9B2, in which case the wirings 226a and 226b are not easily oxidized and thus the wiring resistance is less likely to be increased.

Note that as illustrated in FIG. 9A, the gate electrode 204 is provided so that the edge of the oxide semiconductor film 206 is located on the inner side than the edge of the gate electrode 204 in the top view. This can suppress generation of carriers in the oxide semiconductor film 206 due to incident light from the gate electrode 204 side. In other words, the gate electrode 204 functions as a light-blocking film. Note that the oxide semiconductor film 206 may be provided so as to extend to the outside of the gate electrode 204.

<Fabricating Method of Transistor Structure 2>

An example of a method for fabricating a transistor structure 2 will be described below.

FIGS. 10A1 to 10C2, FIGS. 11A1 to 11C2, FIGS. 12A1 to 12C2, FIGS. 13A1 to 13C2, and FIGS. 14A1 to 14C2 are cross-sectional views corresponding to FIGS. 9B1 (9B2) and 9C.

First, the substrate 200 is prepared.

Then, the base insulating film 202 is formed. The description of the method for forming the insulating film 102 can be referred to for the base insulating film 202.

Then, CMP treatment may be performed to planarize the surface of the base insulating film 202. By CMP treatment, the base insulating film 202 has an average surface roughness (Ra) of less than 1 nm, preferably less than or equal to 0.3 nm, more preferably less than or equal to 0.1 nm.

Then, oxygen may be added to the base insulating film 202 so that an insulating film containing excess oxygen can be formed. The addition of oxygen may be performed by an ion implantation method at an acceleration voltage of higher than or equal to 2 kV and lower than or equal to 100 kV and at a dose of greater than or equal to $5 \times 10^{14}$ ions/cm$^2$ and less than or equal to $5 \times 10^{16}$ ions/cm$^2$, for example.

Then, an oxide semiconductor film 236 is formed (see FIGS. 10A1 and 10A2). The description of the method for forming the oxide semiconductor film 236 can be referred to for the oxide semiconductor film 236.

Next, a layer to be a resist mask 220 is formed over the oxide semiconductor film 236. The description of the method for forming the layer to be the resist mask 120 can be referred to for the layer to be the resist mask 220.

Then, the layer to be the resist mask 220 is processed by a photolithography method or the like to form the resist mask 220 (see FIGS. 10B1 and 10B2).

After that, the oxide semiconductor film 236 is partly etched using the resist mask 220 to form the island-shaped oxide semiconductor film 206 (see FIGS. 10C1 and 10C2).

Next, an impurity is added to the base insulating film 202, whereby the region 203 is formed (see FIGS. 11A1 and 11A2). The description of the method of forming the region 53 by adding an impurity to the insulating film 52 can be referred to for a method of forming the region 203 by adding an impurity to the base insulating film 202. Note that in the case where the region 213 or the region 219 is formed in a later step, the region 203 is not necessarily formed.

Then, the resist mask 220 is removed by plasma treatment, chemical treatment, or the like. Plasma ashing is preferably employed to remove the resist mask 220. Note that in the case of using a method described later, an impurity may be added to the base insulating film 202 and the oxide semiconductor film 206 after the resist mask 220 is removed.

Next, first heat treatment is preferably performed. For the first heat treatment, the description of the first heat treatment for the transistor structure 1 can be referred to.

Next, the source electrode 216a and the drain electrode 216b are formed (see FIGS. 11B1 and 11B2). The description of the method for forming the source electrode 116a and the drain electrode 116b can be referred to for the method for forming the source electrode 216a and the drain electrode 216b.

Then, an insulating film 242 is formed (see FIGS. 11C1 and 11C2). The description of the method for forming the insulating film 112 can be referred to for the insulating film 242.

Then, the gate electrode 204 is formed. The description of the method for forming the gate electrode 104 can be referred to for a method for forming the gate electrode 204.

Next, the insulating film 242 is etched using the gate electrode 204 as a mask to form the gate insulating film 212 (see FIGS. 12A1 and 12A2). Although the case is described here in which the insulating film 242 is etched using the gate electrode 204 as a mask, one embodiment of the present invention is not limited to this method. For example, the insulating film 242 may be etched using the resist mask used to form the gate electrode 204 by etching.

Next, an impurity is added to the gate insulating film 212 and the base insulating film 202, whereby the region 213 is formed (see FIGS. 12B1 and 12B2). The description of the method of forming the region 53 by adding an impurity to the insulating film 52 can be referred to for a method of forming the region 213 by adding an impurity to the gate insulating film 212 and the base insulating film 202. Note that in the case where the region 203 is formed or the region 219 is formed in a later step, the region 213 is not necessarily formed.

Then, the protective insulating film 218 is formed (see FIGS. 12C1 and 12C2). The description of the method for forming the protective insulating film 118 can be referred to for the protective insulating film 218.

Then, an impurity is added to the protective insulating film 218, whereby the region 219 is formed (see FIGS. 13A1 and 13A2). The description of the method of forming the region 53 by adding an impurity to the insulating film 52 can be referred to for a method of forming the region 219 by adding an impurity to the protective insulating film 218. Note that in the case where the region 203 or the region 213 is formed, the region 219 is not necessarily formed.

Then, second heat treatment is preferably performed. The second heat treatment may be performed under any of the conditions listed for the first heat treatment or may be performed at a temperature lower than the temperature for the first heat treatment. The second heat treatment can also serve as the first heat treatment.

Next, openings are formed in the protective insulating film 218 to partly expose the source electrode 216a and the drain electrode 216b (see FIGS. 13B1 and 13B2).

Then, the wirings 226a and 226b are formed (see FIGS. 13C1 and 13C2). The description of the method for forming the wirings 126a and 126b can be referred to for the wirings 226a and 226b.

Through the above steps, the transistor illustrated in FIG. 9B1 can be fabricated.

When the transistor illustrated in FIG. 9B2 is fabricated, steps illustrated in FIGS. 14A1 to 14C2 are performed instead of the steps illustrated in FIGS. 13A1 to 13C2. The steps up to the step illustrated in FIGS. 12C1 and 12C2 are the same between the transistors in FIGS. 9B1 and 9B2.

First, openings are formed in the protective insulating film 218 to partly expose the source electrode 216a and the drain electrode 216b (see FIGS. 14A1 and 14A2).

Then, an impurity is added to the protective insulating film 218, whereby the region 219 is formed. At this time, the impurity is also added to the vicinity of side surfaces of the openings and thus the region 219 is also formed in the vicinity of the side surfaces of the openings (see FIGS. 14B1 and 14B2). The description of the method of forming the region 53 by adding an impurity to the insulating film 52 can be referred to for a method of forming the region 219 by adding an impurity to the protective insulating film 218.

Then, third heat treatment is preferably performed.

Then, the wirings 226a and 226b are formed (see FIGS. 14C1 and 14C2). The description of the method for forming the wirings 126a and 126b can be referred to for the wirings 226a and 226b.

Through the above steps, the transistor illustrated in FIG. 9B2 can be fabricated.

<Transistor Structure 3>

Next, an example of a bottom-gate top-contact transistor will be described.

FIGS. 15A to 15C are a top view and cross-sectional views of the transistor. FIG. 15A is the top view of the transistor. FIGS. 15B1 and 15B2 are the cross-sectional views taken along dashed-dotted line C1-C2 in FIG. 15A. FIG. 15C is the cross-sectional view taken along dashed-dotted line C3-C4 in FIG. 15A.

The transistor in FIGS. 15B1 and 15B2 includes a gate electrode 304 over a substrate 300; a gate insulating film 312 over the gate electrode 304; an oxide semiconductor film 306 over the gate insulating film 312; and a source electrode 316a and a drain electrode 316b over the oxide semiconductor film 306. The transistor preferably further includes the protective insulating film 318 over the source electrode 316a, the drain electrode 316b, the gate insulating film 312, and the oxide semiconductor film 306; and a wiring 326a and a wiring 326b over the protective insulating film 318. Further, the protective insulating film 318 has openings reaching the source electrode 316a and the drain electrode 316b, respectively. The wiring 326a and the wiring 326b are in contact with the source electrode 316a and the drain electrode 316b through the openings, respectively. Note that the transistor may include a base insulating film between the substrate 300 and the gate electrode 304.

The description of the transistor illustrated in FIGS. 3A to 3C can be referred to for part of the transistor illustrated in FIGS. 15A to 15C.

For example, the description of the substrate 100 can be referred to for the substrate 300. The description of the oxide semiconductor film 106 can be referred to for the oxide semiconductor film 306. The description of the source electrode 116a and the drain electrode 116b can be referred to for the source electrode 316a and the drain electrode 316b. The description of the gate insulating film 112 can be referred to for the gate insulating film 312. The description of the gate electrode 104 can be referred to for the gate electrode 304. The description of the wirings 126a and 126b can be referred to for the wirings 326a and 326b.

The transistor in FIGS. 15B1 and 15B2 includes at least one of a region 319 and a region 313 serving as an oxygen blocking region. The descriptions of the regions 103, 113, and 119 can be referred to for the regions 313 and 319.

The region 313 is a region of the gate insulating film 312 that is in contact with the protective insulating film 318. The region 313 is provided to a depth of 1 nm to 200 nm inclusive, preferably 5 nm to 150 nm inclusive, more preferably 10 nm to 100 nm inclusive from the top surface of the gate insulating film 312. Note that the region 313 may be provided so as to extend from the top surface of the gate insulating film 312 to the bottom surface thereof. The region 313 may also be provided in a region of the substrate 300 that does not overlap with the gate electrode 304.

The region 319 is a region provided in an upper portion of the protective insulating film 318 as illustrated in FIG. 15B1. Alternatively, the region 319 is a region provided in an upper portion of the protective insulating film 318 and side portions of the openings as illustrated in FIG. 15B2. The region 319 is provided to a depth of 1 nm to 200 nm inclusive, preferably 5 nm to 150 nm inclusive, more preferably 10 nm to 100 nm inclusive from the top surface of the protective insulating film 318 or the side surface of the opening. Note that the region 319 may be provided so as to extend from the top surface of the protective insulating film 318 to the bottom surface thereof.

In the case where the transistor includes the region 313, excess oxygen contained in the gate insulating film 312 can be efficiently utilized to reduce the oxygen vacancies in the oxide semiconductor film 306. In the case where the transistor does not include the region 313, excess oxygen contained in the gate insulating film 312 might be used to oxidize the source electrode 316a, the drain electrode 316b, the wiring 326a, and the wiring 326b, for example. Alternatively, excess oxygen contained in the gate insulating film 312 might be diffused outward to be lost. Note that the region 313 may be the entire region of the gate insulating film 312. Note that it may be preferable that the region 313 not overlap with a channel formation region, in which case degradation due to the region 313 in the gate insulating film 312 is not likely to occur.

Also in the case where the transistor includes the region 319, excess oxygen contained in the gate insulating film 312 or the protective insulating film 318 can be efficiently utilized to reduce the oxygen vacancies in the oxide semiconductor film 306. In the case where the transistor does not include the region 319, excess oxygen contained in the gate insulating film 312 or the protective insulating film 318 might be used to oxidize the source electrode 316a, the drain electrode 316b, the wiring 326a, and the wiring 326b, for example. Alternatively, in the case where the transistor does not include the region 319, excess oxygen contained in the gate insulating film 312 or the protective insulating film 318 might be diffused outward to be lost. In particular, the region 319 is preferably provided as illustrated in FIG. 15B2, in which case the wirings 326a and 326b are not easily oxidized and thus the wiring resistance is less likely to be increased.

Note that as illustrated in FIG. 15A, the gate electrode 304 is provided so that the edge of the oxide semiconductor film 306 is located on the inner side than the edge of the gate electrode 304 in the top view. This can suppress generation of carriers in the oxide semiconductor film 306 due to incident light from the gate electrode 304 side. In other words, the gate electrode 304 functions as a light-blocking film. Note that the oxide semiconductor film 306 may be provided so as to extend to the outside of the gate electrode 304.

The protective insulating film 318 illustrated in FIGS. 15A to 15C is formed of, for example, a single layer or a stack of an insulating film containing silicon oxide or silicon oxynitride. Further, the protective insulating film 318 is preferably formed using an insulating film containing excess oxygen. The thickness of the protective insulating film 318 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm.

The protective insulating film 318 may be, for example, a stack including a silicon oxide film as a first layer and a silicon nitride film as a second layer. A silicon oxynitride film may be used instead of the silicon oxide film. A silicon nitride oxide film may be used instead of the silicon nitride film. As the silicon oxide film, a silicon oxide film having a small defect density is preferably used. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon nitride film, a silicon nitride film that is less likely to release hydrogen and ammonia gases is used. The amount of released hydrogen and ammonia gases can be measured by TDS. Further, as the silicon nitride film, a silicon nitride film through which hydrogen, water, and oxygen do not permeate or hardly permeate is used.

Alternatively, the protective insulating film 318 may be, for example, a stack including a first silicon oxide film as a first layer, a second silicon oxide film as a second layer, and a silicon nitride film as a third layer. In that case, the first silicon oxide film and/or the second silicon oxide film may be a silicon oxynitride film. A silicon nitride oxide film may be used instead of the silicon nitride film. As the first silicon oxide film, a silicon oxide film having a small defect density is preferably used. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide film, a silicon oxide film containing excess oxygen is used. As the silicon nitride film, a silicon nitride film that is less likely to release hydrogen and ammonia gases is used. Further, as the silicon nitride film, a silicon nitride film through which hydrogen, water, and oxygen do not permeate or hardly permeate is used.

<Fabricating Method of Transistor Structure 3>

An example of a method for fabricating a transistor structure 3 will be described below.

FIGS. 16A1 to 16C2, FIGS. 17A1 to 17C2, FIGS. 18A1 to 18C2, and FIGS. 19A1 to 19C2 are cross-sectional views corresponding to those in FIGS. 15B1, 15B2, and 15C.

First, the substrate 300 is prepared.

Then, the gate electrode 304 is formed. The description of the method for forming the gate electrode 104 can be referred to for a method for forming the gate electrode 304.

Then, the gate insulating film 312 is formed (see FIGS. 16A1 and 16A2). The description of the method for forming the gate insulating film 112 can be referred to for the gate insulating film 312.

Then, an oxide semiconductor film 336 is formed. The description of a method for forming the oxide semiconductor film 336 can be referred to for the oxide semiconductor film 336.

Next, a layer to be a resist mask 320 is formed over the oxide semiconductor film 336. The description of the method for forming the layer to be the resist mask 120 can be referred to for the layer to be the resist mask 320.

Then, the layer to be the resist mask 320 is processed by a photolithography method or the like to form the resist mask 320 (see FIGS. 16B1 and 16B2).

After that, the oxide semiconductor film 336 is partly etched using the resist mask 320 to form the island-shaped oxide semiconductor film 306 (see FIGS. 16C1 and 16C2).

Next, an impurity is added to the gate insulating film 312, whereby the region 313 is formed (see FIGS. 17A1 and 17A2). The description of the method of forming the region 53 by adding an impurity to the insulating film 52 can be referred to for a method of forming the region 313 by adding an impurity to the gate insulating film 312. Note that in the case where the region 319 is formed in a later step, the region 313 is not necessarily formed.

Then, the resist mask 320 is removed by plasma treatment, chemical treatment, or the like. Plasma ashing is preferably employed to remove the resist mask 320. Note that in the case of using a method described later, an impurity may be added to the gate insulating film 312 and the oxide semiconductor film 306 after the resist mask 320 is removed.

Next, first heat treatment is preferably performed. For the first heat treatment, the description of the first heat treatment for the transistor structure 1 can be referred to.

Next, the source electrode 316a and the drain electrode 316b are formed (see FIGS. 17B1 and 17B2). The description of the method for forming the source electrode 116a and the drain electrode 116b can be referred to for the method for forming the source electrode 316a and the drain electrode 316b.

Then, the protective insulating film 318 is formed (see FIGS. 17C1 and 17C2). The protective insulating film 318 can be formed using an insulating film selected from the insulating films given as examples of the protective insulating film 318, by a sputtering method, a CVD method, a MBE method, an ALD method, or a PLD method.

Then, an impurity is added to the protective insulating film 318, whereby the region 319 is formed (see FIGS. 18A1 and 18A2). The description of the method of forming the region 53 by adding an impurity to the insulating film 52 can be referred to for a method of forming the region 319 by adding an impurity to the protective insulating film 318. Note that in the case where the region 313 is formed, the region 319 is not necessarily formed.

Next, second heat treatment is preferably performed. The second heat treatment may be performed under any of the conditions listed for the first heat treatment or may be performed at a temperature lower than the temperature for the first heat treatment. The second heat treatment can also serve as the first heat treatment.

Next, openings are formed in the protective insulating film 318 to partly expose the source electrode 316a and the drain electrode 316b (see FIGS. 18B1 and 18B2).

Then, the wirings 326a and 326b are formed (see FIGS. 18C1 and 18C2). The description of the method for forming the wirings 126a and 126b can be referred to for the wirings 326a and 326b.

Through the above steps, the transistor illustrated in FIG. 15B1 can be fabricated.

When the transistor illustrated in FIG. 15B2 is fabricated, steps illustrated in FIGS. 19A1 to 19C2 are performed instead of the steps illustrated in FIGS. 18A1 to 18C2. The steps up to the step illustrated in FIGS. 17C1 and 17C2 are the same between the transistors in FIGS. 15B1 and 15B2.

First, openings are formed in the protective insulating film 318 to partly expose the source electrode 316a and the drain electrode 316b (see FIGS. 19A1 and 19A2).

Then, an impurity is added to the protective insulating film 318, whereby the region 319 is formed. At this time, the impurity is also added to the vicinity of side surfaces of the openings and thus the region 319 is also formed in the vicinity of the side surfaces of the openings (see FIGS. 19B1 and 19B2). The description of the method of forming the region 53 by adding an impurity to the insulating film 52 can be referred to for a method of forming the region 319 by adding an impurity to the protective insulating film 318.

Then, third heat treatment is preferably performed.

Then, the wirings 326a and 326b are formed (see FIGS. 19C1 and 19C2). The description of the method for forming the wirings 126a and 126b can be referred to for the wirings 326a and 326b.

Through the above steps, the transistor illustrated in FIG. 15B2 can be fabricated.

Examples of transistor structures of embodiments of the present invention and fabricating methods thereof are described above. Note that the transistor structure of one embodiment of the present invention is not limited to the above examples. Examples of the transistor structure of one embodiment of the present invention include a bottom contact structure and a structure without source and drain electrodes.

In the transistor of one embodiment of the present invention, excess oxygen contained in the insulating film can be efficiently utilized to reduce oxygen vacancies in the oxide semiconductor film. Thus, the transistor includes the oxide semiconductor film with reduced oxygen vacancies.

For that reason, the transistor of one embodiment of the present invention is less likely to deteriorate owing to oxygen vacancies. For example, oxygen vacancies in an oxide semiconductor film might serve as trap centers, causing deterioration. Further, oxygen vacancies that trap hydrogen to form a donor level might cause a negative shift in the threshold voltage of a transistor.

In the transistor of one embodiment of the present invention, excess oxygen can be efficiently utilized. Therefore, the transistor can be used for a fine structure. Further, the transistor is less likely to deteriorate and has stable electrical characteristics. Since an increase in resistance due to oxidization of the wiring is small, a larger on-state current can be achieved. Further, since the threshold voltage does not shift in the negative direction, a smaller off-state current can be achieved.

<Application Products>

Application products using the above transistor will be described below.

<Structure of Semiconductor Device>

An example of a semiconductor device of one embodiment of the present invention that includes a transistor formed using an oxide semiconductor film and a transistor formed using silicon will be described below.

Figure 26:
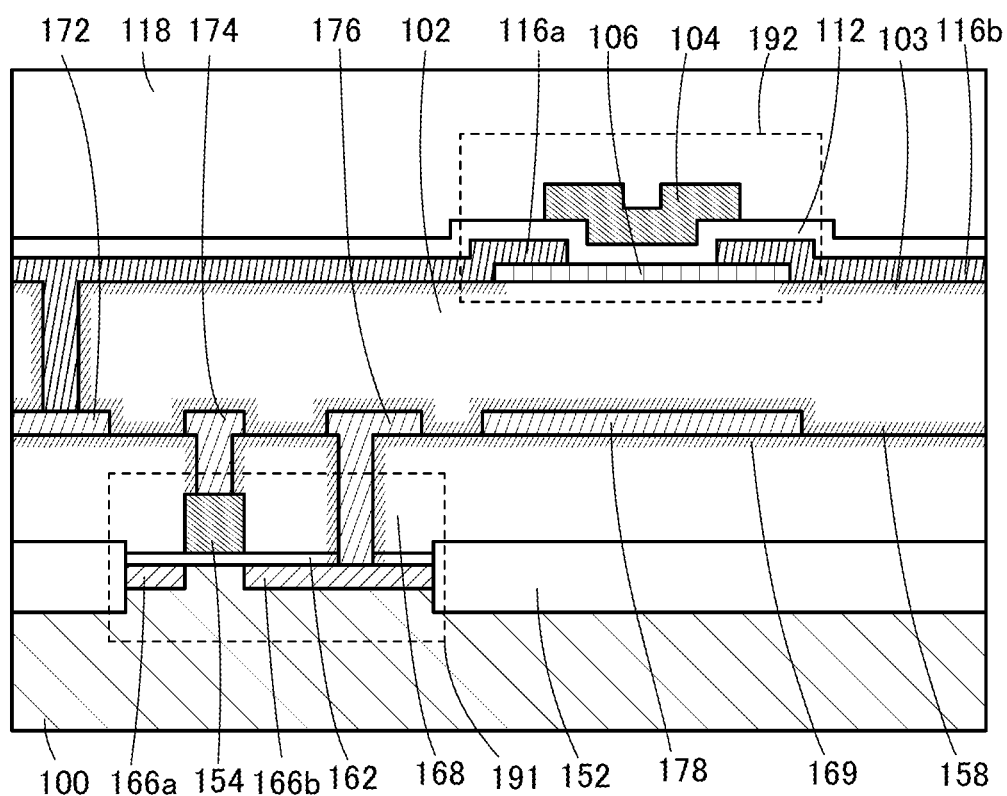
FIG. 26 is a cross-sectional view illustrating an example of a semiconductor device of one embodiment of the present invention.

FIG. 26 is a cross-sectional view of a semiconductor device. The semiconductor device includes a transistor 191 that is formed using silicon; an insulating film 168 over the transistor 191; a conductive film 172, a conductive film 174, a conductive film 176, and a conductive film 178 over the insulating film 168; the insulating film 102 over the insulating film 168, the conductive film 172, the conductive film 174, the conductive film 176, and the conductive film 178; and a transistor 192 that is formed using an oxide semiconductor film and is over the insulating film 102. Note that the protective insulating film 118 may be provided over the semiconductor device.

The insulating film 168 is formed of, for example, a single layer or a stack of an insulating film containing silicon oxide or silicon oxynitride.

The insulating film 168 has openings reaching the transistor 191. The conductive film 174 and the conductive film 176 are electrically connected to the transistor 191 through the openings formed in the insulating film 168. A region 169 serving as an oxygen blocking region is provided in an upper portion of the insulating film 168 and side portions of the openings. The thickness of the insulating film 168 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm. The region 169 is provided to a depth of 1 nm to 200 nm inclusive, preferably 5 nm to 150 nm inclusive, more preferably 10 nm to 100 nm inclusive from the top surface of the insulating film 168 or the side surface of the opening.

The insulating film 102 is formed of, for example, a single layer or a stack of an insulating film containing silicon oxide or silicon oxynitride. Further, the insulating film 102 is preferably formed using an insulating film containing excess oxygen.

The insulating film 102 has an opening reaching the conductive film 172. The transistor 192 is electrically connected to the conductive film 172 through the opening formed in the insulating film 102. A region 158 and the region 103 serving as oxygen blocking regions are provided in upper and lower portions of the insulating film 102 and a side portion of the opening. The thickness of the insulating film 102 is, for example, greater than or equal to 20 nm and less than or equal to 1000 nm, preferably greater than or equal to 50 nm and less than or equal to 1000 nm, more preferably greater than or equal to 100 nm and less than or equal to 1000 nm, still more preferably greater than or equal to 200 nm and less than or equal to 1000 nm. The region 158 is provided to a height of 1 nm to 200 nm inclusive, preferably from 5 nm to 150 nm inclusive, more preferably from 10 nm to 100 nm inclusive from the bottom surface of the insulating film 102. The region 103 is provided to a depth of 1 nm to 200 nm inclusive, preferably 5 nm to 150 nm inclusive, more preferably 10 nm to 100 nm inclusive from the top surface of the insulating film 102 or a side surface of the opening.

The semiconductor device is not limited to the structure including all the regions 169, 158, and 103. For example, the semiconductor device may have a structure including the regions 169 and 103 and not including the region 158 or a structure including the regions 158 and 103 and not including the region 169.

For example, an impurity-containing insulating film can be used for the oxygen blocking region. For example, in some cases, the oxygen blocking region can be formed by adding, as an impurity, one or more of boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten to an insulating film. The above impurities are less likely to increase the resistance of metal. Note that adding phosphorus or boron among the above impurities to an insulating film enables formation of a particularly high-quality oxygen blocking region having an excellent oxygen blocking property (having a small oxygen diffusion coefficient). The oxygen blocking region contains, in an insulating film, for example, any of the above impurities at a concentration of higher than or equal to $5\times10^{19}$ atoms/cm$^3$, preferably higher than or equal to $1\times10^{20}$ atoms/cm$^3$, more preferably higher than or equal to $2\times10^{20}$ atoms/cm$^3$, still more preferably higher than or equal to $5\times10^{20}$ atoms/cm$^3$.

Alternatively, an insulating film having a small oxygen diffusion coefficient can be used for the oxygen blocking region. The insulating film having a small oxygen diffusion coefficient may be formed of a single layer or a stack of an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxygen blocking region includes, for example, a silicon nitride film. In that case, a silicon nitride oxide film may be used instead of the silicon nitride film. It is preferable that the silicon nitride film be less likely to release hydrogen and ammonia gases. The amount of released hydrogen and ammonia gases can be measured by TDS. Further, it is preferable that hydrogen and water not permeate or hardly permeate the silicon nitride film. The oxygen blocking region includes, for example, an aluminum oxide film. It is preferable that the aluminum oxide film be less likely to release a hydrogen gas. The amount of released hydrogen gas can be measured by TDS. Further, it is preferable that hydrogen and water not permeate or hardly permeate the aluminum oxide film.

Materials of the oxygen blocking regions may be different between the regions 169, 158, and 103. For example, an impurity-containing insulating film is used for the regions 169 and 103, and an insulating film having a small oxygen diffusion coefficient may be used for the region 158.

The conductive film 172, the conductive film 174, the conductive film 176, and the conductive film 178 may be formed using a single layer or a stacked of a conductive film containing aluminum, titanium, chromium, cobalt, nickel, copper, yttrium, zirconium, molybdenum, ruthenium, silver, tantalum, or tungsten. The conductive film 172, the conductive film 174, and the conductive film 176 may serve as wirings included in the semiconductor device. The conductive film 178 may serve as a back gate electrode of the transistor 192.

The protective insulating film 118 may be formed of a single layer or a stack of an insulating film containing silicon oxide, silicon oxynitride, germanium oxide, yttrium oxide, zirconium oxide, lanthanum oxide, neodymium oxide, hafnium oxide, or tantalum oxide.

The transistor 191 includes, for example, a gate insulating film 162 over a substrate 100 formed using silicon; a gate electrode 154 over the gate insulating film 162; a region 166a and a region 166b in regions of the substrate 100 that do not overlap with the gate electrode 154; and an element isolation region 152 with an insulating property. Although the example where silicon is used for the substrate 100 that is used for the transistor 191 is described here, the substrate 100 is not limited to a semiconductor substrate formed using silicon. Examples of the substrate 100 include semiconductor substrates such as a germanium substrate and a diamond substrate, and compound semiconductor substrates such as a gallium arsenide substrate, a silicon carbide substrate, a gallium nitride substrate, an indium phosphide substrate, a zinc oxide substrate, and a gallium oxide substrate. Alternatively, an SOI (silicon on insulator) substrate or the like may be used as the substrate 100. Instead of the substrate 100, a substrate with an insulating surface that is provided with a semiconductor film such as a silicon film, a germanium film, or a diamond film, or a compound semiconductor film such as a gallium arsenide film, a silicon carbide film, a gallium nitride film, an indium phosphide film, a zinc oxide film, a gallium oxide film, an In—Zn oxide film, an In—Ga—Zn oxide film, or an In—Sn—Zn oxide film may be used.

The transistor 192 includes, for example, the oxide semiconductor film 106 over the insulating film 102; the source electrode 116a and the drain electrode 116b over the oxide semiconductor film 106; the gate insulating film 112 over the oxide semiconductor film 106, the source electrode 116a, and the drain electrode 116b; and the gate electrode 104 over the gate insulating film 112. The oxide semiconductor film 106 is also provided in a region that does not overlap with the region 103 in the insulating film 102.

In the case where the insulating film 102 includes the region 103, excess oxygen contained in the insulating film 102 can be efficiently utilized to reduce oxygen vacancies in the oxide semiconductor film 106. In the case where the insulating film 102 does not include the region 103, excess oxygen contained in the insulating film 102 might be used to oxidize the source electrode 116a, the drain electrode 116b, the wiring 126a, and the wiring 126b, for example. Alternatively, excess oxygen contained in the insulating film 102 might be diffused outward to be lost.

The descriptions in FIGS. 3A to 3C and the like are referred to for the oxide semiconductor film 106 in the description below.

<Method for Fabricating Semiconductor Device>

A fabricating method of the semiconductor device illustrated in FIG. 26 will be described below.

Figure 28A:
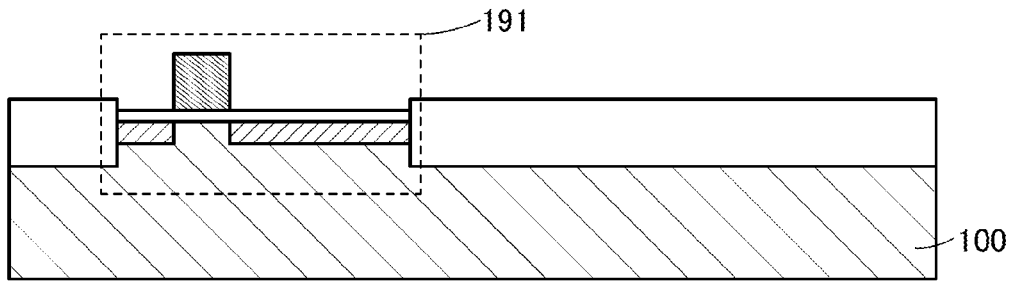
FIGS. 28A to 28D are cross-sectional views illustrating an example of a method for manufacturing a semiconductor device of one embodiment of the present invention.

First, the transistor 191 is formed over the substrate 100 (see FIG. 28A).

Figure 28B:
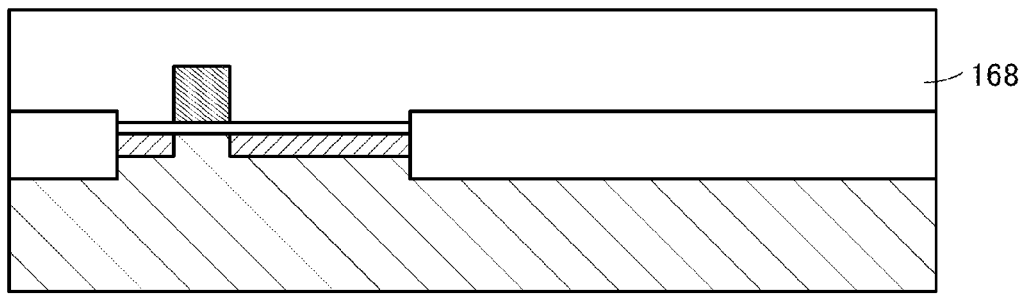

Then, the insulating film 168 is formed over the transistor 191 (see FIG. 28B).

Figure 28C:
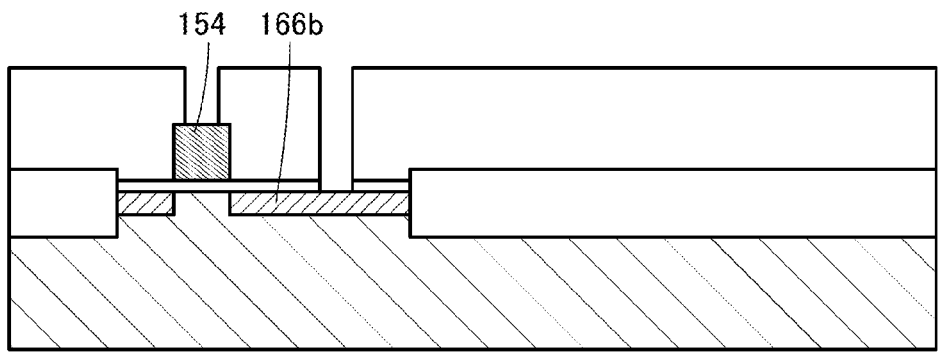

Then, the insulating film 168 is processed to form an opening reaching the gate electrode 154 of the transistor 191 and an opening reaching the region 166b (see FIG. 28C).

Figure 28D:
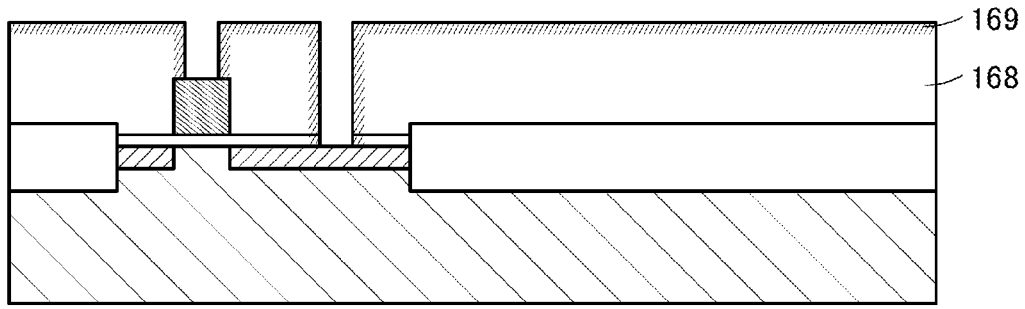

Next, an impurity is added to the insulating film 168 to form the region 169 serving as an oxygen blocking region (see FIG. 28D). Note that the description of the method for forming an oxygen blocking region can be referred to for a method for forming the region 169 in the insulating film 168.

Figure 29A:
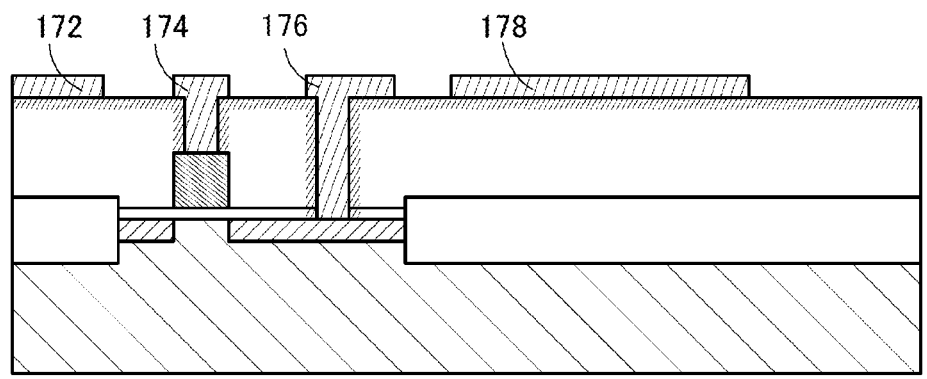
FIGS. 29A to 29C are cross-sectional views illustrating an example of a method for manufacturing a semiconductor device of one embodiment of the present invention.

Then, the conductive film 172, the conductive film 174, the conductive film 176, and the conductive film 178 are formed over the insulating film 168 (see FIG. 29A).

Figure 29B:
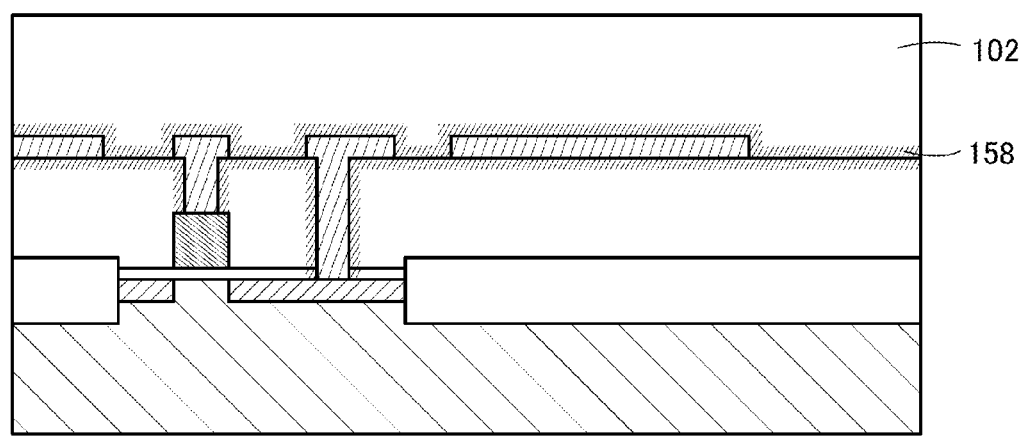

Then, the insulating film 102 that includes the region 158 serving as an oxygen blocking region is formed over the insulating film 168, the conductive film 172, the conductive film 174, the conductive film 176, and the conductive film 178 (see FIG. 29B). The region 158 can be formed using an insulating film having a small oxygen diffusion coefficient. Alternatively, the region 158 can be formed by adding an impurity to the insulating film 102.

In the case where the region 158 is formed in the insulating film 102 by an ion doping method or an ion implantation method, for example, the acceleration voltage for the ion doping method or the ion implantation method is higher than or equal to 20 kV and lower than or equal to 500 kV, preferably higher than or equal to 50 kV and lower than or equal to 500 kV, more preferably higher than or equal to 100 kV and lower than or equal to 500 kV, still more preferably higher than or equal to 200 kV and lower than or equal to 500 kV. Further, the ion implantation concentration is higher than or equal to $1\times10^{15}$ atoms/cm$^2$, preferably higher than or equal to $2\times10^{15}$ atoms/cm$^2$, more preferably higher than or equal to $5\times10^{15}$ atoms/cm$^2$, still more preferably higher than or equal to $1\times10^{16}$ atoms/cm$^2$, still further preferably higher than or equal to $2\times10^{16}$ atoms/cm$^2$.

Figure 29C:
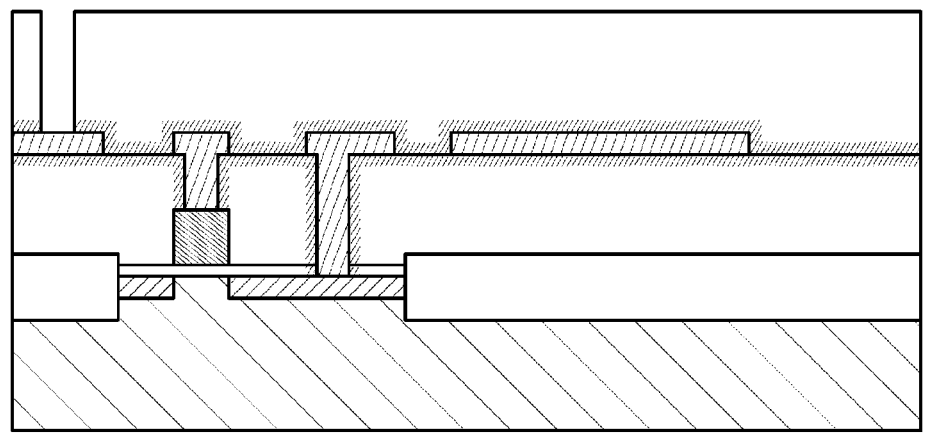

Next, the insulating film 102 is processed to form an opening reaching the conductive film 172 (see FIG. 29C).

Next, an oxide semiconductor film to be the oxide semiconductor film 106 is formed. Then, a resist mask 180 is formed over the oxide semiconductor film. Then, the oxide semiconductor film is processed using the resist mask 180 to form the island-shaped oxide semiconductor film 106.

Figure 30A:
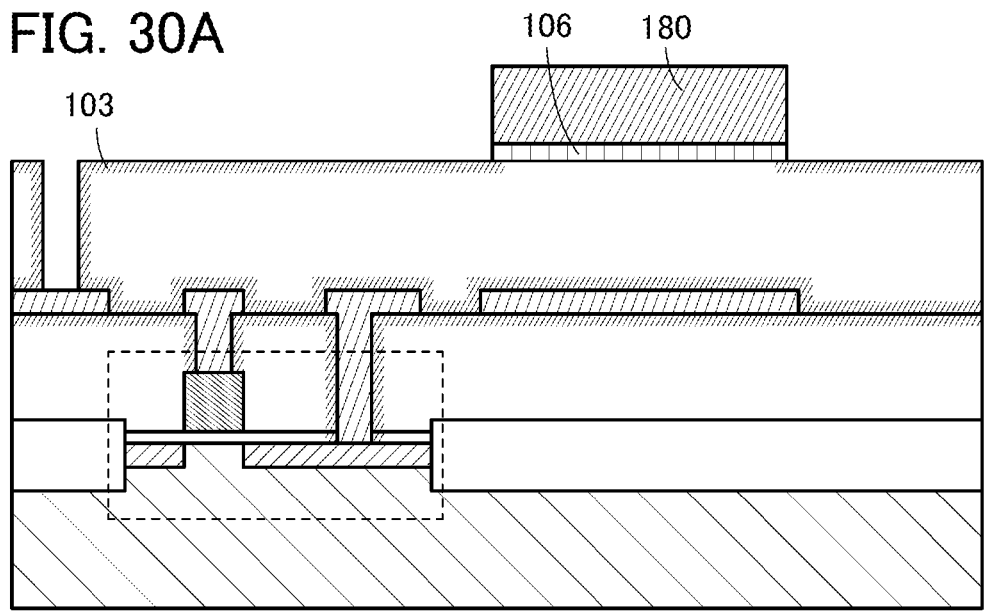
FIGS. 30A and 30B are cross-sectional views illustrating an example of a method for manufacturing a semiconductor device of one embodiment of the present invention.

Next, an impurity is added to the insulating film 102 with the use of the resist mask 180 to form the region 103 serving as an oxygen blocking region (see FIG. 30A). Note that the description of the method for forming an oxygen blocking region can be referred to for a method for forming the region 103 in the insulating film 102.

Figure 30B:
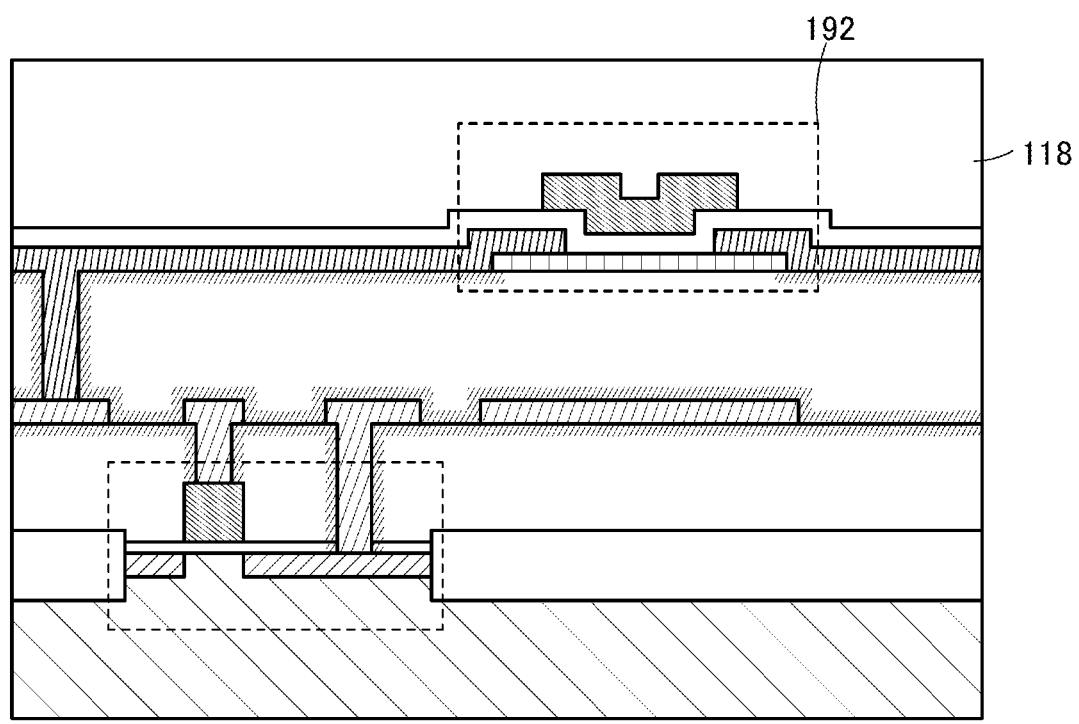

Then, the resist mask 180 is removed. Next, the transistor 192 is formed. After that, the protective insulating film 118 is formed (see FIG. 30B).

Though the above steps, the semiconductor device illustrated in FIG. 26 can be fabricated.

The transistor described above can be used for various uses (e.g., a memory, a CPU, and a display device).

<Memory 1>

A circuit configuration and operation of a memory cell included in a semiconductor device of one embodiment of the present invention will be described below with reference to FIGS. 31A and 31B.

Note that a semiconductor device includes a memory cell, and in some cases, further includes a driver circuit, a power supply circuit, or the like provided over a substrate which is different from a substrate provided with the memory cell.

Figure 31A:
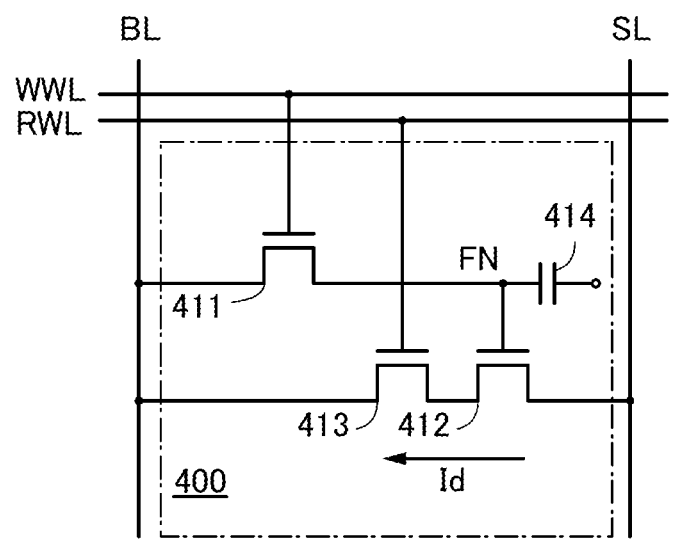
FIGS. 31A and 31B are a circuit diagram and a timing chart of an example of a semiconductor device of one embodiment of the present invention.

FIG. 31A is a circuit diagram illustrating an example of a memory cell 400.

The memory cell 400 in FIG. 31A includes a transistor 411, a transistor 412, a transistor 413, and a capacitor 414. Note that in the actual case, a plurality of memory cells 400 are arranged in a matrix, though not illustrated in FIG. 31A.

A gate of the transistor 411 is connected to a write word line WWL. One of a source and a drain of the transistor 411 is connected to a bit line BL. The other of the source and the drain of the transistor 411 is connected to a floating node FN.

A gate of the transistor 412 is connected to the floating node FN. One of a source and a drain of the transistor 413 is connected to one of a source and a drain of the transistor 412. The other of the source and the drain of the transistor 412 is connected to a power supply line SL.

A gate of the transistor 413 is connected to a read word line RWL. The other of the source and the drain of the transistor 413 is connected to the bit line BL.

One electrode of the capacitor 414 is connected to the floating node FN. The other electrode of the capacitor 414 is supplied with a fixed potential.

A word signal is supplied to the write word line WWL.

The word signal is a signal to turn on the transistor 411 so that the voltage of the bit line BL is supplied to the floating node FN.

Note that in this specification, "writing of data to the memory cell" means that a word signal supplied to the write word line WWL is controlled so that the potential of the floating node FN reaches a potential corresponding to the voltage of the bit line BL. Further, "reading of data from the memory cell" means that a read signal supplied to the read word line RWL is controlled so that the voltage of the bit line BL reaches a voltage corresponding to the potential of the floating node FN.

Multilevel data is supplied to the bit line BL. Further, a discharge voltage $V_{discharge}$ for reading data is supplied to the bit line BL.

The multilevel data is k-bit data (k is an integer of 2 or more). Specifically, 2-bit data is 4-level data, namely, a signal having any one of the four levels of voltages.

The discharge voltage $V_{discharge}$ is a voltage that is supplied to the bit line BL in order to read data. After the discharge voltage $V_{discharge}$ is supplied, the bit line BL is brought into an electrically floating state. The discharge voltage $V_{discharge}$ is a voltage that is supplied to initialize the bit line BL.

A read signal is supplied to the read word line RWL.

The read signal is a signal that is supplied to the gate of the transistor 413 in order to read data from the memory cell in a selective manner.

The floating node FN corresponds to any node on a wiring that connects one electrode of the capacitor 414, the other of the source and the drain of the transistor 411, and the gate of the transistor 412.

Note that the potential of the floating node FN is based on the multilevel data supplied from the bit line BL. The floating node FN becomes in an electrically floating state when the transistor 411 is turned off.

The power supply line SL is supplied with a precharge voltage $V_{precharge}$ that is higher than the discharge voltage $V_{discharge}$ supplied to the bit line BL.

Note that the voltage of the power supply line SL needs to be the precharge voltage $V_{precharge}$ at least in a period in which data is read from the memory cell 400. Thus, in a period in which data is written to the memory cell 400 and/or in a period in which data is not read or written, the power supply line SL can be supplied with the discharge voltage $V_{discharge}$ so that the bit line BL and the power supply line SL have the same potential. With such a structure, a slight amount of flow-through current that flows between the bit line BL and the power supply line SL can be reduced.

Another structure may be employed in which the power supply line SL is supplied with a constant voltage that is equal to the precharge voltage $V_{precharge}$. With such a structure, it is not necessary to switch the voltage of the power supply line SL between the precharge voltage $V_{precharge}$ and the discharge voltage $V_{discharge}$, and thus, power consumed in storing and releasing electrical charge of the power supply line SL can be reduced.

The precharge voltage $V_{precharge}$ is supplied to the power supply line SL to change the discharge voltage $V_{discharge}$ supplied to the bit line BL by storing electrical charge via the transistor 412 and the transistor 413.

The transistor 411 has a function of a switch for controlling data writing by being switched between a conducting state and a non-conducting state. The transistor 411 also has a function of holding a potential based on written data by keeping a non-conducting state. Note that the transistor 411 is an n-channel transistor in the description.

As the transistor 411, it is preferable to use a transistor having a low current (low off-state current) that flows between a source and a drain in a non-conducting state.

In the configuration of the memory cell 400 illustrated in FIG. 31A, a potential based on written data is held by keeping the non-conducting state. Thus, it is particularly preferable to use a transistor having a low off-state current as a switch for suppressing change in the potential in the floating node FN that is accompanied by the transfer of electrical charge. Note that a method for estimating the off-state current of a transistor with low off-state current will be described later.

When a transistor having a low off-state current is used as the transistor 411 and the transistor 411 is kept off, the memory cell 400 can be a non-volatile memory. Thus, once data is written to the memory cell 400, the data can be held in the floating node FN until the transistor 411 is turned on again.

In the transistor 412, a drain current $I_d$ flows between the source and the drain in accordance with the potential of the floating node FN. Note that in the memory cell 400 illustrated in FIG. 31A, the drain current $I_d$ that flows between the source and the drain of the transistor 412 is a current that flows between the bit line BL and the power supply line SL. Note that the transistor 412 is also referred to as a second transistor. Note that the transistor 412 is an n-channel transistor in the description.

In the transistor 413, the current $I_d$ flows between the source and the drain in accordance with the potential of the read word line RWL. Note that in the memory cell 400 illustrated in FIG. 31A, the drain current $I_d$ that flows between the source and the drain of the transistor 413 is a current that flows between the bit line BL and the power supply line SL. Note that the transistor 413 is also referred to as a third transistor. Note that the transistor 413 is an n-channel transistor in the description.

The transistors 412 and 413 each preferably have little variation in threshold voltage. Here, transistors with little variation in threshold voltage mean transistors that are produced in the same process and have an acceptable difference in threshold voltage of 20 mV or lower; a specific example of the transistors is transistors formed using single crystal silicon in channels. The variation in threshold voltage is preferably as little as possible; however, even the transistors including single crystal silicon may have a difference in threshold voltage of approximately 20 mV.

Next, operation of the memory cell 400 illustrated in FIG. 31A will be described.

Figure 31B:
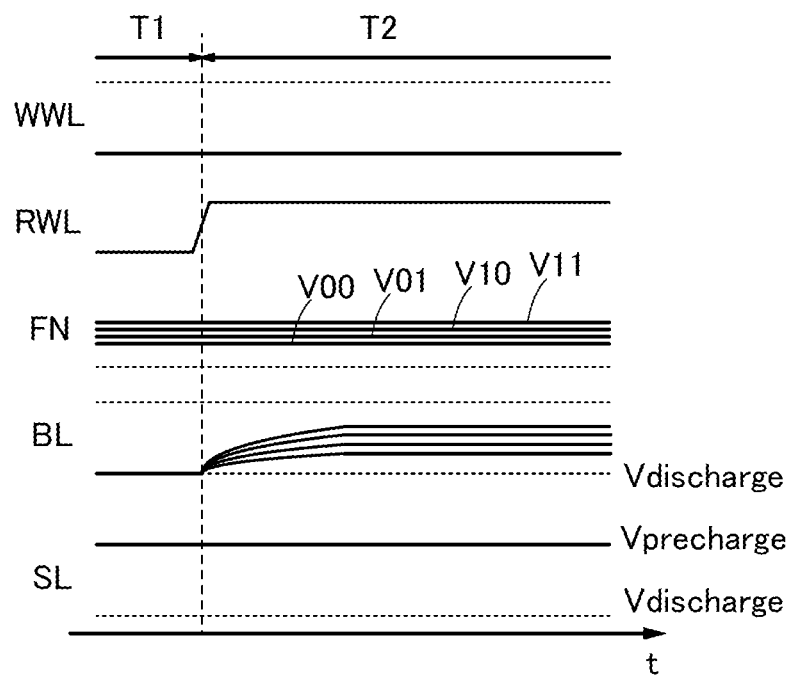

FIG. 31B is a timing chart showing change of signals supplied to the write word line WWL, the read word line RWL, the floating node FN, the bit line BL, and the power supply line SL in FIG. 31A.

The following periods are shown in the timing chart of FIG. 31B: a period T1 that is in an initial state; and a period T2 in which electrical charge of the bit line BL is stored in order to read data.

In the period T1 of FIG. 31B, the electrical charge of the bit line BL is released. At this time, the write word line WWL is supplied with a low-level potential. The read word line RWL is supplied with a low-level potential. The floating node FN holds a potential corresponding to the multilevel data. The bit line BL is supplied with a discharge voltage $V_{discharge}$. The power supply line SL is supplied with a precharge voltage $V_{precharge}$.

Note that as an example of the multilevel data, 2-bit data, i.e., 4-level data is shown in FIG. 31B. Specifically, 4-level data ($V_{00}$, $V_{01}$, $V_{10}$, and $V_{11}$) are shown in FIG. 31B, and the data can be represented by four levels of potentials.

The bit line BL is brought into an electrically floating state after the discharge voltage $V_{discharge}$ is supplied. That is, the bit line BL is brought into a state in which the potential is changed by the storing or releasing of electrical charge. By turning off a switch for supplying a potential to the bit line BL, the bit line BL can be brought into an electrically floating state.

Next, in the period T2 of FIG. 31B, the electrical charge of the bit line BL is stored to read data. At this time, the write word line WWL is supplied with the low-level potential as in the previous period. The read word line RWL is supplied with a high-level potential. In the floating node FN, the potential corresponding to the multilevel data is held as in the previous period. In the bit line BL, the discharge voltage $V_{discharge}$ is increased in accordance with the potential of the floating node FN. The power supply line SL is supplied with the precharge voltage $V_{precharge}$ as in the previous period.

The transistor 413 is turned on in response to the change in the potential of the read word line RWL. Thus, the potential of one of the source and the drain of the transistor 412 is lowered to be the discharge voltage $V_{discharge}$.

The transistor 412 is an n-channel transistor. When the potential of one of the source and the drain of the transistor 412 is lowered to be the discharge voltage $V_{discharge}$, the absolute value of a voltage between the gate and the source (gate voltage) is increased. With the increase in the gate voltage, the drain current $I_d$ flows between the source and the drain of each of the transistors 412 and 413.

When the drain current $I_d$ flows in each of the transistor 412 and the transistor 413, the electrical charge of the power supply line SL is stored to the bit line BL. The potential of the source of the transistor 412 and the potential of the bit line BL are raised by the storing of electrical charge. The raising of the potential in the source of the transistor 412 leads to a gradual decrease in the gate voltage of the transistor 412.

When the gate voltage of the transistor 412 falls to the threshold voltage in the period T2, the drain current $I_d$ stops flowing. Hence, the increase in the potential of the bit line BL proceeds, and when the gate voltage of the transistor 412 reaches the threshold voltage, the storing of electrical charge is completed and the bit line BL has a constant potential. The potential of the bit line BL at this time is approximately a difference between the potential of the floating node FN and the threshold voltage.

That is, the potential of the floating node FN can be reflected in the potential of the bit line BL that is changed by the storing of electrical charge. The difference in the potential is used to determine the multilevel data. In this manner, the multilevel data written to the memory cell 400 can be read.

Thus, the multilevel data can be read from the memory cell without switching a signal for reading data in accordance with the number of levels of the multilevel data.

<Memory 2>

A circuit configuration of a semiconductor device that is different from that of memory 1 and operation of the semiconductor device will be described with reference to FIGS. 32A and 32B.

Figure 32A:
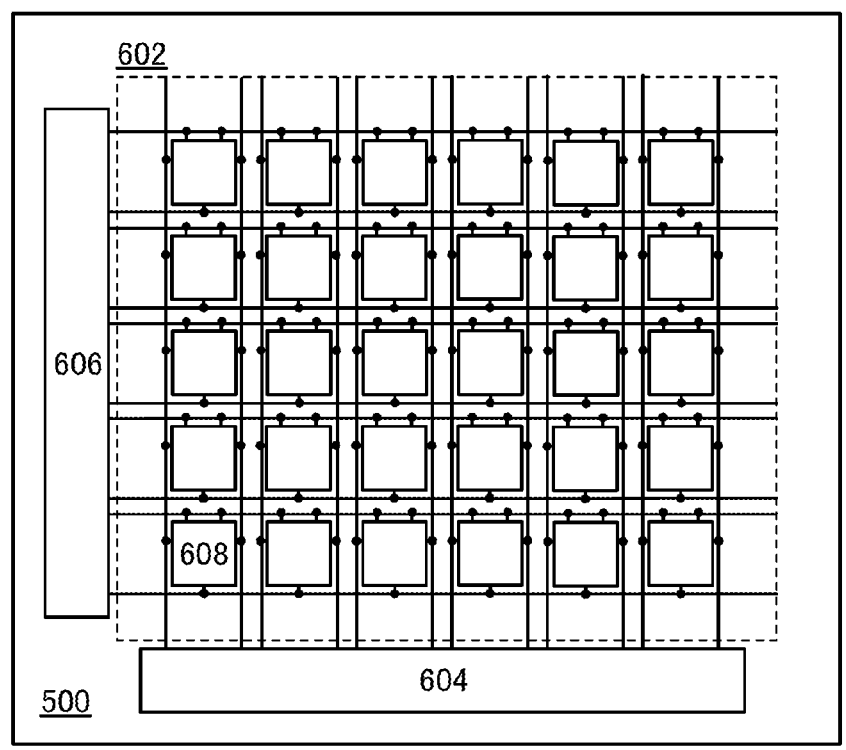
FIGS. 32A and 32B are a block diagram and a circuit diagram of an example of a semiconductor device of one embodiment of the present invention.

As a semiconductor device that is one embodiment of the present invention, a storage device 500 is illustrated in FIG. 32A. The storage device 500 illustrated in FIG. 32A includes a storage element portion 602, a first driver circuit 604, and a second driver circuit 606.

A plurality of storage elements 608 are arranged in a matrix in the storage element portion 602. In the example illustrated in FIG. 32A, the storage elements 608 are arranged in five rows and six columns in the storage element portion 602.

The first driver circuit 604 and the second driver circuit 606 control supply of signals to the storage elements 608, and obtain signals from the storage elements 608 in reading. For example, the first driver circuit 604 serves as a word line driver circuit and the second driver circuit 606 serves as a bit line driver circuit. However, one embodiment of the present invention is not limited thereto, and the first driver circuit 604 may serve as a bit line driver circuit and the second driver circuit 606 may serve as a word line driver circuit.

The first driver circuit 604 and the second driver circuit 606 are each electrically connected to the storage elements 608 through wirings.

The storage elements 608 each include a volatile memory and a non-volatile memory. FIG. 32B illustrates a specific example of a circuit configuration of the storage element 608. The storage element 608 illustrated in FIG. 32B includes a first storage circuit 610 and a second storage circuit 612.

The first storage circuit 610 includes a first transistor 614, a second transistor 616, a third transistor 618, a fourth transistor 620, a fifth transistor 622, and a sixth transistor 624.

First, a configuration of the first storage circuit 610 will be described. One of a source and a drain of the first transistor 614 is electrically connected to a first terminal 630, and a gate of the first transistor 614 is electrically connected to a second terminal 632. One of a source and a drain of the second transistor 616 is electrically connected to a high potential power supply line Vdd. The other of the source and the drain of the second transistor 616 is electrically connected to the other of the source and the drain of the first transistor 614, one of a source and a drain of the third transistor 618, and a first data holding portion 640. The other of the source and the drain of the third transistor 618 is electrically connected to a low potential power supply line Vss. A gate of the second transistor 616 and a gate of the third transistor 618 are electrically connected to a second data holding portion 642.

One of a source and a drain of the fourth transistor 620 is electrically connected to a third terminal 634. A gate of the fourth transistor 620 is electrically connected to a fourth terminal 636. One of a source and a drain of the fifth transistor 622 is electrically connected to the high potential power supply line Vdd. The other of the source and the drain of the fifth transistor 622 is electrically connected to the other of the source and the drain of the fourth transistor 620, one of a source and a drain of the sixth transistor 624, and the second data holding portion 642. The other of the source and the drain of the sixth transistor 624 is electrically connected to the low potential power supply line Vss. A gate of the fifth transistor 622 and a gate of the sixth transistor 624 are electrically connected to the first data holding portion 640.

The first transistor 614, the third transistor 618, the fourth transistor 620, and the sixth transistor 624 are n-channel transistors.

The second transistor 616 and the fifth transistor 622 are p-channel transistors.

The first terminal 630 is electrically connected to a bit line. The second terminal 632 is electrically connected to a first word line. The third terminal 634 is electrically connected to an inverted bit line. The fourth terminal 636 is electrically connected to the first word line.

The first storage circuit 610 having the above configuration is an SRAM. In other words, the first storage circuit 610 is a volatile memory. In the storage device 500 of one embodiment of the present invention, the first data holding portion 640 and the second data holding portion 642, which are provided in the first storage circuit 610, are electrically connected to the second storage circuit 612.

The second storage circuit 612 includes a seventh transistor 626 and an eighth transistor 628.

Next, a configuration of the second storage circuit 612 will be described. One of a source and a drain of the seventh transistor 626 is electrically connected to the second data holding portion 642. The other of the source and the drain of the seventh transistor 626 is electrically connected to one electrode of the first capacitor 648. The other electrode of the first capacitor 648 is electrically connected to the low potential power supply line Vss. The one of the source and the drain of the eighth transistor 628 is electrically connected to the first data holding portion 640. The other of the source and the drain of the eighth transistor 628 is electrically connected to one electrode of a second capacitor 650. The other electrode of the second capacitor 650 is electrically connected to the low potential power supply line Vss. A gate of the seventh transistor 626 and a gate of the eighth transistor 628 are electrically connected to a fifth terminal 668.

The fifth terminal 668 is electrically connected to a second word line. Note that operation of one of the first and second word lines may control a signal of the other, or alternatively, the first word line and the second word line may be independently controlled.

The seventh transistor 626 and the eighth transistor 628 are each a transistor having a low off-state current. In the configuration illustrated in FIG. 32B, the seventh transistor 626 and the eighth transistor 628 are n-channel transistors; however, one embodiment of the present invention is not limited thereto.

A third data holding portion 644 is formed between the seventh transistor 626 and the one electrode of the first capacitor 648. A fourth data holding portion 646 is formed between the eighth transistor 628 and the one electrode of the second capacitor 650. Since the seventh transistor 626 and the eighth transistor 628 each have low off-state current, electrical charge in the third data holding portion 644 and the fourth data holding portion 646 can be stored for a long time. That is, the second storage circuit 612 is a non-volatile memory.

As described above, the first storage circuit 610 is a volatile memory and the second storage circuit 612 is a non-volatile memory. The first data holding portion 640 and the second data holding portion 642, which are the data holding portions in the first storage circuit 610, are electrically connected to the third data holding portion 644 and the fourth data holding portion 646, which are the data holding portions in the second storage circuit 612, through the transistors each having a low off-state current. Thus, by controlling the gate potentials of the transistors each having a low off-state current, the data in the first storage circuit 610 can be stored also in the data holding portion of the second storage circuit 612. Moreover, the use of the transistors each having a low off-state current enables stored data to be held in the third data holding portion 644 and the fourth data holding portion 646 for a long period even when power is not supplied to the storage element 608.

Figure 32B:
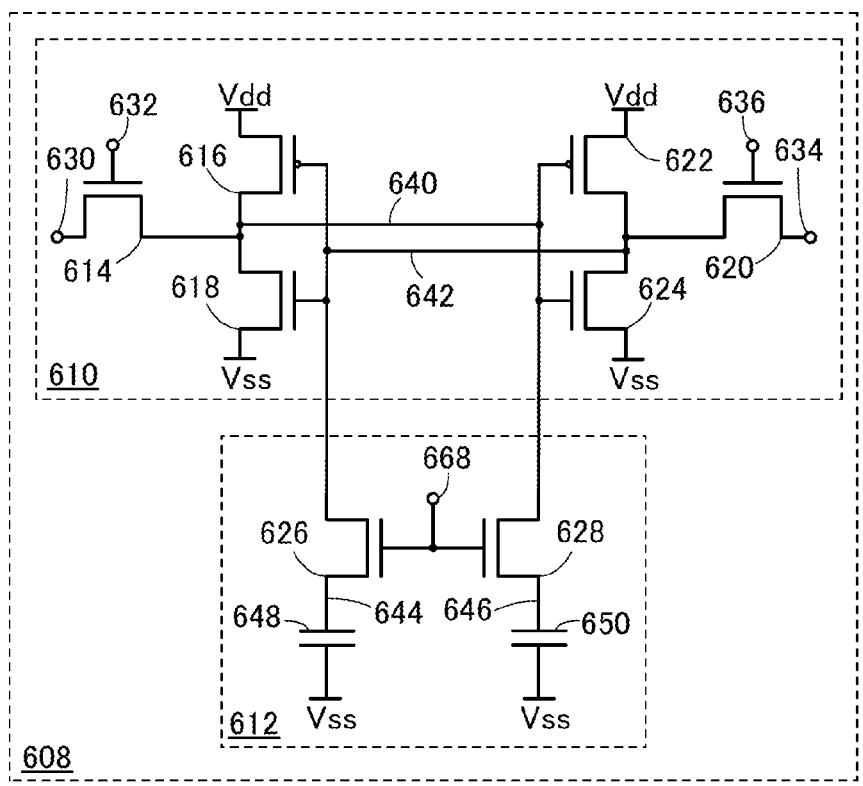

In this manner, in the storage element 608 illustrated in FIG. 32B, data in the volatile memory can be stored in the non-volatile memory.

The first storage circuit 610 is an SRAM, and thus needs to operate at high speed. On the other hand, the second storage circuit 612 is required to hold data for a long period after supply of power is stopped. Such requirements can be satisfied by forming the first storage circuit 610 using transistors capable of high speed operation and forming the second storage circuit 612 using transistors each having a low off-state current. For example, the first storage circuit 610 may be formed using transistors each formed using silicon, and the second storage circuit 612 may be formed using transistors each formed using an oxide semiconductor film.

In the storage device 500 of one embodiment of the present invention, when the first transistor 614 and the fourth transistor 620 are turned on so that data is written to the data holding portions in the first storage circuit 610, which is a volatile memory, in the case where the seventh transistor 626 and the eighth transistor 628, which are included in the second storage circuit 612, are on, it is necessary to accumulate electrical charge in the first capacitor 648 and the second capacitor 650, which are included in the second storage circuit 612, in order that the data holding portions (the first data holding portion 640 and the second data holding portion 642) in the first storage circuit 610 each hold a predetermined potential. Thus, the seventh transistor 626 and the eighth transistor 628 that are on when data is written to the data holding portions in the first storage circuit 610 hinder the storage element 608 from operating at high speed. In the case where the second storage circuit 612 is formed using transistors formed using silicon, it is difficult to sufficiently reduce the off-state current and hold stored data in second storage circuit 612 for a long period.

In the semiconductor device of one embodiment of the present invention, when data is written to the data holding portions in the first storage circuit 610 (the volatile memory), transistors (i.e., the seventh transistor 626 and the eighth transistor 628) positioned between the data holding portions in the first storage circuit 610 and the data holding portions in the second storage circuit 612 are turned off. In this manner, high-speed operation of the storage element 608 can be achieved. Further, when neither writing nor reading to/from the data holding portions in the first storage circuit 610 is performed (that is, the first transistor 614 and the fourth transistor 620 are off), the transistors positioned between the data holding portions in the first storage circuit 610 and the data holding portions in the second storage circuit 612 are turned on.

Specific operation of data writing to the volatile memory in the storage element 608 will be described below. First, the seventh transistor 626 and the eighth transistor 628 that are on are turned off. Next, the first transistor 614 and the fourth transistor 620 are turned on to supply a predetermined potential to the data holding portions (the first data holding portion 640 and the second data holding portion 642) in the first storage circuit 610, and then the first transistor 614 and the fourth transistor 620 are turned off. After that, the seventh transistor 626 and the eighth transistor 628 are turned on. In this manner, data corresponding to data held in the data holding portions in the first storage circuit 610 is held in the data holding portions in the second storage circuit 612.

When the first transistor 614 and the fourth transistor 620 are turned on at least for data writing to the data holding portions in the first storage circuit 610, it is necessary to turn off the seventh transistor 626 and the eighth transistor 628, which are included in the second storage circuit 612. Note that the seventh transistor 626 and the eighth transistor 628, which are included in the second storage circuit 612, may be either on or off when the first transistor 614 and the fourth transistor 620 are turned on for data reading from the data holding portions in the first storage circuit 610.

In the case where supply of power to the storage element 608 is stopped, the transistors positioned between the data holding portions in the first storage circuit 610 and the data holding portions in the second storage circuit 612 (i.e., the seventh transistor 626 and the eighth transistor 628) are turned off just before supply of power to the storage element 608 is stopped, so that the data held in the second storage circuit 612 becomes non-volatile. A means for turning off the seventh transistor 626 and the eighth transistor 628 just before supply of power to the volatile memory is stopped may be mounted on the first driver circuit 604 and the second driver circuit 606, or may alternatively be provided in another control circuit for controlling these driver circuits.

Note that here, whether the seventh transistor 626 and the eighth transistor 628, which are positioned between the data holding portions in the first storage circuit 610 and the data holding portions in the second storage circuit 612, are turned on or off may be determined in each storage element or may be determined in each block in the case where the storage element portion 602 is divided into blocks.

When the first storage circuit 610 operates as an SRAM, the transistors which are positioned between the data holding portions in the first storage circuit 610 and the data holding portions in the second storage circuit 612 are turned off; accordingly, data can be stored in the first storage circuit 610 without accumulation of electrical charge in the first capacitor 648 and the second capacitor 650, which are included in the second storage circuit 612. Thus, the storage element 608 can operate at high speed.

In the storage device 500 of one embodiment of the present invention, before supply of power to the storage device 500 is stopped (a power source of the storage device 500 is turned off), only the transistors which are positioned between the data holding portions in the first storage circuit 610 and the data holding portions in the second storage circuit 612 in the storage element 608 to which data has been rewritten lastly may be turned on. In that case, an address of the storage element 608 to which data has been rewritten lastly is preferably stored in an external memory, in which case the data can be stored smoothly.

Note that the driving method of the semiconductor device of one embodiment of the present invention is not limited to the above description.

As described above, the storage device 500 can operate at high speed. Since data storing is performed only by part of the storage elements, power consumption can be reduced.

In this embodiment, an SRAM is used for the volatile memory; however, one embodiment of the present invention is not limited thereto, and other volatile memories may be used.

<CPU>

Figure 20A:
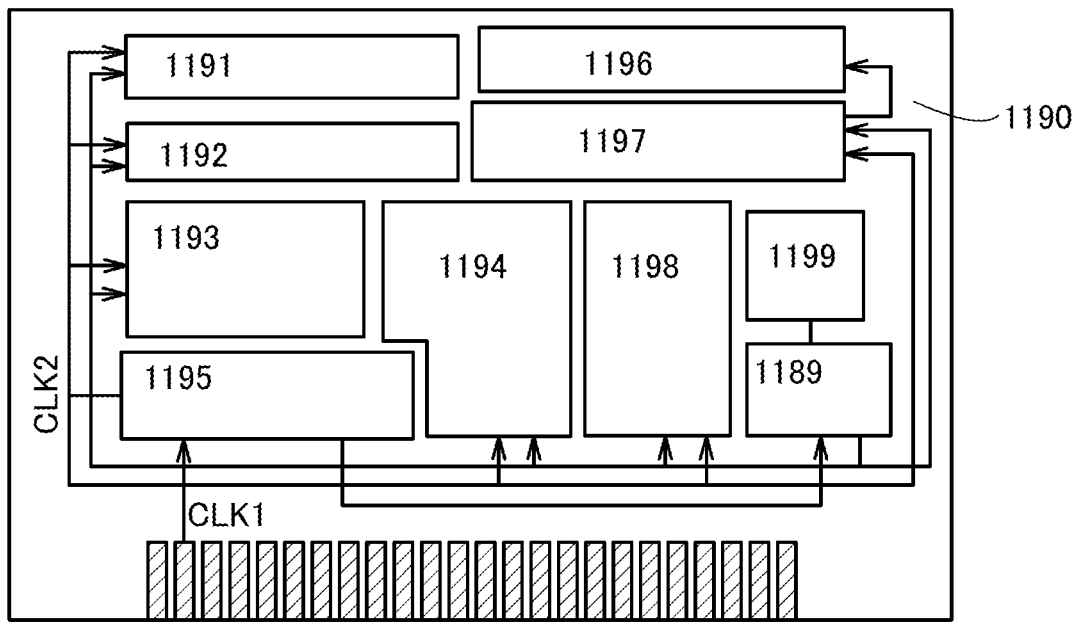
FIGS. 20A to 20C are block diagrams illustrating examples of CPUs of embodiments of the present invention.
Figure 20B:
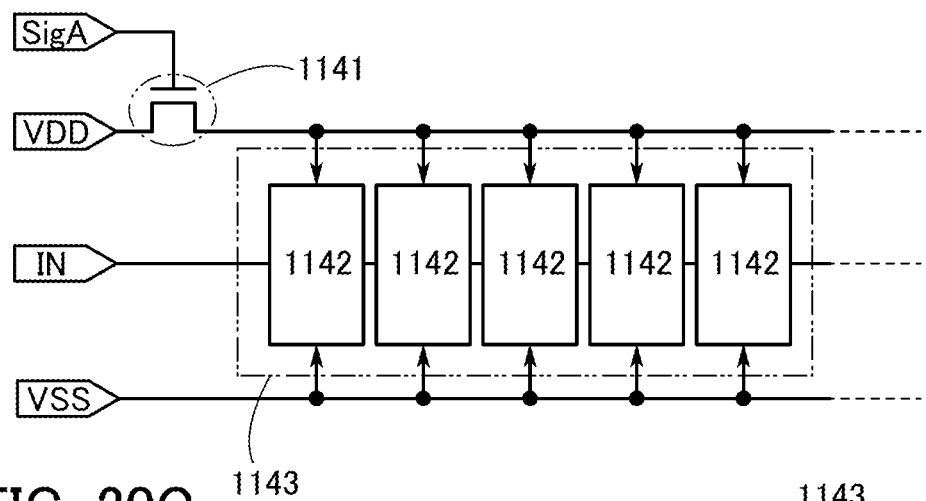
Figure 20C:
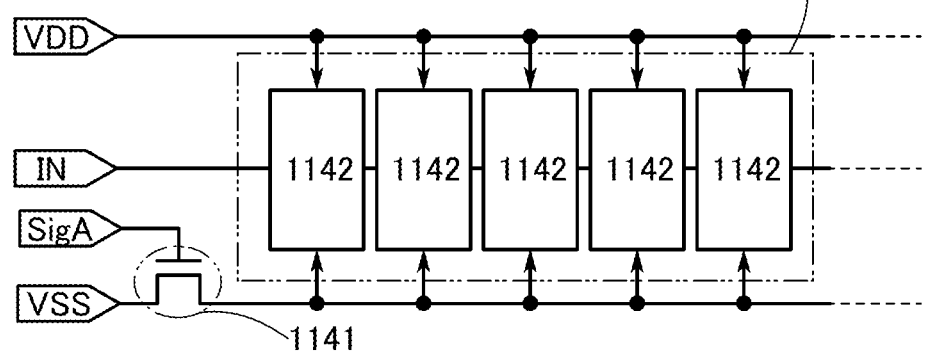

FIGS. 20A to 20C are block diagrams illustrating a specific structure of a CPU at least partly including the above transistor.

The CPU illustrated in FIG. 20A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided in a separate chip. It is needless to say that the CPU in FIG. 20A is only an example in which the configuration is simplified, and actual CPUs have various configurations depending on applications.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 20A, a memory cell is provided in the register 1196. As the memory cell of the register 1196, the above transistor can be used.

In the CPU in FIG. 20A, the register controller 1197 selects operation of holding data in the register 1196, in response to an instruction from the ALU 1191. That is, the register controller 1197 determines whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

The power supply can be stopped by providing a switching element between a memory cell group and a node to which a power supply potential VDD or a power supply potential VSS is supplied, as illustrated in FIG. 20B or FIG. 20C. Circuits illustrated in FIGS. 20B and 20C will be described below.

FIGS. 20B and 20C each illustrate a storage device in which any of the above transistors is used as a switching element that controls supply of a power supply potential to a memory cell.

The storage device illustrated in FIG. 20B includes a switching element 1141 and a memory cell group 1143 including a plurality of memory cells 1142. Specifically, for each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with the potential of a signal IN and the low-level power supply potential VSS.

In FIG. 20B, the above transistor is used as the switching element 1141, and the switching of the transistor is controlled by a signal SigA supplied to a gate electrode layer thereof.

Note that FIG. 20B illustrates the configuration in which the switching element 1141 includes only one transistor; however, one embodiment of the present invention is not particularly limited thereto. The switching element 1141 may include a plurality of transistors. In the case where the switching element 1141 includes a plurality of transistors serving as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 20B, the switching element 1141 may control the supply of the low-level power supply potential VSS.

In FIG. 20C, an example of a storage device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<Method for Measuring Off-State Current>

A transistor formed using an oxide semiconductor film is known to have an extremely low off-state current. For example, the off-state current of a transistor that is formed using an oxide semiconductor film and has a channel length of 3 μm and a channel width of 1 μm can be less than 10 zA ($1 \times 10^{-20}$ A), less than 1 zA ($1 \times 10^{-21}$ A), less than 100 yA ($1 \times 10^{-22}$ A), less than 10 yA ($1 \times 10^{-23}$ A), or less than 1 yA ($1 \times 10^{-24}$ A) at 85° C.

However, a current less than $1 \times 10^{-13}$ A or less than $1 \times 10^{-14}$ A cannot be measured in some cases. This is because the lower measurement limit of a current measurement instrument is approximately $1 \times 10^{-14}$ A to $1 \times 10^{-13}$ A. Note that an off-state current refers to a drain current of a transistor that is off (a drain current when the gate voltage of the transistor is sufficiently lower than the threshold voltage).

In view of the above, a method by which even an extremely low off-state current of a transistor can be measured will be described below.

For example, the use of a circuit configuration including four transistors enables measurement of the off-state current of a transistor having an extremely low off-state current.

Figure 33:
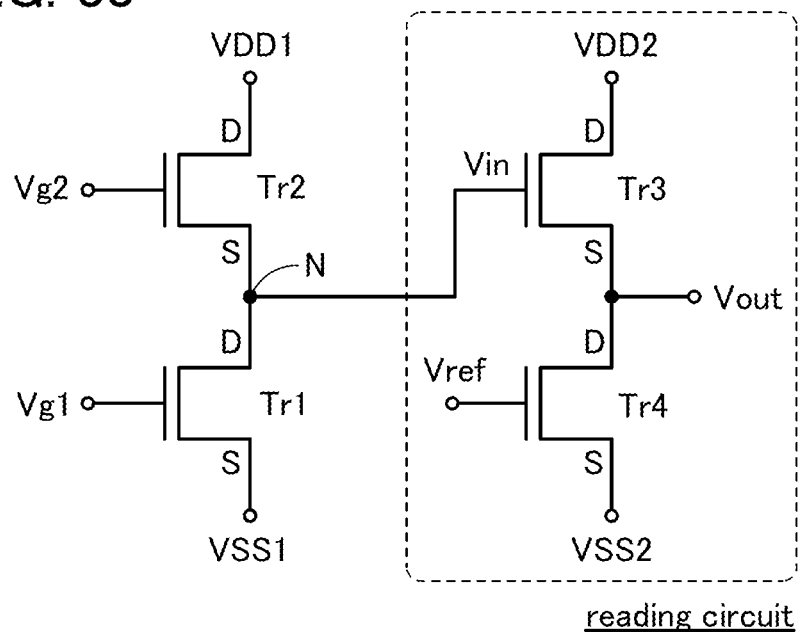
FIG. 33 is a diagram illustrating a circuit configuration for measurement of the off-state current of a transistor.

FIG. 33 illustrates a circuit configuration for measuring the off-state current of a first transistor (Tr1). A drain terminal of the first transistor (Tr1) is electrically connected to a source terminal of a second transistor (Tr2). The connection portion of them is referred to as a node N. A drain terminal of the second transistor (Tr2) is electrically connected to a wiring for supplying a high potential VDD1. A source terminal of the first transistor (Tr1) is electrically connected to a wiring for supplying a low potential VSS1.

The node N is electrically connected to a reading circuit. FIG. 33 illustrates an example where a source follower circuit is used as the reading circuit. The source follower circuit includes a third transistor (Tr3) and a fourth transistor (Tr4). Further, the source follower circuit also includes an output terminal (potential Vout) between a source terminal of the third transistor (Tr3) and a drain terminal of the fourth transistor (Tr4).

The source terminal of the third transistor (Tr3) is electrically connected to the drain terminal of the fourth transistor (Tr4). A drain terminal of the third transistor (Tr3) is electrically connected to a wiring for supplying a high potential VDD2. A source terminal of the fourth transistor (Tr4) is electrically connected to a wiring for supplying a low potential VSS2.

The second transistor (Tr2) has an off-state current sufficiently lower than that of the first transistor (Tr1). For example, when the first transistor (Tr1) and the second transistor (Tr2) have similar structures, the channel width of the second transistor (Tr2) should be sufficiently smaller than that of the first transistor (Tr1). The channel width of the second transistor (Tr2) is, for example, smaller than or equal to one hundredth of the channel width of the first transistor (Tr1), preferably smaller than or equal to one thousandth of the channel width of the first transistor (Tr1), more preferably smaller than or equal to one ten-thousandth of the channel width of the first transistor (Tr1). Note that the off-state current of the second transistor (Tr2) is not necessarily sufficiently smaller than that of the first transistor (Tr1). For example, the off-state current of the second transistor (Tr2) may be substantially equal to that of the first transistor (Tr1).

In the case of measuring the off-state current of a transistor in a semiconductor device not having the circuit configuration illustrated in FIG. 33, connection of wirings in the semiconductor device may be modified to form a circuit configuration similar to that illustrated in FIG. 33. The connection of wirings can be cut with a laser beam, for example. To connect wirings with each other, a vapor deposition method using a focused ion beam (FIB), or the like can be employed.

Next, a description will be given of a method for measuring the off-state current of the first transistor (Tr1) in the circuit configuration illustrated in FIG. 33.

First, the first transistor (Tr1) is turned off (a gate voltage Vg1 is set to sufficiently lower than the threshold voltage). Then, the second transistor (Tr2) is turned on (a gate voltage Vg2 is set to sufficiently higher than the threshold voltage) to inject electrical charge into the node N. After completing the electrical charge injection into the node N, the second transistor (Tr2) is turned off. The second transistor (Tr2) has an off-state current sufficiently lower than that of the first transistor (Tr1). Thus, the rate of decrease in electrical charge accumulated in the node N, due to the off-state current of the second transistor (Tr2), is low, and it can be regarded that electrical charge accumulated in the node N decreases mostly owing to the off-state current of the first transistor (Tr1).

Next, operations of a reading circuit (here, a source follower circuit) for reading the decrease amount of electrical charge accumulated in the node N will be described.

First, a gate voltage Vref is applied to a gate terminal of the fourth transistor (Tr4). The gate voltage Vref is slightly higher than the threshold voltage of the fourth transistor (Tr4). While the gate voltage Vref is applied to the gate terminal of the fourth transistor (Tr4), the potential of a gate terminal (Vin) of the third transistor (Tr3) is substantially equal to that of the output terminal (Vout).

Here, the node N is electrically connected to the gate terminal of the third transistor (Tr3) as in FIG. 33; accordingly, the potential of the node N is equal to that of an input terminal (Vin) of the reading circuit. Further, the potentials of the input terminal (Vin) and the output terminal (Vout) are substantially equal to each other; thus, the potential of the node N can be read as the potential of the output terminal (Vout).

The off-state current of the first transistor (Tr1) can be estimated from a change in the potential of the node N that is read in the above manner.

The amount of electrical charge accumulated in the node N ($Q_N$ [C]) is a product of the capacitance that can be accumulated in the node N ($C_N$ [F]) and the potential of the node N ($V_N$ [V]), i.e., $Q_N = C_N \cdot V_N$. A value obtained by dividing a change in the amount of electrical charge accumulated in the node N ($\Delta Q_N$ [C]) by a change in time ($\Delta t$ [seconds]) is leakage current ($I_{Nleak}$ [A]) of the node N.

Thus, the relation between leakage current ($I_{Nleak}$ [A]) of the node N and a change in the potential of the node N ($\Delta V_N$ [V]) over time ($\Delta t$ [seconds]) is expressed by Formula 1 using capacitance that can be accumulated in the node N ($C_N$ [F]).

[Formula 1]

$$I_{Nleak} = \frac{C_N \cdot \Delta V_N}{\Delta t} \qquad (1)$$

In the case where the leakage current of the node N can be assumed to be the off-state current of the first transistor (Tr1), the off-state current of the first transistor (Tr1) can be estimated by substituting a measured variation in the potential of the node N over time and capacity that can be accumulated in the node N into formula (1). Here, as described above, the potential of the node N is equal to that of the input terminal (Vin) of the reading circuit as in FIG. 33. Further, the potentials of the input terminal (Vin) and the output terminal (Vout) are substantially equal to each other. Therefore, the variation in the potential of the node N over time can be regarded as the variation in the potential of the output terminal (Vout).

In the case where the off-state current of the first transistor (Tr1) is substantially equal to that of the second transistor (Tr2) (the off-state current ratio is approximately 1:1), the off-state current of the first transistor (Tr1) can be estimated to be approximately half the leakage current of the node N. Thus, when the off-state current ratio between the first transistor (Tr1) and the second transistor (Tr2) is found, the off-state current of the first transistor (Tr1) can be estimated even in the case where the second transistor (Tr2) is not a transistor whose off-state current is sufficiently lower than that of the first transistor (Tr1).

<Example of Measuring Off-State Current>

An example of measuring the off-state current of a transistor formed using an oxide semiconductor film with the use of the method described above will be described below. An In—Ga—Zn oxide film was used as the oxide semiconductor film. The transistor formed using the In—Ga—Zn oxide film has a significantly low off-state current.

A transistor with a channel length of 3 μm and a channel width of 100000 μm was used as the first transistor (Tr1) whose off-state current is measured in FIG. 33. Further, a transistor with a channel length of 3 μm and a channel width of 10 μm was used as the second transistor (Tr2) from which electrical charge is injected into the node N.

In other words, the channel length of the second transistor (Tr2) is one ten-thousandth of that of the first transistor (Tr1). Here, the channel width is proportional to the off-state current. Thus, the off-state current of the second transistor (Tr2) is one ten-thousandth of that of the first transistor (Tr1).

On the other hand, the off-state current of a transistor formed using an oxide semiconductor film is not in inverse proportion to the channel length in some cases. For example, when the channel length is approximately 0.3 μm to 10 μm, there may be no significant difference in off-state current between transistors. Thus, it is possible to compare the off-state current per channel width of transistors each formed using an oxide semiconductor film even in the case where the transistors have different channel lengths in the range of approximately, for example, 0.3 μm to 10 μm. Note that in the case of precisely comparing the off-state current of transistors, it is preferable to use transistors with equal channel lengths.

The off-state current of the first transistor (Tr1) in the structure described above was measured at substrate temperatures of 85° C., 125° C., and 150° C. (the number of samples was 2). The channel width of the transistor whose off-state current is measured is 10000 μm.

The results were as follows: the off-state current per micrometer in channel width of the first transistor (Tr1) was $4.4 \times 10^{-23}$ A/μm and $4.0 \times 10^{-23}$ A/μm at 85° C., $1.7 \times 10^{-21}$ A/μm and $1.6 \times 10^{-23}$ A/μm at 125° C., and $1.4 \times 10^{-20}$ A/μm and $1.3 \times 10^{-23}$ A/μm at 150° C.

As described above, the use of the circuit configuration illustrated in FIG. 33 enabled estimation of the significantly low off-state current of the transistor formed using the In—Ga—Zn oxide film.

Figure 34:
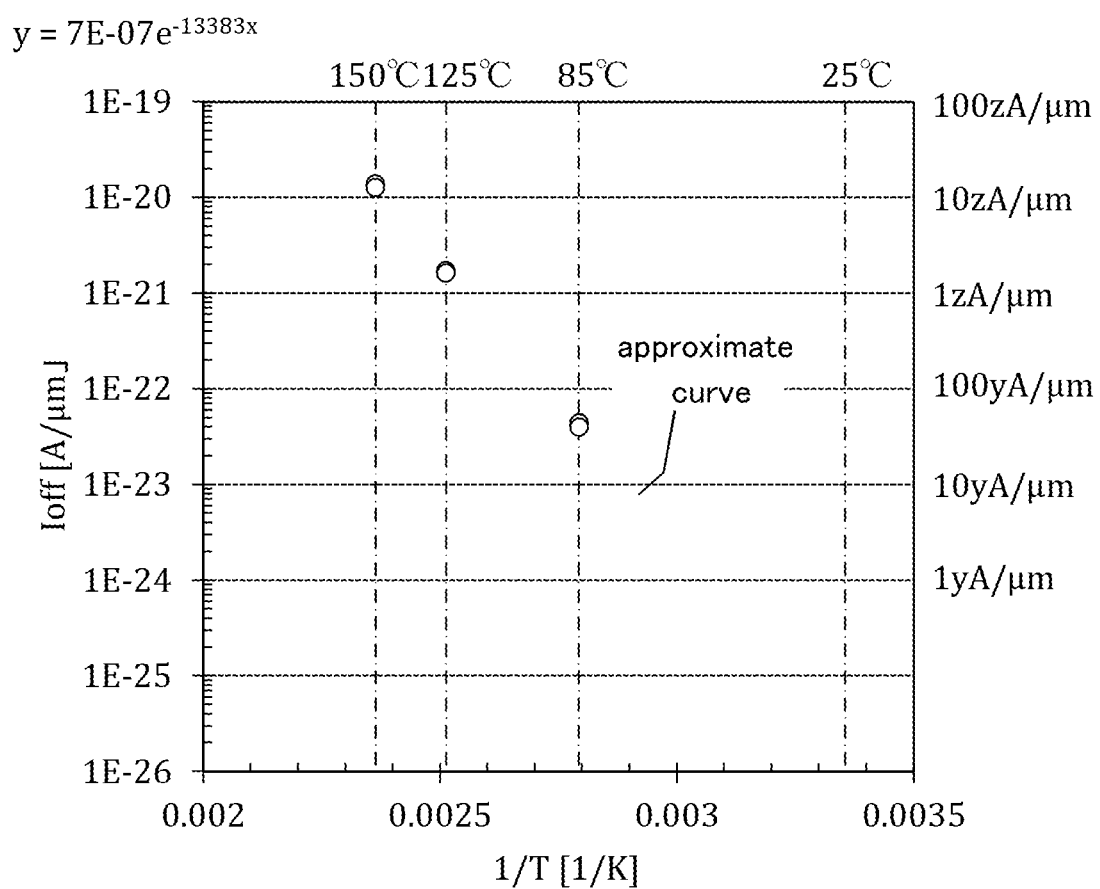
FIG. 34 is a graph showing the temperature dependence of the off-state current of a transistor.

Here, FIG. 34 is an Arrhenius plot where the horizontal axis represents the inverse of substrate temperature (T[K]) (1/T[1/K]), and the vertical axis represents the off-state current per micrometer in channel width ($I_{off}$ [A/μm]) (log scale).

FIG. 34 shows that the log of the off-state current has favorable linearity with respect to the inverse of temperature. The off-state current per micrometer in channel width ($I_{off}$ [A/μm]) of the first transistor (Tr1) is expressed by Arrhenius Formula (2) using the substrate temperature (T[K]).

[Formula 2]

$$I_{off} = 7.0 \times 10^{-7} \exp[-1.3 \times 10^4 \times (1/T)] \qquad (2)$$

<Application Example of Method for Measuring Off-State Current>

The method of estimating a significantly low off-state current with the use of the circuit configuration including four transistors is described above. A method of estimating the significantly low off-state current of one transistor will be described below.

A method of estimating a significantly low off-state current by application of Formula (2) will be described below. This method may allow estimation of a significantly low off-state current even with the use of one transistor.

As described above, the log of the off-state current of the transistor has favorable linearity with respect to the inverse of substrate temperature. Accordingly, even the significantly low off-state current of a transistor can be measured depending on substrate temperature.

Here, the gradient $-1.3 \times 10^4$ in Formula (2) is a substantially equal value (approximately $-1.5 \times 10^4$ to $-1.1 \times 10^4$) in any of transistors formed using oxide semiconductor films. Thus, when Formula (2) is deformed, Formula (3) is obtained.

[Formula 3]

$$I_{off} = A\exp[-1.3 \times 10^4 \times (1/T)] \quad (3)$$

Constant A in Formula (3) is a specific constant that varies depending on a transistor. Thus, when Constant A can be obtained, the off-state current of a transistor at a given substrate temperature can be estimated.

For example, when the off-state current of a transistor at a certain substrate temperature can be measured, Constant A can be calculated by substituting the values of the substrate temperature and the off-state current into Formula (3).

Therefore, for example, when an off-state current cannot be measured at a low temperature (approximately 25° C. to 95° C.) and an off-state current can be measured at a high temperature (approximately 125° C. to 200° C.), the off-state current at the low temperature can be estimated from the off-state current measured at the high temperature. Note that at a higher temperature (e.g., higher than 200° C.), deterioration of a semiconductor layer, a wiring, or an electrode might cause an abnormality in a transistor. In that case, the off-state current cannot be correctly estimated; thus, attention must be given to temperature.

Even when an off-state current cannot be measured at a high temperature, for example, it can be found that an off-state current at a low temperature is lower than a certain value. Specifically, as for the relation between a substrate temperature at which an off-state current is less than the lower measurement limit and an off-state current estimated at each substrate temperature, an off-state current estimated at each substrate temperature is found to be lower than the value shown in Table 1 in the case where the lower measurement limit of a current measuring instrument is 1.0× $10^{-14}$ A.

TABLE 1

| Substrate temperature at which off-state current is below lower measurement limit | Off-state current estimated at each substrate temperature [A] | | | |
| --- | --- | --- | --- | --- |
| | 95° C. | 85° C. | 60° C. | 25° C. |
| 200° C. | 3.90E−18 | 1.50E−18 | 9.60E−20 | 9.80E−22 |
| 150° C. | 1.00E−16 | 3.80E−17 | 2.50E−18 | 2.50E−20 |
| 125° C. | 7.00E−16 | 2.60E−16 | 1.70E−17 | 1.70E−19 |

Note that the channel width of a transistor is proportional to the off-state current; thus, an off-state current lower than those in Table 1 can be estimated when a transistor has a channel width larger than 1 μm.

As described above, even the off-state current of one transistor having a significantly low off-state current can be estimated from Formula (3) in some cases.

<Installation Example>

Figure 21A:
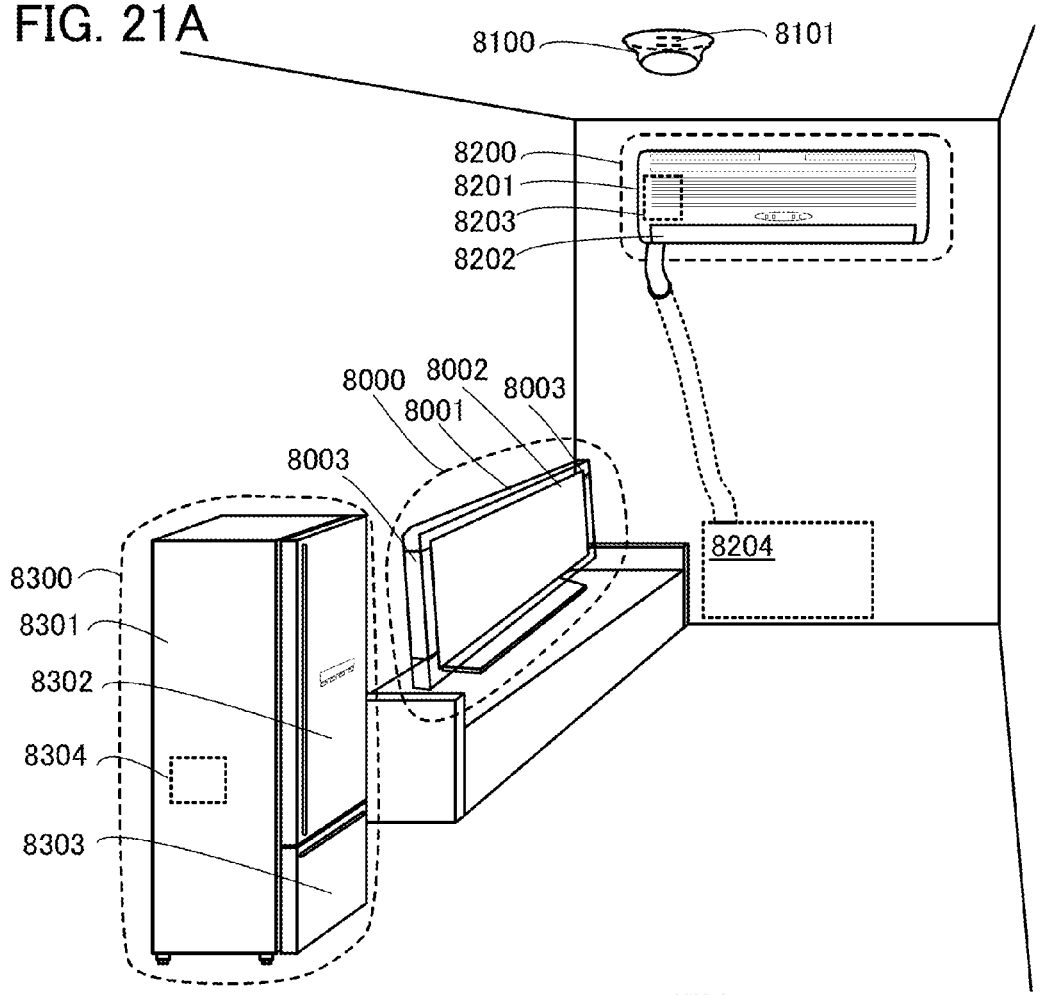
FIGS. 21A to 21C illustrate examples of electrical devices of embodiments of the present invention.

In a television set 8000 in FIG. 21A, a display portion 8002 is incorporated in a housing 8001. The display portion 8002 displays an image and a speaker portion 8003 can output sound.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing data communication or a memory. The above memory or CPU can be used for the television set 8000.

In FIG. 21A, an alarm device 8100 is a residential fire alarm that includes a sensor portion and a microcomputer 8101. Note that the microcomputer 8101 includes a CPU using the above transistor.

In FIG. 21A, an air conditioner that includes an indoor unit 8200 and an outdoor unit 8204 includes a CPU using the above transistor. Specifically, the indoor unit 8200 includes a housing 8201, an air outlet 8202, a CPU 8203, and the like. Although the CPU 8203 is provided in the indoor unit 8200 in FIG. 21A, the CPU 8203 may be provided in the outdoor unit 8204. Alternatively, the CPU 8203 may be provided in each of the indoor unit 8200 and the outdoor unit 8204. When the air conditioner includes a CPU using the above transistor, a reduction in power consumption of the air conditioner can be achieved.

In FIG. 21A, an electric refrigerator-freezer 8300 includes a CPU using the above transistor. Specifically, the electric refrigerator-freezer 8300 includes a housing 8301, a door for a refrigerator 8302, a door for a freezer 8303, a CPU 8304, and the like. In FIG. 21A, the CPU 8304 is provided in the housing 8301. When the electric refrigerator-freezer 8300 includes the CPU using the above transistor, a reduction in power consumption of the electric refrigerator-freezer 8300 can be achieved.

Figure 21B:
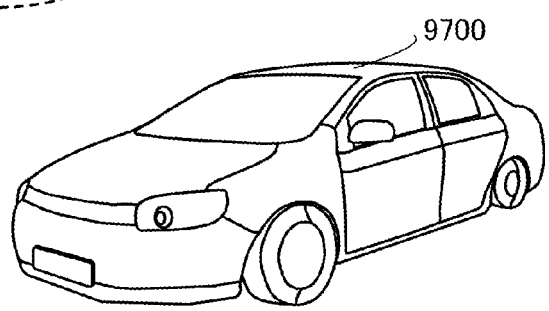
Figure 21C:
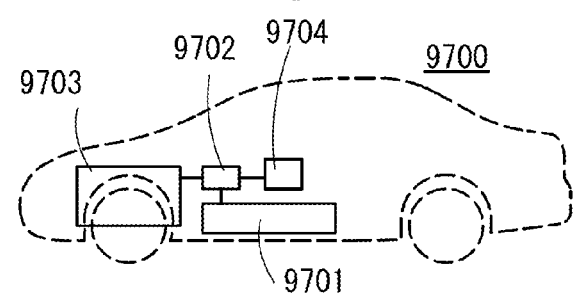

FIGS. 21B and 21C illustrate an example of an electric vehicle. An electric vehicle 9700 is equipped with a secondary battery 9701. The output of electric power of the secondary battery 9701 is adjusted by a control circuit 9702 and the electric power is supplied to a driving device 9703. The control circuit 9702 is controlled by a processing unit 9704 including a ROM, a RAM, a CPU, or the like that is not illustrated. When the electric vehicle 9700 includes the CPU using the above transistor, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in response to the control signal of the processing unit 9704 to control the output of the driving device 9703. In the case where an AC motor is mounted, although not illustrated, an inverter that converts a direct current into an alternate current is also incorporated.

In this embodiment, an example of a basic principle is described. Thus, part of this embodiment can be freely combined with, applied to, or replaced with part of another embodiment.

EXAMPLE 1

In this example, phosphorus was added as an impurity to a silicon oxide film or a silicon oxinitride film, which is an insulating film containing excess oxygen, and oxygen release was evaluated by TDS.

A method for forming samples is as follows.

First, a silicon wafer was prepared as a substrate. Next, the silicon wafer was oxidized by a thermal oxidation method to form a first silicon oxide film to a thickness of 100 nm from a surface of the silicon wafer. Then, a second silicon oxide film was formed to a thickness of 300 nm by a sputtering method.

The second silicon oxide film was formed under the following conditions: a synthesized quartz target was used; 50 sccm of oxygen was used as a deposition gas; the pressure was 0.4 Pa; the deposition power was 1.5 kW (13.56 MHz); the distance between the target and the substrate was 60 mm; and the substrate temperature was 100° C.

Then, phosphorus ions ($P^+$) were implanted as an impurity into each of the samples, so that example sample 1, example sample 2, and example sample 3 were formed.

The implantation of phosphorus ions was performed at an acceleration voltage of 30 kV by an ion implantation method. The implantation concentrations of phosphorus ions for example sample 1, example sample 2, and example sample 3 were $1\times10^{15}$ ions/cm$^2$, $2\times10^{15}$ ions/cm$^2$, and $1\times10^{16}$ ions/cm$^2$, respectively. In addition, a sample into which phosphorus ions were not implanted was prepared as a comparative example sample.

Figure 22:
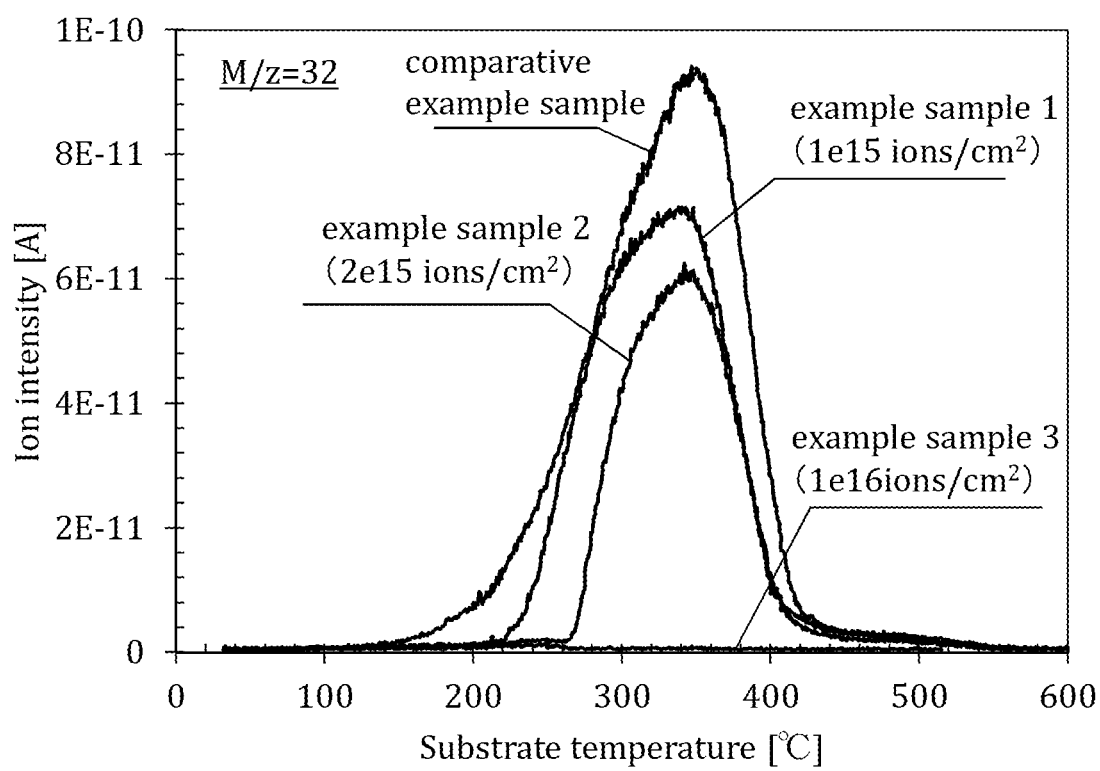
FIG. 22 is a graph showing the relation between substrate temperature and ion intensity measured by TDS.

FIG. 22 is a graph showing the relation between substrate temperature and ion intensity at a mass-to-charge ratio (M/z) of 32 of each of example samples 1 to 3 and the comparative example sample that was evaluated by TDS. The TDS measurement was performed on each of the samples divided into 10 mm square parts. Examples of a gas detected when M/z is 32 include an oxygen gas ($O_2$). In this example, all the gas detected when M/z is 32 was regarded as an oxygen gas.

FIG. 22 indicates that the comparative example sample into which phosphorus ions were not implanted released an oxygen gas at a substrate temperature in the range of approximately 250° C. to 450° C. On the other hand, the amount of an oxygen gas released from each of example samples 1 to 3, into which phosphorus ions were implanted, was smaller than that released from the comparative example sample.

According to FIG. 22, the amount of oxygen released from example sample 1 was $8.1\times10^{15}$ atoms/cm$^2$ ($2.7\times10^{20}$ atoms/cm$^3$). The amount of oxygen released from example sample 2 was $5.5\times10^{15}$ atoms/cm$^2$ ($1.8\times10^{20}$ atoms/cm$^3$). The amount of oxygen released from example sample 3 was $1.1\times10^{14}$ atoms/cm$^2$ ($3.7\times10^{18}$ atoms/cm$^3$). The amount of oxygen released from the comparative example sample was $1.1\times10^{16}$ atoms/cm$^2$ ($3.7\times10^{20}$ atoms/cm$^3$). Note that the oxygen release amount per unit volume was obtained by conversion using the thickness 300 nm of the second silicon oxide film.

Figure 23:
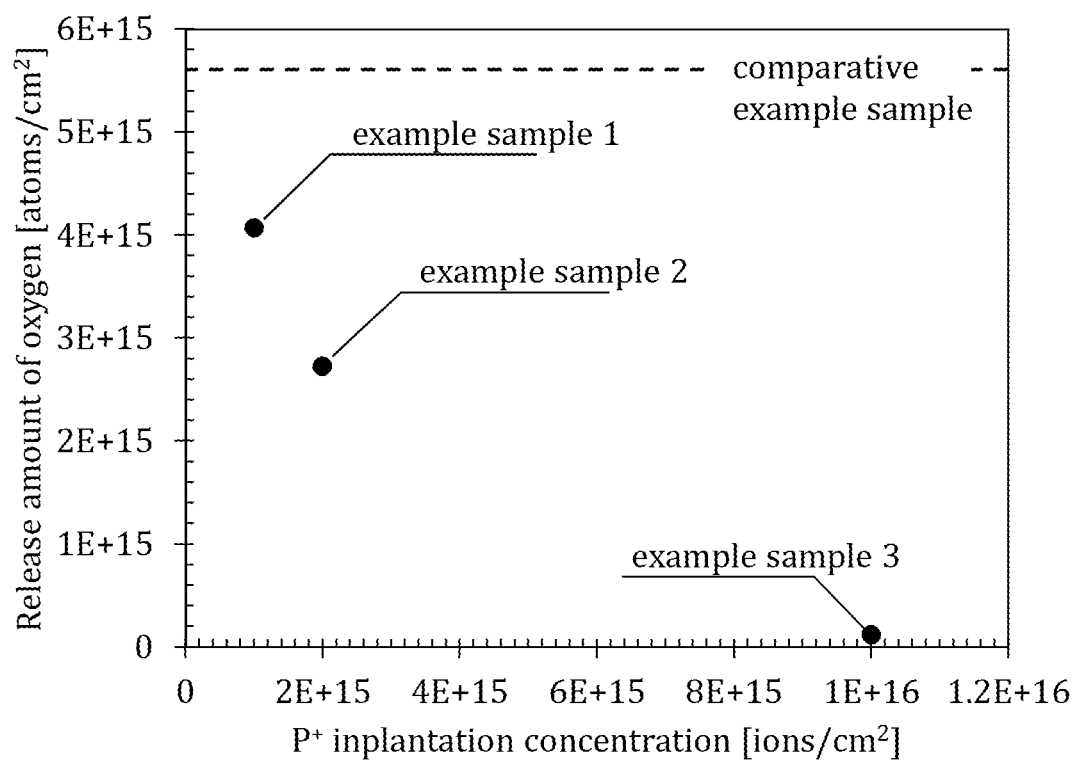
FIG. 23 is a graph showing the relation between phosphorus ion implantation concentration and the amount of released oxygen.

FIG. 23 shows the oxygen release amounts calculated from data in FIG. 22. Note that values obtained by conversion into oxygen atoms are shown as the oxygen release amounts. FIG. 23 is a graph showing the relation between the implantation concentration of phosphorus ions and the release amount of oxygen. Note that a broken line indicates the amount of oxygen released from the comparative example sample, into which phosphorus ions were not implanted.

It is found that reducing the amount of oxygen released by heating was achieved by implanting phosphorus ions into the silicon oxide film at a concentration of $1\times10^{15}$ ions/cm$^2$ or more, preferably $2\times10^{15}$ ions/cm$^2$ or more, more preferably $1\times10^{16}$ ions/cm$^2$ or more in the case where the acceleration voltage is 30 kV.

The results in FIG. 22 suggest that implanting phosphorus ions into an insulating film that can release oxygen by heating can reduce the amount of oxygen released by heating.

Next, a method for forming example sample 4 is as follows.

First, a silicon wafer was prepared as a substrate. Next, the silicon wafer was oxidized by a thermal oxidation method to form a silicon oxide film to a thickness of 100 nm from a surface of the silicon wafer. Then, a silicon oxynitride film was formed to a thickness of 300 nm by a CVD method.

The silicon oxynitride film was formed under the following conditions: 2 sccm of silane and 4000 sccm of nitrous oxide were used as deposition gases; the pressure was 700 Pa; the deposition power was 250 W (60 MHz); the distance between electrodes was 9 mm; and the substrate temperature was 400° C.

Then, phosphorus ions ($P^+$) were implanted as an impurity into the sample, so that example sample 4 was formed. The implantation of phosphorus ions was performed at an acceleration voltage of 30 kV by an ion implantation method. The implantation concentration of phosphorus ions for example sample 4 was $1\times10^{16}$ ions/cm$^2$.

Thus, example sample 4 is different from example sample 3 only in that the silicon oxynitride film is used instead of the second silicon oxide film.

Next, example samples 3 and 4 were etched, and the relation between etching depth and the release amount of oxygen was evaluated. Each of example samples 3 and 4 was divided into 10 mm square parts. In TDS measurement, one of the parts of the samples was used for one measurement.

Figure 24A:
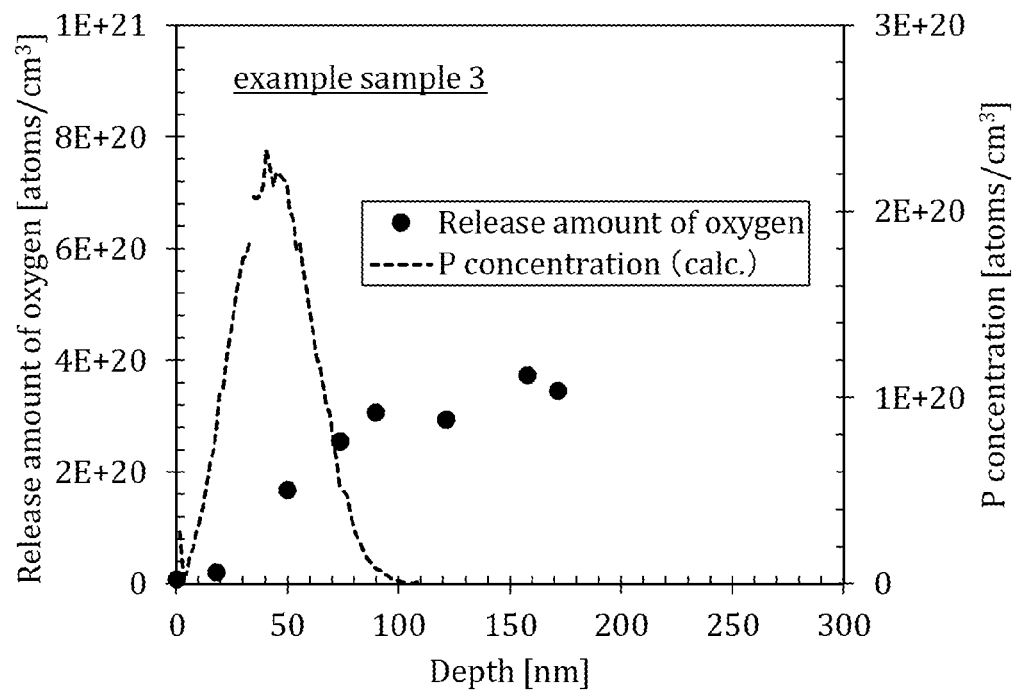
FIGS. 24A and 24B are graph each showing the relation between etching depth and the amount of released oxygen.
Figure 24B:
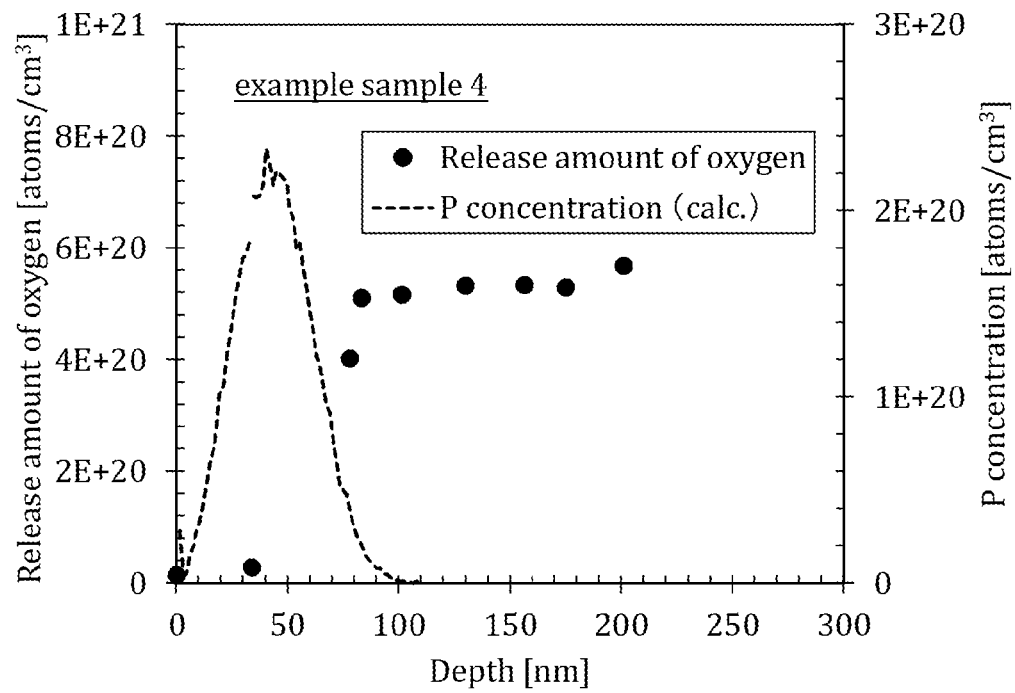

FIGS. 24A and 24B are each a graph where the release amount of oxygen with respect to etching depth is plotted using the thickness of the second silicon oxide film or the silicon oxynitride film without etching as a reference (depth: 0 mm). Etching was performed at 20° C. using a mixed solution containing 6.7% ammonium hydrogen fluoride and 12.7% ammonium fluoride (LAL 500 produced by Stella Chemifa Corporation) as an etchant. FIG. 24A shows the amount of oxygen released from example sample 3, and FIG. 24B shows the amount of oxygen released from example sample 4.

In each of FIGS. 24A and 24B, the concentration of phosphorus in the second silicon oxide film or the silicon oxynitride film that is obtained by calculation is shown. For the calculation, a transport of ion in matter (TRIM) was used, and the film density was set to 2.2 g/cm$^3$. The calculation results show that each sample had the maximum value of the phosphorus concentration at a depth of approximately 50 nm to 60 nm.

It is found from FIG. 24A that etching the second silicon oxide film in example sample 3 to a depth of 50 nm led to an increase in the oxygen release amount. The oxygen release amount when the second silicon oxide film was etched to a depth of 90 nm has a local maximum. Further, it is found from FIG. 24B that etching the silicon oxynitride film in example sample 4 to a depth of 78 nm led to an increase in the oxygen release amount. The oxygen release amount when the silicon oxynitride film was etched to a depth of 83 nm is the maximum oxygen release amount.

The results in FIGS. 24A and 24B show that when a region of the insulating film that exhibits the maximum phosphorus concentration was etched, the oxygen release amount was greatly changed. Thus, it is found that a region with an excellent oxygen blocking property was formed when the phosphorus concentration was $2\times10^{20}$ atoms/cm$^3$ or more. It is also found that oxygen to be released by heating was held in a region where the phosphorus concentration was low.

The results in this example suggest that adding phosphorus as an impurity to a silicon oxide film or a silicon oxynitride film, which is an insulating film containing excess oxygen, can form an oxygen blocking region.

Example 2

In this example, boron was added as an impurity to a silicon oxide film, which is an insulating film containing excess oxygen, and oxygen release was evaluated by TDS.

A method for forming a sample is as follows.

First, a silicon wafer was prepared as a substrate. Next, the silicon wafer was oxidized by a thermal oxidation method to form a first silicon oxide film to a thickness of 100 nm from a surface of the silicon wafer. Then, a second silicon oxide film was formed to a thickness of 300 nm by a sputtering method.

The second silicon oxide film was formed under the following conditions: a synthesized quartz target was used; 50 sccm of oxygen was used as a deposition gas; the pressure was 0.4 Pa; the deposition power was 1.5 kW (13.56 MHz); the distance between the target and the substrate was 60 mm; and the substrate temperature was 100° C.

Then, boron ions ($B^+$) were implanted as an impurity into the sample, so that example sample 5 was formed.

The implantation of boron ions was performed at an acceleration voltage of 10 kV by an ion implantation method. The implantation concentration of boron ions for example sample 5 was $1 \times 10^{16}$ ions/cm$^2$. In addition, a sample into which ions were not implanted was prepared as a comparative example sample. This sample is the same as the sample described as the comparative example sample in Example 1.

Figure 25:
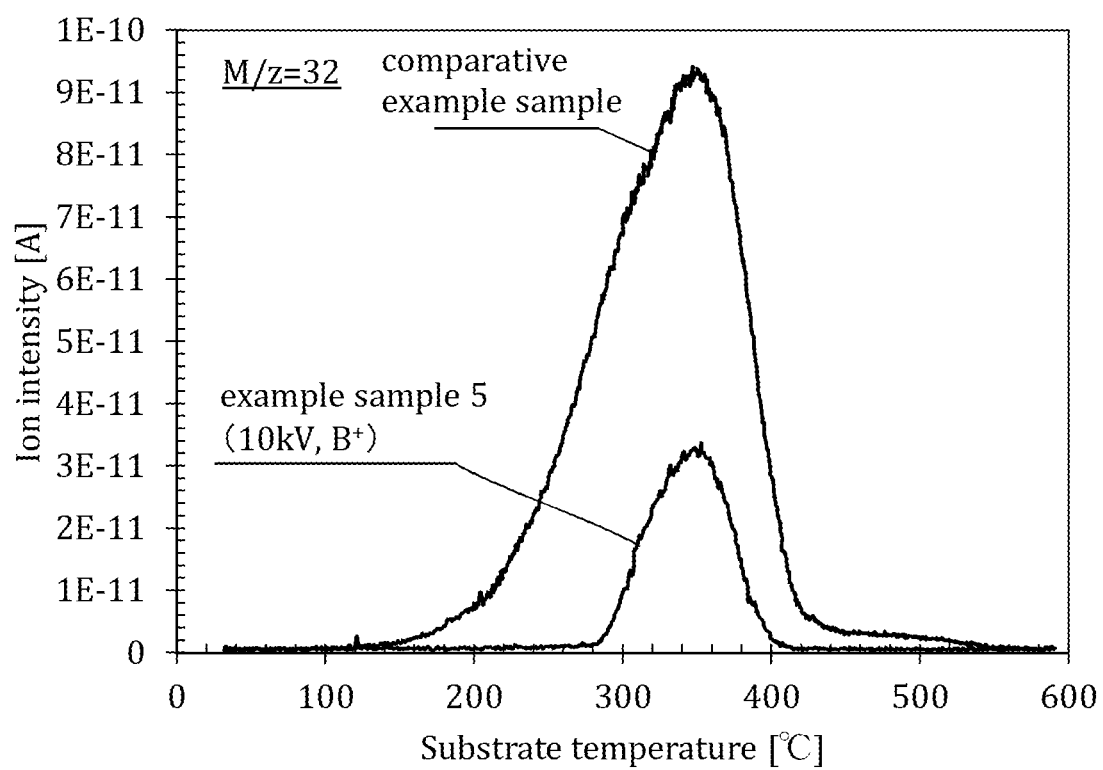
FIG. 25 is a graph showing the relation between substrate temperature and ion intensity measured by TDS.

FIG. 25 is a graph showing the relation between substrate temperature and ion intensity at a mass-to-charge ratio (M/z) of 32 of each of example sample 5 and the comparative example sample that was evaluated by TDS. The TDS measurement was performed on each of the samples divided into 10 mm square parts.

FIG. 25 indicates that the comparative example sample into which boron ions were not implanted released an oxygen gas at a substrate temperature in the range of approximately 250° C. to 450° C. On the other hand, the amount of an oxygen gas released from example sample 5, into which boron ions were implanted, was smaller than that released from the comparative example sample.

According to FIG. 25, the amount of oxygen released from example sample 5 was $3.1 \times 10^{15}$ atoms/cm$^2$ ($1.0 \times 10^{20}$ atoms/cm$^3$). The amount of oxygen released from the comparative example sample was $1.1 \times 10^{16}$ atoms/cm$^2$ ($3.7 \times 10^{20}$ atoms/cm$^3$). Note that the oxygen release amount per unit volume was obtained by conversion using the thickness 300 nm of the second silicon oxide film.

It is found that reducing the amount of oxygen released by heating was achieved by implanting boron ions into the silicon oxide film at a concentration of $1 \times 10^{16}$ ions/cm$^2$ or more in the case where the acceleration voltage is 10 kV.

The results in FIG. 25 suggest that implanting boron ions into an insulating film that can release oxygen by heating can reduce the amount of oxygen released by heating.

The results in this example suggest that adding boron as an impurity to a silicon oxide film, which is an insulating film containing excess oxygen, can form an oxygen blocking region.

EXPLANATION OF REFERENCE

52: insulating film, 53: region, 56: oxide semiconductor film, 68: insulating film, 69: region, 100: substrate, 102: insulating film, 103: region, 104: gate electrode, 106: oxide semiconductor film, 112: gate insulating film, 113: region, 116a: source electrode, 116b: drain electrode, 118: protective insulating film, 119: region, 120: resist mask, 126a: wiring, 126b: wiring, 136: oxide semiconductor film, 152: element isolation region, 154: gate electrode, 158: region, 162: gate insulating film, 166a: region, 166b: region, 168: insulating film, 169: region, 180: resist mask, 191: transistor, 192: transistor, 200: substrate, 202: base insulating film, 203: region, 204: gate electrode, 206: oxide semiconductor film, 212: gate insulating film, 213: region, 216a: source electrode, 216b: drain electrode, 218: protective insulating film, 219: region, 220: resist mask, 226a: wiring, 226b: wiring, 236: oxide semiconductor film, 242: insulating film, 300: substrate, 304: gate electrode, 306: oxide semiconductor film, 312: gate insulating film, 313: region, 316a: source electrode, 316b: drain electrode, 318: protective insulating film, 319: region, 320: resist mask, 326a: wiring, 326b: wiring, 336: oxide semiconductor film, 400: memory cell, 411: transistor, 412: transistor, 413: transistor, 414: capacitor, 500: storage device, 602: storage element portion, 604: driver circuit, 606: driver circuit, 608: storage element, 610: storage circuit, 612: storage circuit, 614: transistor, 616: transistor, 618: transistor, 620: transistor, 622: transistor, 624: transistor, 626: transistor, 628: transistor, 630: terminal, 632: terminal, 634: terminal, 636: terminal, 668: terminal, 640: data holding portion, 642: data holding portion, 644: data holding portion, 646: data holding portion, 648: capacitor, 650: capacitor, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 8000: television set, 8001: housing, 8002: display portion, 8003: speaker portion, 8100: alarm device, 8101: microcomputer, 8200: indoor unit, 8201: housing, 8202: air outlet, 8203: CPU, 8204: outdoor unit, 8300: electric refrigerator-freezer, 8301: housing, 8302: door for refrigerator, 8303: door for freezer, 8304: CPU, 9700: electric vehicle, 9701: secondary battery, 9702: control circuit, 9703: driving device, 9704: processing unit This application is based on Japanese Patent Application serial no. 2013-094863 filed with Japan Patent Office on Apr. 29, 2013, the entire contents of which are hereby incorporated by reference.

The invention claimed is:

1. A semiconductor device comprising:
a base insulating film comprising a first region, a second region, and a third region;
an oxide semiconductor film over the base insulating film;
a gate insulating film over the oxide semiconductor film; and
a gate electrode over the gate insulating film,
wherein the first region is over the third region,
wherein the first region and the oxide semiconductor film do not overlap with each other,
wherein the second region and the oxide semiconductor film overlap with each other,
wherein the first region is in contact with the gate insulating film,
wherein the second region is in contact with the oxide semiconductor film,
wherein the first region contains phosphorus or boron, and
wherein the second region and the third region do not contain phosphorus or boron.

2. The semiconductor device according to claim 1, wherein the base insulating film comprises excess oxygen.

3. The semiconductor device according to claim 1,
wherein the gate insulating film comprises a fourth region,
wherein the fourth region and the gate electrode do not overlap with each other, and
wherein the fourth region contains phosphorus or boron.

4. The semiconductor device according to claim 1, further comprising a protective insulating film over the gate electrode,
wherein a part of the protective insulating film contains phosphorus or boron.

5. The semiconductor device according to claim 1, further comprising a transistor comprising silicon,
wherein the oxide semiconductor film is provided over the transistor.

6. A semiconductor device comprising:
a transistor comprising silicon;
an insulating film over the transistor;
an oxide semiconductor film over the insulating film;
a gate insulating film adjacent to the oxide semiconductor film;
a gate electrode adjacent to the oxide semiconductor film with the gate insulating film interposed therebetween; and
a protective insulating film over the oxide semiconductor film, the gate insulating film, and the gate electrode,
wherein a part of the insulating film contains phosphorus or boron, and
wherein a part of the protective insulating film contains phosphorus or boron.

7. The semiconductor device according to claim 6, wherein the protective insulating film comprises excess oxygen.

8. The semiconductor device according to claim 6,
wherein the gate insulating film comprises a first region,
wherein the first region and the gate electrode do not overlap with each other, and
wherein the first region contains phosphorus or boron.

9. The semiconductor device according to claim 6,
wherein the protective insulating film comprises an opening, and
wherein the part of the protective insulating film comprises a side surface of the opening.

10. A semiconductor device comprising:
a base insulating film comprising a first region, a second region, and a third region;
an oxide semiconductor film over the base insulating film;
a gate insulating film adjacent to the oxide semiconductor film;
a gate electrode adjacent to the oxide semiconductor film with the gate insulating film interposed therebetween; and
a protective insulating film comprising a fourth region over the oxide semiconductor film, the gate insulating film, and the gate electrode,
wherein the first region is over the third region,
wherein the first region and the oxide semiconductor film do not overlap with each other,
wherein the second region and the oxide semiconductor film overlap with each other,
wherein the first region is in contact with the gate insulating film,
wherein the second region is in contact with the oxide semiconductor film,
wherein at least one of the first region and the fourth region contains phosphorus or boron, and
wherein the second region and the third region do not contain phosphorus or boron.

11. The semiconductor device according to claim 10, wherein the base insulating film comprises excess oxygen.

12. The semiconductor device according to claim 10, wherein the protective insulating film comprises excess oxygen.

13. The semiconductor device according to claim 10,
wherein the gate insulating film comprises a fifth region,
wherein the fifth region and the gate electrode do not overlap with each other, and
wherein the fifth region contains phosphorus or boron.

14. The semiconductor device according to claim 10,
wherein the protective insulating film comprises an opening, and
wherein the fourth region comprises a side surface of the opening.

* * * * *